(12) United States Patent
Ogawa et al.

(10) Patent No.: US 11,744,011 B2
(45) Date of Patent: Aug. 29, 2023

(54) WIRING BOARD AND METHOD FOR MANUFACTURING WIRING BOARD

(71) Applicant: DAI NIPPON PRINTING CO., LTD., Tokyo-to (JP)

(72) Inventors: Kenichi Ogawa, Tokyo-to (JP); Naoko Okimoto, Tokyo-to (JP); Mitsutaka Nagae, Tokyo-to (JP); Makiko Sakata, Tokyo-to (JP); Toru Miyoshi, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 202 days.

(21) Appl. No.: 17/290,304

(22) PCT Filed: Oct. 31, 2019

(86) PCT No.: PCT/JP2019/042920
§ 371 (c)(1),
(2) Date: Apr. 30, 2021

(87) PCT Pub. No.: WO2020/091012
PCT Pub. Date: May 7, 2020

(65) Prior Publication Data
US 2022/0015227 A1    Jan. 13, 2022

(30) Foreign Application Priority Data

Oct. 31, 2018 (JP) .................................. 2018-206023
Apr. 10, 2019 (JP) .................................. 2019-075179

(51) Int. Cl.
*H05K 1/18* (2006.01)
*H05K 1/02* (2006.01)
(Continued)

(52) U.S. Cl.
CPC ........... *H05K 1/0283* (2013.01); *H05K 1/189* (2013.01); *H05K 3/0014* (2013.01);
(Continued)

(58) Field of Classification Search
CPC .... H05K 1/0283; H05K 1/189; H05K 3/0014; H05K 3/0064; H05K 3/1208;
(Continued)

(56) References Cited

U.S. PATENT DOCUMENTS 9,841,548 B2 * 12/2017 Kim ...................... G06F 1/1652
2004/0192082 A1    9/2004 Wagner et al.
(Continued)

FOREIGN PATENT DOCUMENTS

JP    2007-281406 A    10/2007
JP    2014-162124 A    9/2014
(Continued)

OTHER PUBLICATIONS

Jul. 15, 2022 Search Report issued in European Patent Application No. 19880801.6.
(Continued)

*Primary Examiner* — Binh B Tran
(74) *Attorney, Agent, or Firm* — Oliff PLC

(57) ABSTRACT

A wiring board on which electronic components are mountable includes a stretchable portion having stretchability and having a first surface and a second surface opposite to the first surface, and an interconnection wire electrically connected to the electronic components mounted on the wiring board. The stretchable portion includes first regions lined up in each of a first direction and a second direction, a second region including first portions and second portions, and a third region surrounded by the second region. The first regions overlap the electronic components. The first portion extends from one of two first regions neighboring each other
(Continued)

in the first direction to the other thereof. The second portion extends from one of two first regions neighboring each other in the second direction to the other thereof. The second region has a lower modulus of elasticity than the first region. The interconnection wire overlaps the second region.

22 Claims, 36 Drawing Sheets

(51) Int. Cl.
  *H05K 3/00* (2006.01)
  *H05K 3/12* (2006.01)

(52) U.S. Cl.
  CPC ......... *H05K 3/0064* (2013.01); *H05K 3/1208* (2013.01); *H05K 2201/09063* (2013.01); *H05K 2201/09281* (2013.01); *H05K 2201/2009* (2013.01)

(58) Field of Classification Search
  CPC .......... H05K 2201/09063; H05K 2201/09281; H05K 2201/2009
  USPC ....................................................... 361/750

See application file for complete search history.

(56) References Cited

U.S. PATENT DOCUMENTS

| 2011/0230747 | A1* | 9/2011 | Rogers ................. A61L 31/047 600/377 |
| 2014/0218872 | A1* | 8/2014 | Park ..................... H05K 1/0283 216/13 |
| 2014/0299362 | A1* | 10/2014 | Park ..................... H05K 1/0283 174/254 |
| 2015/0147854 | A1 | 5/2015 | Jung et al. |
| 2016/0049602 | A1 | 2/2016 | Kim |
| 2016/0165719 | A1* | 6/2016 | Li ............................ H05K 3/30 361/749 |
| 2017/0347460 | A1 | 11/2017 | Cao et al. |

FOREIGN PATENT DOCUMENTS

| JP | 2014-162125 A | 9/2014 |
| JP | 2016-0509375 A | 3/2016 |
| KR | 20090092982 A | 9/2009 |

OTHER PUBLICATIONS

Dec. 10, 2019 International Search Report issued in International Patent Application No. PCT/JP2019/042920.
Jun. 30, 2020 Office Action issued in Japanese Patent Application No. 2020-524262.
Apr. 27, 2021 International Preliminary Report on Patentability issued in International Patent Application No. PCT/JP2019/042920.
Nov. 7, 2022 Search Report issued in European Patent Application No. 19880801.6.

* cited by examiner

WIRING BOARD AND METHOD FOR MANUFACTURING WIRING BOARD

BACKGROUND OF THE INVENTION

Technical Field

Embodiments of the present disclosure relate to a wiring board including a stretchable portion having stretchability and an interconnection wire and a method for manufacturing the wiring board.

Background Art

In recent years, research has been conducted on electronic devices having deformability, such as stretchability. For example, PTL 1 describes a wiring board including a substrate and an interconnection wire provided on the substrate and having stretchability. In PTL 1, a manufacturing method is employed in which circuitry is provided on a substrate that has been stretched in advance and, after the circuitry is formed, the substrate is relaxed.

CITATION LIST

Patent Literature

PTL 1: Japanese Unexamined Patent Application Publication No. 2007-281406

SUMMARY OF THE INVENTION

When the substrate is stretched by applying tensile stress to the substrate in first and second directions and, thereafter, the substrate is relaxed after the interconnection wire is disposed on the substrate, a plurality of wrinkles aligned in the first and second directions are generated on the wiring board having the substrate and the interconnection wire. In this case, the wrinkles extending in the first direction interfere with the wrinkles extending in the second direction, making it difficult to control the wrinkles.

Accordingly, the embodiments of the present disclosure provide a wiring board and a method for manufacturing the wiring board capable of effectively solving the problem.

According to an embodiment of the present disclosure, a wiring board on which electronic components are mountable is provided. The wiring board includes a stretchable portion having stretchability and having a first surface and a second surface opposite to the first surface and an interconnection wire that is located adjacent to the first surface of the stretchable portion and that is electrically connected to the electronic components mounted on the wiring board. The stretchable portion includes a plurality of first regions lined up in each of a first direction and a second direction that intersects the first direction, where each of the first region overlaps an electronic component mounted on the wiring board when viewed in a direction normal to the first surface of the stretchable portion, a plurality of second regions including first portions and second portions, where the first portion extends from one of two first regions neighboring each other in the first direction to the other thereof among the plurality of first regions, where the second portion extends from one of two first regions neighboring each other in the second direction to the other thereof among the plurality of first regions, where the second region has a lower modulus of elasticity than the first region, and a third region surrounded by the second regions. The interconnection wire overlaps the second region when viewed in the direction normal to the first surface of the stretchable portion.

In the wiring board according to an embodiment of the present disclosure, the stretchable portion may include a first member located in the first region and a second member that overlaps the first member in the first region and extends over the first regions and the second regions. The second member may have a lower modulus of elasticity than the first member.

According to an embodiment of the present disclosure, a wiring board including a stretchable portion and an interconnection wire is provided. The stretchable portion has stretchability. The stretchable portion has a first surface and a second surface opposite to the first surface. The stretchable portion includes a plurality of first regions lined up in each of a first direction and a second direction that intersects the first direction and each including a first member, a plurality of second regions including first portions and second portions and including a second member having a lower modulus of elasticity than the first member, where the first portion extends from one of two first regions neighboring each other in the first direction to the other thereof among the plurality of first regions, where the second portion extends from one of two first regions neighboring each other in the second direction to the other thereof among the plurality of first regions, and a third region surrounded by the second regions. The interconnection wire is located adjacent to the first surface of the stretchable portion and overlaps at least the second region when viewed in a direction normal to the first surface of the stretchable portion.

In the wiring board according to an embodiment of the present disclosure, the first member of the stretchable portion may be located adjacent to the first surface of the stretchable portion. The first member of the stretchable portion may be disposed so as to appear on neither the first surface nor the second surface of the stretchable portion. The first member of the stretchable portion may be located adjacent to the second surface of the stretchable portion. The first member of the stretchable portion may be disposed on a surface of the second member.

In the wiring board according to an embodiment of the present disclosure, the second member of the stretchable portion may contain thermoplastic elastomer, silicone rubber, urethane gel, or silicone gel.

According to an embodiment of the present disclosure, the wiring board may further include a support portion located between the interconnection wire and the first surface of the stretchable portion. The support portion may have a crest portion and a valley portion respectively corresponding to a crest portion and a valley portion of an undulating portion of the interconnection wire, and the support portion may support the interconnection wire. In this case, the wiring board may further include an adhesive layer that joins the stretchable portion to the support portion. The first member of the stretchable portion may be in contact with the adhesive layer in an in-plane direction of the wiring board.

In the wiring board according to an embodiment of the present disclosure, the stretchable portion may further include an adhesive layer located between the interconnection wire and the second member. The first member of the stretchable portion may be located closer to the interconnection wire than a surface of the second member adjacent to the interconnection wire and may be in contact with the adhesive layer in an in-plane direction of the wiring board.

The wiring board according to an embodiment of the present disclosure may further include a support portion located between the interconnection wire and the adhesive layer. The support portion may have a crest portion and a valley portion respectively corresponding to a crest portion and a valley portion of an undulating portion of the interconnection wire, and the support portion may support the interconnection wire. The first member of the stretchable portion may be in contact with the support portion.

In the wiring board according to an embodiment of the present disclosure, the first member of the stretchable portion may contain polyimide, polyethylene naphthalate, polycarbonate, acrylic resin, or polyethylene terephthalate.

The wiring board according to an embodiment of the present disclosure may further include a plurality of stretch control portions lined up along at least one of the first portion and the second portion of the second region when viewed in the direction normal to the first surface of the stretchable portion, and the stretch control portions may have a higher modulus of elasticity than the second region.

In the wiring board according to an embodiment of the present disclosure, the third region of the stretchable portion may have a hole that penetrates the stretchable portion.

The wiring board according to an embodiment of the present disclosure may further include an insulating layer that overlaps the second region when viewed in the direction normal to the first surface of the stretchable portion, and the insulating layer may be located on the interconnection wire.

According to an embodiment of the present disclosure, a wiring board includes a stretchable portion having stretchability, where the stretchable portion has a first surface and a second surface opposite to the first surface, and an interconnection wire. The interconnection wire includes a plurality of first interconnection wires located adjacent to the first surface of the stretchable portion and extending in a first direction and a plurality of second interconnection wires located adjacent to the first surface of the stretchable portion and extending in a second direction that intersects the first direction, and the second interconnection wires intersect the first interconnection wires.

In the wiring board according to an embodiment of the present disclosure, the interconnection wire may include an undulating portion in which a crest portion and a valley portion in a direction normal to the first surface of the stretchable portion repeatedly appear in an in-plane direction of the first surface of the stretchable portion.

In the wiring board according to an embodiment of the present disclosure, the undulating portion of the interconnection wire may have an amplitude greater than or equal to 1 μm.

The wiring board according to an embodiment of the present disclosure may further include a support portion located between the interconnection wire and the first surface of the stretchable portion. The support portion may have a crest portion and a valley portion respectively corresponding to the crest portion and the valley portion of the undulating portion of the interconnection wire, and the support portion may support the interconnection wire.

In the wiring board according to an embodiment of the present disclosure, the support portion may have a thickness of less than or equal to 10 μm.

In a wiring board according to an embodiment of the present disclosure, the stretchable portion may have a thickness greater than a thickness of the support portion.

The wiring board according to an embodiment of the present disclosure may further include an electronic component electrically connected to the interconnection wire.

According to an embodiment of the present disclosure, a method for manufacturing a wiring board on which electronic components are mountable is provided. The method includes a step of preparing a stretchable portion having stretchability and having a first surface and a second surface opposite to the first surface, a stretch step of stretching the stretchable portion, a wiring step, and a contraction step. The stretchable portion includes a plurality of first regions lined up in each of a first direction and a second direction that intersects the first direction, a plurality of second regions including first portions and second portions, and a third region surrounded by the second regions. The first regions overlap the electronic components mounted on the wiring board when viewed in a direction normal to the first surface of the stretchable portion The second region has a lower modulus of elasticity than the first region. The first portion extends from one of two first regions neighboring each other in the first direction to the other of the two first regions among the plurality of first regions. The second portion extends from one of two first regions neighboring each other in the second direction to the other of the two first regions among the plurality of first regions. In the stretch step, the stretchable portion is stretched by applying tensile stress to the stretchable portion in at least two of in-plane directions of the first surface of the stretchable portion. In the wiring step, an interconnection wire to be electrically connected to the electronic components mounted on the wiring board is disposed on the first surface of the stretchable portion that is stretched so as to overlap the second region when viewed in the direction normal to the first surface of the stretchable portion. In the contraction step, the tensile stress is removed from the stretchable portion.

According to an embodiment of the present disclosure a method for manufacturing a wiring board includes a step of preparing a stretchable portion having stretchability and having a first surface and a second surface opposite to the first surface, a stretch step of stretching the stretchable portion, a wiring step, and a contraction step. The stretchable portion includes a plurality of first regions lined up in each of a first direction and a second direction that intersects the first direction and each having a first member, a plurality of second regions including first portions and second portions and including a second member having a lower modulus of elasticity than the first member, and a third region surrounded by the first regions and the second regions. The first portion extends from one of two first regions neighboring each other in the first direction to the other thereof among the plurality of first regions. The second portion extends from one of two first regions neighboring each other in the second direction to the other thereof among the plurality of first regions. In the stretch step, the stretchable portion is stretched by applying tensile stress to the stretchable portion in at least two of in-plane directions of the first surface of the stretchable portion. In the wiring step, the interconnection wire is disposed on the first surface of the stretchable portion that is stretched so as to overlap the second region when viewed in a direction normal to the first surface of the stretchable portion. In the contraction step the tensile stress is removed from the stretchable portion.

In the method for manufacturing a wiring board according to an embodiment of the present disclosure, the stretch step may be performed with the first regions clamped in a thickness direction of the stretchable portion.

According to an embodiment of the present disclosure, a method for manufacturing a wiring board includes a step of preparing a stretchable portion having stretchability and having a first surface and a second surface opposite to the first surface, a stretch step of stretching the stretchable portion by applying tensile stress to the stretchable portion in at least two of in-plane directions of the first surface of the stretchable portion, a wiring step of disposing, on the first surface of the stretchable portion that is stretched, an interconnection wire including a plurality of first interconnection wires each extending in a first direction and a plurality of second interconnection wires each extending in a second direction that intersects the first direction and intersecting the first interconnection wires, and a contraction step of removing the tensile stress from the stretchable portion.

The method for manufacturing a wiring board according to an embodiment of the present disclosure may further include a wiring preparation of disposing the interconnection wire on the support portion, and the wiring step may include a joint step of joining the support portion, on which the interconnection wire is disposed, to the first surface of the stretchable portion that is stretched.

According to the embodiments of the present disclosure, the interference between wrinkles extending in the first direction and wrinkles extending in the second direction can be removed.

DETAILED DESCRIPTION OF THE INVENTION

Figure 1:
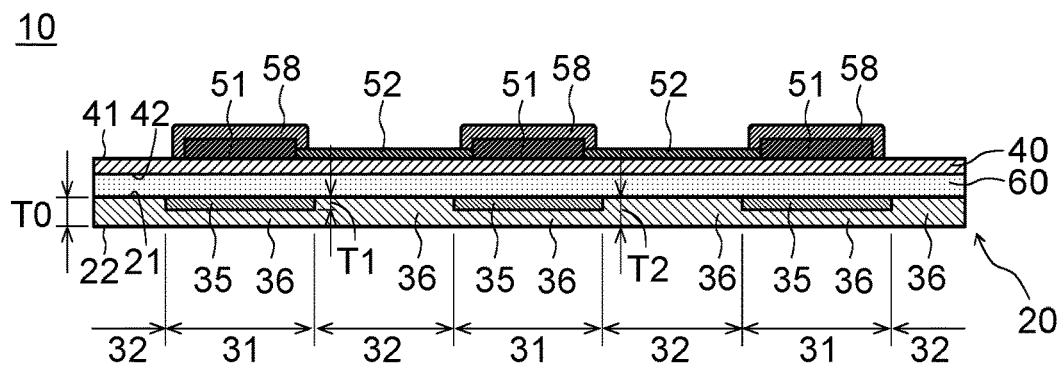
FIG. 1 is a cross-sectional view of a wiring board according to an embodiment.

The structure of a wiring board and a method for manufacturing the wiring board according to an embodiment of the present disclosure are described in detail below with reference to the accompanying drawings. Note that the embodiments illustrated below are only examples of the embodiments of the present disclosure, and the present disclosure is not to be construed as limited to these embodiments. In addition, terms such as "board", "base material", "sheet" and "film" as used herein are not distinguished from each other based solely on differences in address term usage. For example, "board" is a concept that includes members that can be referred to as a base material, a sheet, or a film. Furthermore, the terms as used herein to identify the shape, the geometric conditions, or their degree, such as "parallel" and "orthogonal", and the numerical values of, for example, a length and angle are not used in a strict sense, and shall be interpreted to include the extent to which similar functions can be expected, without being bound by the strict meaning. In the drawings referred to in the present embodiment, the same or similar reference signs are attached to the same parts or parts having similar functions, and descriptions of the parts may not be repeated. In addition, the dimensional proportions in the drawings may differ from the actual proportions for convenience of description, and some of the configurations may be removed from the drawings.

An embodiment of the present disclosure is described below with reference to FIGS. 1 to 10.

(Wiring Board)

Figure 2A:
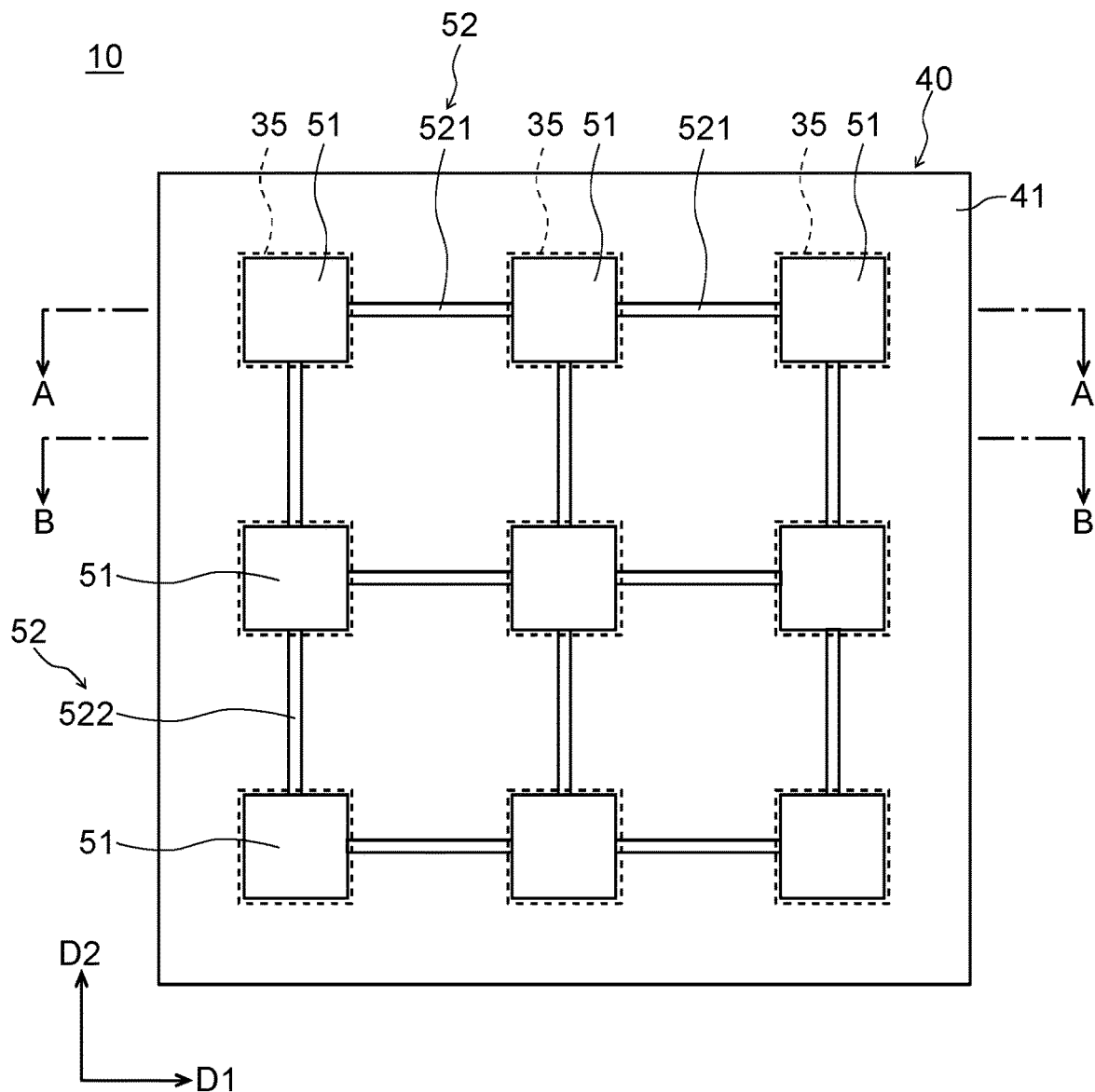
FIG. 2A is a plan view of the wiring board according to the embodiment.

A wiring board 10 according to the present embodiment is described first. FIG. 1 and FIG. 2A are a cross-sectional view and a plan view of the wiring board 10, respectively. The cross-sectional view illustrated in FIG. 1 is a cutaway view of the wiring board 10 taken along line A-A of FIG. 2A.

The wiring board 10 illustrated in FIG. 1 has a support portion 40 provided with a plurality of electronic components 51 and a plurality of interconnection wires 52, a stretchable portion 20 having stretchability, and an adhesive layer 60 that joins the stretchable portion 20 and the support portion 40. Each of the constituent elements of the wiring board 10 is described below.

[Support Portion]

The stretchability of the support portion 40 is lower than that of the stretchable portion 20. The support portion 40 has a first surface 41 located adjacent to the electronic components 51 and the interconnection wires 52 and a second surface 42 located opposite to the first surface 41. In the example illustrated in FIG. 1, the adhesive layer 60 and the stretchable portion 20 are located adjacent to the second surface 42 of the support portion 40.

As described below, when the tensile stress is removed from the stretchable portion 20 joined to the support portion 40 and, thus, the stretchable portion 20 contracts, an undulating portion is formed in the support portion 40. The characteristics and dimensions of the support portion 40 are set so as to facilitate the formation of such an undulating portion. For example, the thickness of the support portion 40 is less than the thickness of the stretchable portion 20. For example, the thickness of the support portion 40 is less than or equal to 10 µm, and more preferably less than or equal to 5 µm. By reducing the thickness of the support portion 40, the undulating portion is more easily formed in the support portion 40 when the stretchable portion 20 contracts. The support portion 40 may have a greater modulus of elasticity than a second region (described below) of the stretchable portion 20. For example, the modulus of elasticity of the support portion 40 is higher than or equal to 100 MPa, and more preferably higher than or equal to 1 GPa. The modulus of elasticity of the support portion 40 may be 100 times or more, or 1000 times or more, than the modulus of elasticity of the second region of the stretchable portion 20. By increasing the modulus of elasticity of the support portion 40, the support portion 40 is suppressed from stretching due to a tensile force or other forces applied to the support portion 40 during the process of forming the electronic components 51 or the interconnection wires 52 on the support portion 40 or the process of joining the support portion 40 to the stretchable portion 20. This facilitates handling of the support portion 40, such as alignment of the support portion 40.

For example, as the material for the support portion 40, polyethylene naphthalate, polyimide, polycarbonate, acrylic resin, or polyethylene terephthalate is usable.

The modulus of elasticity of the support portion 40 may be less than 100 times the modulus of elasticity of the second region of the stretchable portion 20. The thickness of the support portion 40 may be greater than or equal to 500 nm.

[Electronic Components]

In the example illustrated in FIG. 1, each of the plurality of electronic components 51 has at least an electrode that is connected to an interconnection wire 52. As illustrated in FIG. 1, the electronic components 51 may be covered by a sealing portion 58 made of resin or the like.

Alternatively, the electronic component 51 does not necessarily have to have an electrode that is connected to the interconnection wire 52. For example, the electronic component 51 may include a member that is integrated with at least one of the plurality of constituent elements of the wiring board 10. Examples of such an electronic component 51 include one that includes a conductive layer integrated with a conductive layer constituting an interconnection wire 52 of the wiring board 10 and one that includes a conductive layer located in a layer different from the conductive layer constituting the interconnection wire 52. For example, the electronic component 51 may be a pad composed of a conductive layer having a wider width in plan view than the conductive layer constituting the interconnection wire 52. A probe for inspection, a terminal for software rewriting, or the like is connected to the pad. Alternatively, the electronic component 51 may be a wiring pattern patterned to have a predetermined function. For example, the electronic component 51 may be a wiring pattern composed of a conductive layer extending in a spiral shape in plan view. Alternatively, the electronic component 51 may be a wiring pattern that extends in a meandering shape. The shape of the meandering wiring pattern is not limited to a particular shape. For example, the wiring pattern may change direction at an angle of 90°. As described above, a portion of the conductive layer that has been patterned and given a predetermined function can also be an electronic component 51.

The electronic component 51 having an electrode may be an active component, a passive component, or a mechanical component. Examples of an electronic component 51 with an electrode include a transistor, an LSI (Large-Scale Integration), MEMS (Micro Electro Mechanical Systems), a relay, a light-emitting device, such as an LED, an OLED, and an LCD, a sensor, a sound-emitting component, such as a buzzer, a vibration component that emits vibration, a cooling/heating component, such as a Peltier device that controls cooling and heating or a heating wire, a resistor, a capacitor, an inductor, a piezoelectric device, a switch, and a connector. Among the above-mentioned examples of an electronic component 51, a sensor is preferably used. Examples of a sensor include a temperature sensor, a pressure sensor, an optical sensor, a photoelectric sensor, a proximity sensor, a shear force sensor, a biometric sensor, a laser sensor, a microwave sensor, a humidity sensor, a strain sensor, a gyro sensor, an acceleration sensor, a displacement sensor, a magnetic sensor, a gas sensor, a GPS sensor, an ultrasonic sensor, an odor sensor, an electroencephalographic sensor, a current sensor, a vibration sensor, a pulse wave sensor, an electrocardiographic sensor, and a photometric sensor. Of these sensors, a biometric sensor is particularly desirable. Biometric sensors can measure biometric information, such as heartbeat, pulse, electrocardiogram, blood pressure, body temperature, and a blood oxygen level.

The applications of an electronic component 51 that does not have an electrode are described below. For example, the pad described above can function as a part to which a probe for inspection, a terminal for software rewriting, or the like is to be connected. In addition, the wiring pattern patterned to have a predetermined function can function as an antenna or the like.

As illustrated in FIG. 2A, the plurality of electronic components 51 are lined up in each of a first direction D1 and a second direction D2 that intersects the first direction D1. According to the present embodiment, the first direction D1 and the second direction D2 are orthogonal to each other.

[Interconnection Wires]

Each of the interconnection wires 52 is an electrically conductive member connected to the electrodes of the electronic components 51. As illustrated in FIGS. 1 and 2A, each of the plurality of interconnection wires 52 extends from one of two neighboring electronic components 51 to the other. According to the present embodiment, the plurality of the interconnection wires 52 include a first interconnection wire 521 extending from one of the two neighboring electronic components 51 to the other in the first direction D1 and a second interconnection wire 522 extending from one of the two neighboring electronic components 51 to the other in the second direction D2.

As described below, when the tensile stress is removed from the stretchable portion 20 joined to the support portion 40 and, thus, the stretchable portion 20 contracts, the interconnection wire 52 deforms into an accordion shape. Accordingly, it is desirable that the interconnection wire 52 have a structure that is resistant to deformation. The material itself for the interconnection wire 52 may or may not have stretchability. Examples of a material usable for the interconnection wire 52 and not having stretchability by itself include metals, such as gold, silver, copper, aluminum, platinum, and chromium, and alloys containing these metals. If the material for the interconnection wire 52 itself does not have stretchability, a metal film is usable for the interconnection wire 52. If the material used for the interconnection wire 52 itself has stretchability, the stretchability of the material is the same as that of the stretchable portion 20, for example. For example, the interconnection wire 52 has a base material and a plurality of electrically conductive particles dispersed in the base material. In this case, by using a deformable material, such as resin, as the base material, the interconnection wire 52 can also deform in accordance with stretching and contracting of the stretchable portion 20. In addition, even when deformation occurs, the conductivity of the interconnection wire 52 can be maintained by setting the distribution and shape of the plurality of conductive particles such that contact between the conductive particles is maintained.

For example, as a material that serves as the base material for the interconnection wire 52, widely used thermoplastic elastomers and thermosetting elastomers are usable. For example, styrene elastomer, acrylic elastomer, olefin elastomer, urethane elastomer, silicone rubber, urethane rubber, fluorine rubber, nitrile rubber, polybutadiene, polychloroprene, or the like is usable. Among these, resins and rubbers containing an urethane or silicone structure is preferably used due to their stretchability and durability. In addition, as a material for the conductive particles in the interconnection wire 52, particles of silver, copper, gold, nickel, palladium, platinum, carbon, or the like is usable, for example. Among others, silver particles are preferably used due to its price and conductivity.

The thickness of the interconnection wire 52 having the base material and the plurality of conductive particles dispersed in the base material is less than the thickness of the electronic component 51. For example, the thickness is less than or equal to 50 μm. The width of the interconnection wire 52 having the base material and the plurality of conductive particles dispersed in the base material is, for example, greater than or equal to 50 μm and less than or equal to 10 mm.

An example of a method for forming a material that is usable for the interconnection wire 52 and that itself does not have stretchability is a vapor deposition method or a plating method for forming a thin metal film. The thickness of the interconnection wire 52 including a metal film is, for example, less than or equal to 50 μm. The width of the interconnection wire 52 including the metal film is, for example, greater than or equal to 10 μm.

[Adhesive Layer]

The adhesive layer 60 is a layer located between the second surface 42 of the support portion 40 and the first surface 21 of the stretchable portion 20. The adhesive layer 60 contains an adhesive. As the adhesive of the adhesive layer 60, an acrylic adhesive or a silicone adhesive is usable, for example. The thickness of the adhesive layer 60 is, for example, greater than or equal to 5 μm and less than or equal to 200 μm. The second surface 42 of the support portion 40 may be joined to the first surface 21 of the stretchable portion 20 by room temperature bonding or molecular bonding. In this case, for example, as illustrated in FIG. 6C, an adhesive layer does not necessarily have to be provided between the stretchable portion 20 and the support portion 40. In this case, the first member 35 may be buried in the second member 36. That is, the first member 35 may be disposed so as to appear on neither the first surface 21 nor the second surface 22 of the stretchable portion 20. In addition, a primer layer may be provided on at least one of the first surface 21 of the stretchable portion 20 and the second surface 42 of the support portion 40 in order to improve the adhesiveness of room temperature bonding or molecular bonding.

[Stretchable Portion]

The stretchable portion 20 is a member configured to have stretchability. The stretchable portion 20 includes the first surface 21 located adjacent to the electronic component 51 and the interconnection wires 52 and the second surface 22 located opposite to the first surface 21. The thickness of the stretchable portion 20 is, for example, less than or equal to 10 mm, and more preferably less than or equal to 1 mm. By reducing the thickness of the stretchable portion 20, the force required to stretch or contract the stretchable portion 20 can be reduced. In addition, by reducing the thickness of the stretchable portion 20, the thickness of the entire body of a product using the wiring board 10 can be reduced. For example, if the product including the wiring board 10 is a sensor to be attached to a part of the body, such as a human arm, this can reduce the uncomfortableness that a person experiences when wearing the product. The thickness of the stretchable portion 20 may be greater than or equal to 50 μm.

Figure 3:
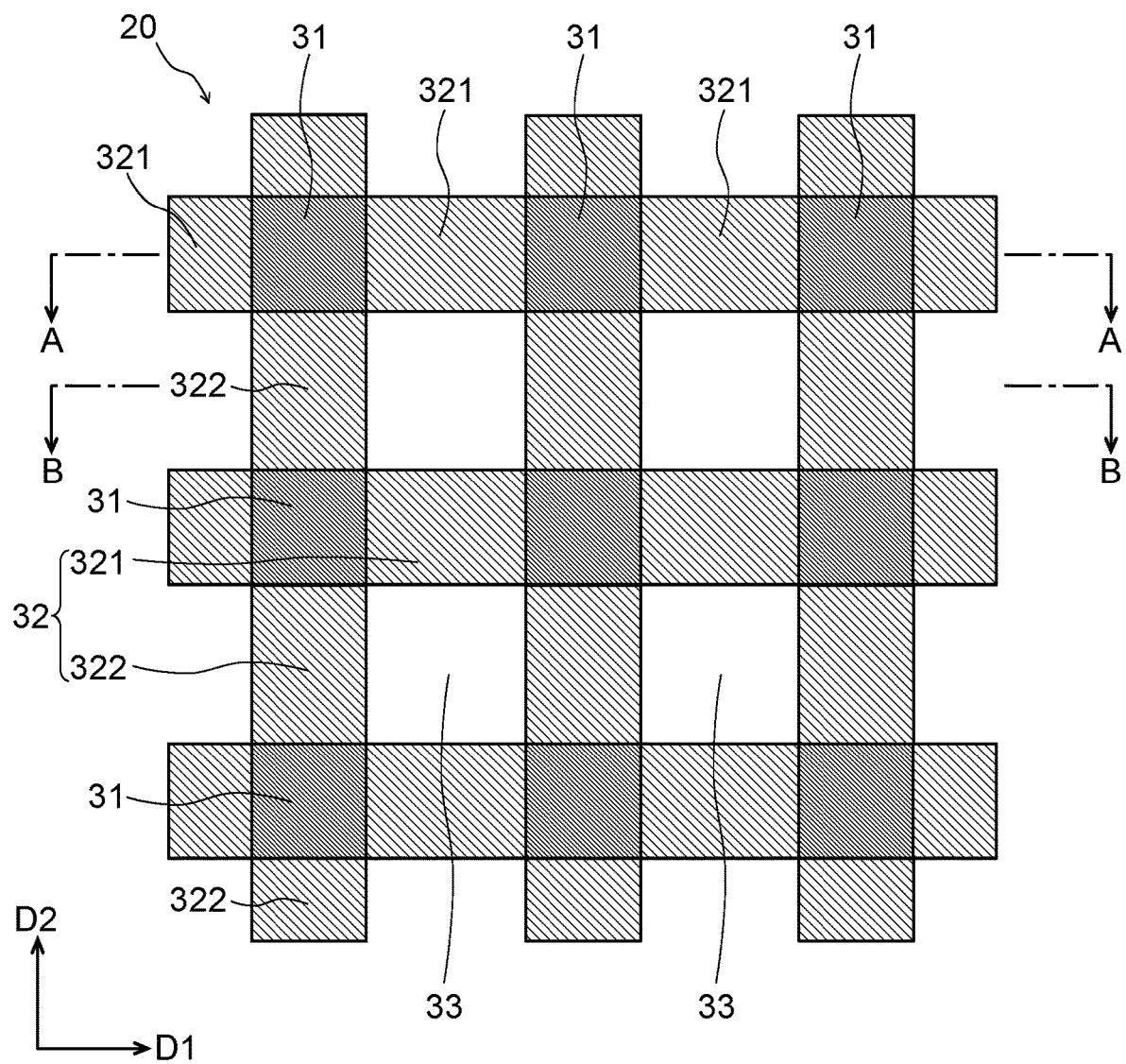
FIG. 3 is a plan view of a stretchable portion of the wiring board according to the embodiment.
Figure 4A:
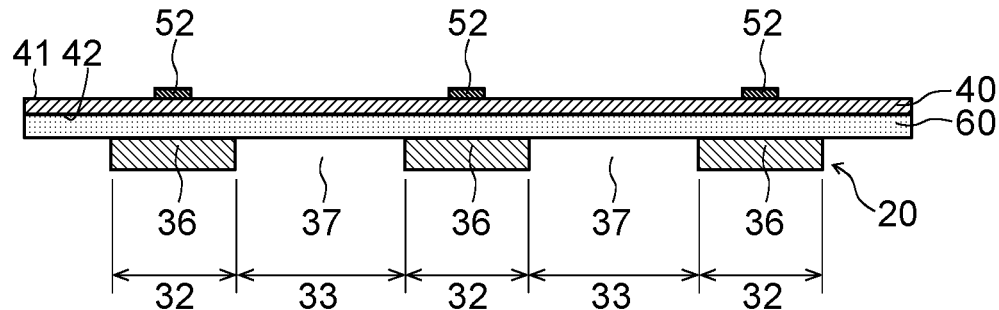
FIG. 4A is a cross-sectional view of the wiring board taken along line B-B of FIG. 2A.

Referring to FIGS. 3 and 4A in addition to FIGS. 1 and 2A, the stretchable portion 20 is described in detail below. FIG. 3 is a plan view of the stretchable portion 20 of the wiring board 10 as viewed from the first surface 21. FIG. 4A is a cutaway view of the wiring board 10 taken along line B-B of FIG. 2A. Note that line A-A and line B-B in FIG. 3 are illustrated in the same positions as line A-A and line B-B in FIG. 2A, respectively.

As illustrated in FIG. 3, the stretchable portion 20 has a plurality of first regions 31, a plurality of second regions 32, and a plurality of third regions 33. The plurality of first regions 31 are lined up in each of the first direction D1 and the second direction D2. In the example illustrated in FIG. 3, the first region 31 has a rectangular shape with four sides and four corners.

Each of the plurality of second regions 32 extends from one of two neighboring first regions 31 to the other. According to the present embodiment, the plurality of second regions 32 include a first portion 321 extending from one of two neighboring first regions 31 to the other in the first direction D1 and a second portion 322 extending from one of two neighboring first regions 31 to the other in the second direction D2. In the example illustrated in FIG. 3, one end of the second region 32 is connected to one side of one of two neighboring rectangular-shaped first regions 31, and the other end of the second region 32 is connected to one side of the other rectangular-shaped first region 31. Each of the plurality of second regions 32 has a lower modulus of elasticity than the first region 31. Note that in terms of the second region 32 located at an end portion of the wiring board 10, one of one end and the other end of the second region 32 may be connected to the first region 31, and the other may be a free end.

As illustrated in FIG. 3, the third region 33 is the region surrounded by a plurality of second regions 32. According to the present embodiment, the third region 33 is a hole 37 that penetrates the stretchable portion 20, as illustrated in FIG. 4A. Note that the contour enclosing the third region 33 may be partially composed of the first region 31 instead of entirely composed of the second region 32. Note that in terms of the third region 33 located at the end portion of the wiring board 10, two or three of the four sides are enclosed by the second region 32. At this time, one or two sides may be free ends.

Figure 4B:
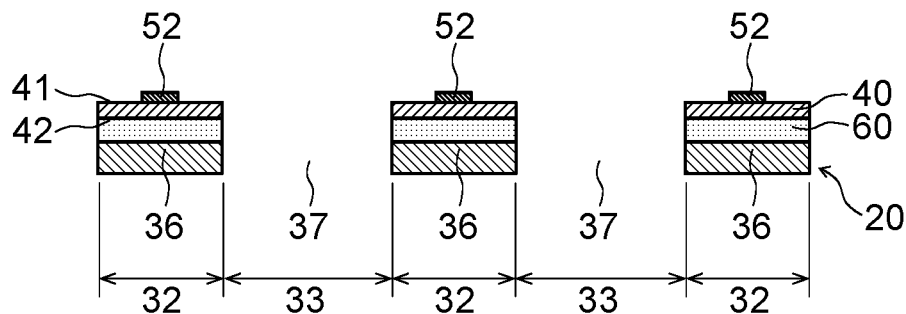
FIG. 4B is another example of the cross-sectional view of the wiring board taken along line B-B of FIG. 2A.
Figure 4C:
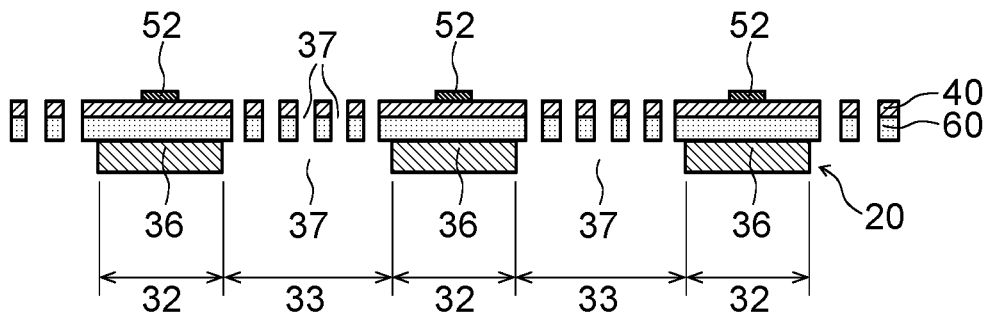
FIG. 4C is another example of the cross-sectional view of the wiring board taken along line B-B of FIG. 2A.

FIGS. 4B to 4E are cross-sectional views illustrating other examples of the third region 33. As illustrated in FIGS. 4B and 4C, in terms of the third region 33, holes 37 may also be formed in the support portion 40 and the adhesive layer 60. By providing, in the support portion 40 and the adhesive layer 60, holes 37 that communicate with the holes 37 in the stretchable portion 20, the wiring board itself can have air permeability. This allows the wiring board 10 to exhibit the effect of suppress sweaty feeling when the wiring board 10 is affixed to a living body.

Figure 4D:
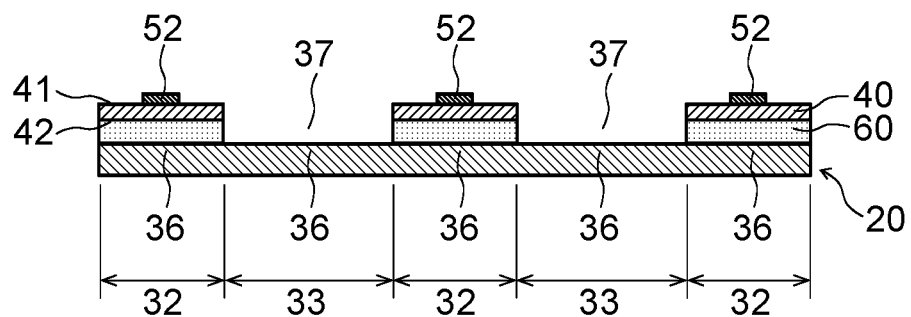
FIG. 4D is another example of the cross-sectional view of the wiring board taken along line B-B of FIG. 2A.
Figure 4E:
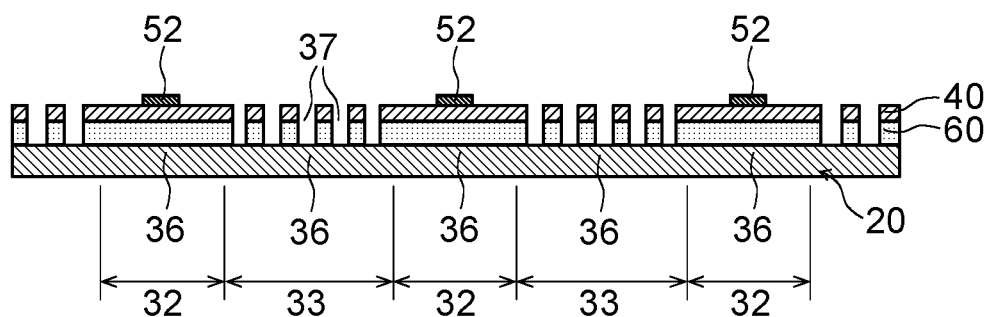
FIG. 4E is another example of the cross-sectional view of the wiring board taken along line B-B of FIG. 2A.

As illustrated in FIGS. 4D and 4E, the second member 36 may also be present in the third region 33. Even in this case, by forming holes in the support portion 40 and the adhesive layer 60 located in the third region 33, the third region 33 stretches and contracts more easily than the second region 32.

As illustrated in FIGS. 4B and 4D, each of the third regions 33 may be provided with a single support portion 40 of the third region 33 and a single hole 37 of the adhesive layer 60. Alternatively, as illustrated in FIGS. 4C and 4E, each of the third regions 33 may be provided with a plurality of support portions 40 and a plurality of holes.

Figure 2B:
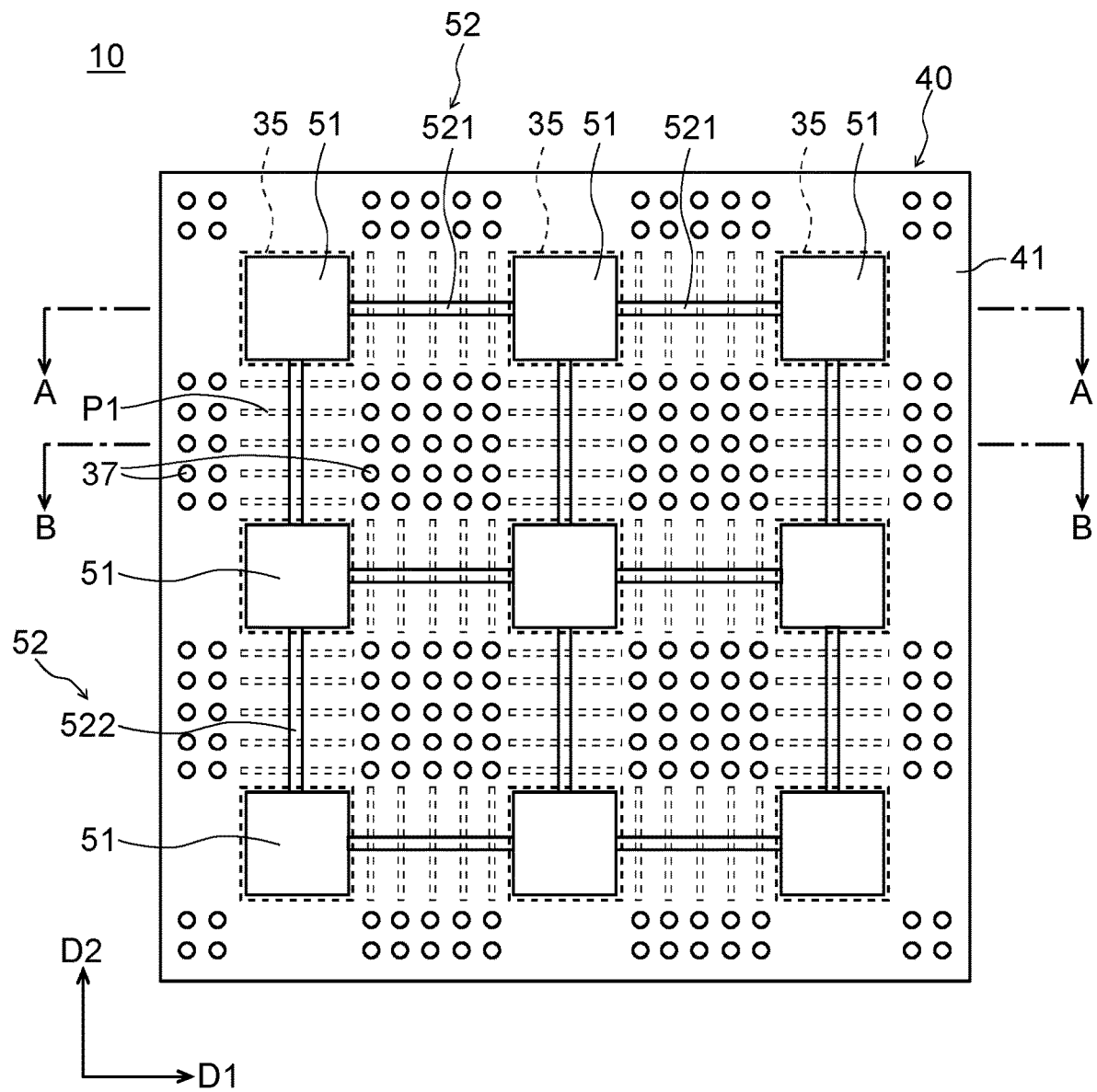
FIG. 2B is a plan view illustrating another example of the wiring board according to the embodiment.

FIG. 2B is a plan view illustrating an example of the wiring board 10 in which a plurality of holes 37 are provided in one third region 33 as illustrated in FIGS. 4C and 4E. Each of FIGS. 4C and 4E corresponds to a cutaway view of the wiring board 10 taken along line B-B of FIG. 2B. As illustrated in FIG. 2B, the plurality of holes 37 in the third region 33 may be lined up in the first direction D1 and the second direction D2.

In the case where a plurality of holes 37 are provided in one third region 33, crest portions P1 (described below) that appear on the surface of the interconnection wire 52 may appear at positions each overlapping one of the plurality of holes 37 lined up in the first direction D1 when viewed in the first direction D1, as illustrated in FIG. 2B. In addition, the crest portions P1 may also appear at positions each overlapping one of the plurality of holes 37 lined up in the second direction D2 when viewed in the second direction D2.

The structures of the first region 31 and the second region 32 of the stretchable portion 20 are described below. As illustrated in FIGS. 1 and 2A, the stretchable portion 20 has a plurality of first members 35 each located in one of the plurality of first regions 31 and the second member 36 that overlaps the first members 35 in the first regions 31 and that extends across the first regions 31 and the second regions 32. That is, each of the first regions 31 includes the first member 35 and the second member 36 stacked on top of each other, and each of the second regions 32 includes the second member 36. In the example illustrated in FIG. 1, the thickness of the second member 36 located in the second region 32 is equal to the sum of the thicknesses of the first member 35 and the second member 36 located in the first region 31.

The second member 36 has a lower modulus of elasticity than the first member 35. Therefore, the modulus of elasticity of the second region 32 including the second member 36 is lower than that of the first region 31 including the first member 35 and the second member 36. For this reason, when tensile stress is applied to the stretchable portion 20, the second region 32 stretches more easily than the first region 31.

The modulus of elasticity of the first member 35 is, for example, greater than or equal to 100 MPa, and more preferably greater than or equal to 1 GPa. The thickness of the first member 35 is, for example, greater than or equal to 25 μm, and may be greater than or equal to 100 μm. In addition, the thickness of the first member 35 is, for example, less than or equal to 10 mm, and may be less than or equal to 1 mm. The ratio of a thickness T1 of the first member 35 to a thickness T0 of the entire first region 31 is, for example, greater than or equal to 5%, and may be greater than or equal to 10%. In addition, the ratio of the thickness T1 of the first member 35 to the thickness T0 of the entire first region 31 may be, for example, less than or equal to 100%, and may be less than or equal to 50%.

Examples of the material used for the first member 35 include a film material, such as polyimide, polyethylene naphthalate, polycarbonate, acrylic resin, or polyethylene terephthalate, an insulating inorganic material, such as ceramic and glass, and a metal, such as copper or aluminum.

The modulus of elasticity of the second member 36 is, for example, less than or equal to 10 MPa, and more preferably less than or equal to 1 MPa. The modulus of elasticity of the second member 36 may be greater than or equal to 1 kPa. The thickness T2 of the second member 36 located in the second region 32 is, for example, greater than or equal to 25 μm, and may be greater than or equal to 100 mm. In addition, the thickness T2 of the second member 36 located in the second region 32 may be, for example, less than or equal to 10 mm, and may be less than or equal to 1 mm.

Examples of the material used for the second member 36 include thermoplastic elastomers, silicone rubber, urethane gel, and silicone gel. As thermoplastic elastomer, one of polyurethane elastomer, styrene thermoplastic elastomer, olefin thermoplastic elastomer, vinyl chloride thermoplastic elastomer, ester thermoplastic elastomer, amide thermoplastic elastomer, 1,2-BR thermoplastic elastomer, and fluorinated thermoplastic elastomer is usable, for example. In view of the mechanical strength and abrasion resistance, it is desirable that urethane-based elastomer to be used. Furthermore, because silicone rubber has excellent heat resistance, chemical resistance, and flame retardance, silicone rubber is desirable as the material used for the stretchable portion 20. In addition, in consideration of the case where the wiring board 10 is disposed in clothing, a fabric or non-woven fabric made of acrylic, polyester or urethane material in fiber form, woven or interwoven, is usable as the second member 36. This increases the affinity between the wiring board 10 and clothing.

The modulus of elasticity of the first region 31 including the stacked first member 35 and second member 36 is, for example, greater than or equal to 100 MPa, and more preferably greater than or equal to 1 GPa. The thickness of the first region 31 is, for example, greater than or equal to 50 μm, and may be greater than or equal to 100 μm. In addition, the thickness of the first region 31 is, for example, less than or equal to 10 mm, and may be less than or equal to 1 mm.

The desirable range of the elastic modulus of the second region 32 is the same as the desirable range of the elastic modulus of the second member 36 described above. In addition, the desirable range of the thickness of the second region 32 is the same as the desirable range of the thickness of the second member 36 described above located in the second region 32.

As a method for calculating the modulus of elasticity, the method for conducting a tensile test using a sample extracted from a target member can be employed. The standard of the tensile test may be selected appropriately in accordance with the target member. For example, the tensile test of samples extracted from the first member 35 and the support portion 40 may be conducted in accordance with ASTM D882. In addition, the tensile test of a sample extracted from the second member 36 may be conducted in accordance with JIS K6251. Alternatively, the method for measuring the modulus of elasticity of a sample by the nanoindentation technique in accordance with ISO 14577 may be employed. As a measuring instrument used in the nanoindentation technique, a nanoindenter is usable. As a method for preparing samples of the first region 31 and the second region 32, the method for taking, as a sample, part of the first region 31 and the second region 32 of the stretchable portion 20 of the wiring board 10 or a method for taking, as a sample, a part of the first region 31 and the second region 32 before the wiring board 10 is configured can be employed. As a method for taking a sample of the first member 35, the first member 35 can be separated from the second member 36 in a sample of the first region 31, or part of the first member 35 can be taken as a sample before the first member 35 is stacked on the second member 36. As another method for calculating the modulus of elasticity, the material for the target member can be analyzed and, thereafter, the modulus of elasticity can be calculated on the basis of an existing database of materials.

Another example of a parameter representing the stretchability of the stretchable portion 20 is the bending stiffness of the stretchable portion 20. The bending stiffness is the product of the second moment of area of a target member and the modulus of elasticity of the material that forms the target member, and the unit of bending stiffness is given by $N \cdot m^2$ or $Pa \cdot m^4$. The second moment of area of each region or each member of the stretchable portion 20 is calculated on the basis of the cross section of the stretchable portion 20 when the stretchable portion 20 is cut by a plane perpendicular to the stretching direction of the wiring board 10. It is desirable that the each of the plurality of second regions 32 have a lower bending stiffness than the first region 31.

The arrangement of the first regions 31 and the second regions 32 of the stretchable portion 20 is described below.

As illustrated in FIGS. 1 and 2A, the first region 31 of the stretchable portion 20 at least overlaps the electronic component 51 mounted on the wiring board 10. The first region 31 includes the first member 35 that has a higher modulus of elasticity than the second member 36 that forms the second region 32. Therefore, the modulus of elasticity of the first region 31 is higher than that of the second region 32. For this reason, when a force, such as tensile stress, is applied to the wiring board 10, the first region 31 is less likely to undergo deformation, such as stretch or contraction, than the second region 32. As a result, it is possible to suppress the stress caused by the deformation of the stretchable portion 20 from being applied to the electronic component 51 and, thus, the electronic component 51 is suppressed from being deformed or damaged. Note that the term "overlap" as used herein means that two constituent elements overlap when viewed in the direction normal to the first surface 21 of the stretchable portion 20.

As illustrated in FIGS. 1 and 4A, the second region 32 of the stretchable portion 20 overlaps the interconnection wire 52. More specifically, the first portion 321 of the second region 32 overlaps the first interconnection wire 521 of the interconnection wire 52, and the second portion 322 of the second region 32 overlaps the second interconnection wire 522 of the interconnection wire 52.

[Structure of Interconnection Wire]

Figure 5:
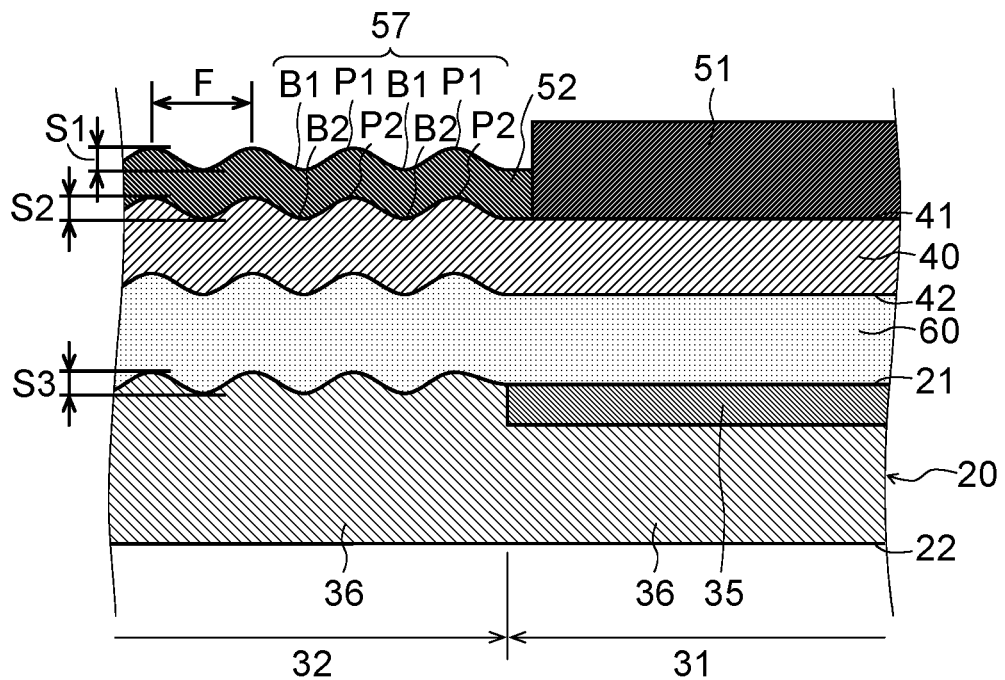
FIG. 5 is an enlarged cross-sectional view illustrating an example of an interconnection wire and its surrounding constituent elements in the wiring board according to an embodiment.

Subsequently, the cross-sectional structure of the interconnection wire 52 is described in detail with reference to FIG. 5. FIG. 5 is an enlarged cross-sectional view illustrating an example of the interconnection wire 52, such as the first interconnection wire 521 and second interconnection wire 522, and its surrounding constituent elements.

As described above, the interconnection wire 52 overlaps the second region 32 of the stretchable portion 20. Consequently, the stress generated in the stretchable portion 20 due to stretch and construction of the second region 32 of the stretchable portion 20 is transferred to the support portion 40 and the interconnection wire 52 on the support portion 40. For example, when tensile stress is removed from the stretchable portion 20 that is stretched and, thus, the second region 32 of the stretchable portion 20 is relaxed, compressive stress is generated in the stretchable portion 20, and the compressive stress is transferred to the support portion 40 and the interconnection wire 52 on the support portion 40 that overlap the second region 32 of the stretchable portion 20. As a result, as illustrated in FIG. 5, an undulating portion 57 is generated in the interconnection wire 52.

The undulating portion 57 includes crest portions and valley portions in the direction normal to the first surface 21 of the stretchable portion 20. In FIG. 5, a reference sign P1 represents a crest portion appearing on the front surface of the interconnection wire 52, and a reference sign P2 represents a crest portion appearing on the back surface of the interconnection wire 52. A reference sign B1 represents a valley portion appearing on a front surface of the interconnection wire 52, and a reference sign B2 represents a valley portion appearing on a back surface of the interconnection wire 52. Note that the term "front surface" refers to a surface of interconnection wire 52 that is located remote from the stretchable portion 20, and the term "back surface" refers to a surface of interconnection wire 52 that is located adjacent to the stretchable portion 20.

The crest portions P1 and P2 and valley portions B1 and B2 appear repeatedly in an in-plane direction of the first surface 21 of the stretchable portion 20. For example, the crest portions P1 and P2 and the valley portions B1 and B2 of the first interconnection wire 521 of the interconnection wire 52 appear repeatedly in the first direction D1. In addition, the crest portion P1 and P2 and the valley portions B1 and B2 of the second interconnection wire 522 of interconnection wire 52 appear repeatedly in the second direction D2. A cycle F in which each of the crest portions P1 and P2 and each of the valley portions B1 or B2 repeatedly appear is, for example, greater than or equal to 10 µm and less than or equal to 100 mm.

In FIG. 5, a reference sign S1 represents the amplitude of the undulating portion 57 on the surface of the interconnection wire 52. The amplitude S1 is, for example, greater than or equal to 1 µm, and more preferably greater than or equal to 10 µm. By setting the amplitude S1 to a value greater than or equal to 10 µm, deformation of the interconnection wire 52 is facilitated in accordance with stretch or contraction of the stretchable portion 20. Note that the amplitude S1 may be less than or equal to 500 µm, for example.

The amplitude S1 is calculated by, for example, measuring the distance in the direction normal to the first surface 21 between every neighboring crest portion P1 and valley portion B1 over a certain range in the length direction of the interconnection wire 52 and finding their average. For example, the amplitude S1 of the undulating portion 57 of the first interconnection wire 521 is calculated by measuring the distance in the direction normal to the first surface 21 between every neighboring crest portion P1 and valley portion B1 over a certain range in the first direction D1 and, thereafter, finding their average. The same applies to the amplitude of the second interconnection wire 522. The term "certain range" refers to, for example, a 10-mm range. As a measuring instrument for measuring the distance between neighboring crest portion P1 and valley portion B1, a non-contact measuring instrument using a laser microscope or the like is usable. Alternatively, a contact measuring instrument is usable. The distance between neighboring crest portion P1 and valley portion B1 may be measured on the basis of an image, such as a tomographic image.

In FIG. 5, a reference sign S2 represents the amplitude of the undulating portion 57 on the back surface of the interconnection wire 52. Like the amplitude S1, the amplitude S2 is, for example, greater than or equal to 1 µm, and more preferably greater than or equal to 10 µm. The amplitude S2 may be, for example, less than or equal to 500 µm.

As illustrated in FIG. 5, the support portion 40, the adhesive layer 60, and the first surface 21 of the stretchable portion 20 may also have an undulating portion similar to that of the interconnection wire 52. In FIG. 5, a reference sign S3 represents the amplitude of an undulating portion on the first surface 21 of the second member 36 of the stretchable portion 20. The amplitude S3 is, for example, greater than or equal to 1 µm, and more preferably greater than or equal to 10 µm. In addition, the amplitude S3 may be, for example, less than or equal to 500 µm.

Figure 6A:
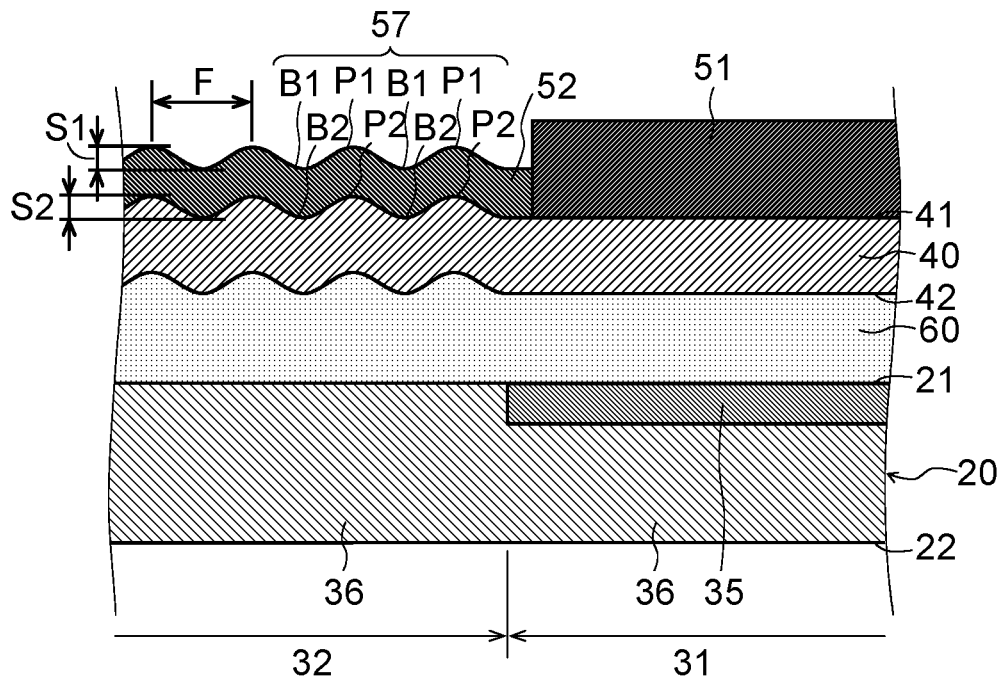
FIG. 6A is an enlarged cross-sectional view illustrating another example of the interconnection wire and its surrounding constituent elements in the wiring board according to an embodiment.

FIG. 6A is an enlarged cross-sectional view illustrating another example of the interconnection wire 52 and surrounding constituent elements of the wiring board 10 illustrated in FIG. 1. As illustrated in FIG. 6A, the undulating portion does not necessarily have to be formed on the first surface 21 of the second member 36 of the stretchable portion 20.

Figure 6B:
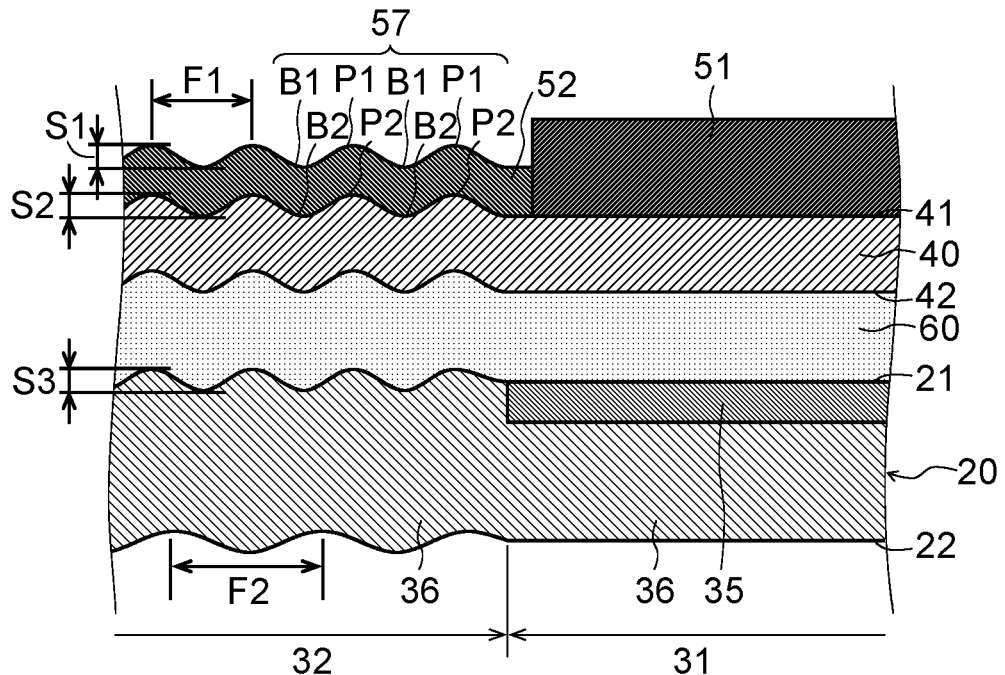
FIG. 6B is an enlarged cross-sectional view illustrating another example of the interconnection wire and its surrounding constituent elements in the wiring board according to the embodiment.
Figure 6C:
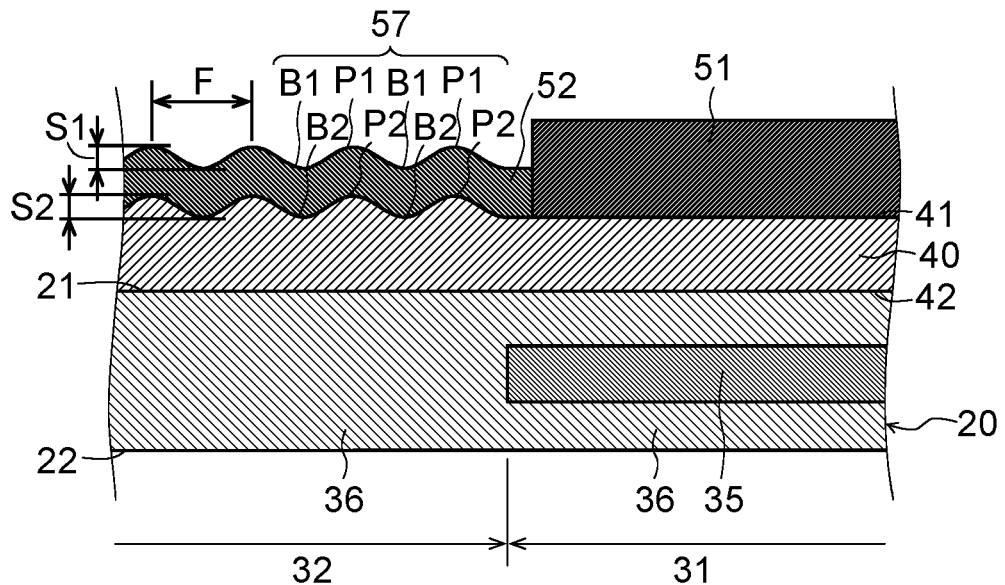
FIG. 6C is an enlarged cross-sectional view illustrating another example of the interconnection wire and its surrounding constituent elements in the wiring board according to the embodiment.

FIG. 6B is an enlarged cross-sectional view illustrating another example of the interconnection wire 52 and surrounding components of the wiring board 10 illustrated in FIG. 1. As illustrated in FIG. 6B, the cycle F1 of the undulating portion 57 on the front surface of the interconnection wire 52 may differ from a cycle F2 of an undulating portion on the second surface 22 of the second member 36 of the stretchable portion 20. For example, as illustrated in FIG. 6B, the cycle F2 at the second surface 22 of the second member 36 of the stretchable portion 20 may be greater than the cycle F1 at the front surface of the interconnection wire 52. Alternatively, the cycle F2 may be less than the cycle F1 (not illustrated).

Figure 36:
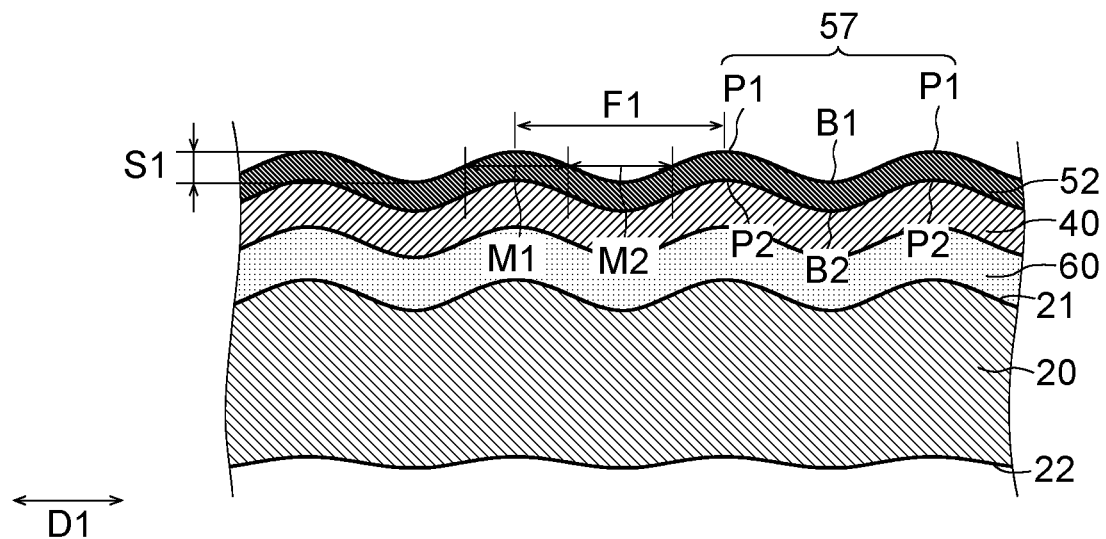
FIG. 36 is an enlarged cross-sectional view of an undulating portion of a wiring board according to an embodiment.

FIG. 36 is an enlarged cross-sectional view of an example of the undulating portion 57. In FIG. 36, the reference signs M1 and M2 respectively represent the width of the crest portion P1 and the width of the valley portion B1 in the direction in which the interconnection wire 52 extends, when no tensile force is applied to the wiring board 10. In the example illustrated in FIG. 36, the width M1 of the crest portion P1 and the width M2 of the valley portion B1 are substantially the same. The ratio for the crest portion P1 in the undulating portion 57 in the state where no tensile force is applied to the wiring board 10 is denoted as X1. The ratio X1 is calculated by X1=M1/(M1+M2). For example, the ratio X1 is greater than or equal to 0.40 and less than or equal to 0.60.

The advantage of the undulating portion 57 formed in the interconnection wire 52 illustrated in FIG. 5 or 6 is described below.

If tensile stress is applied to the wiring board 10, the elastic deformation of the stretchable portion 20, especially, the second region 32 stretches. When the stretchable portion 20 is stretched, the interconnection wire 52 deforms to reduce the undulation of the undulating portion 57, that is, to flatten the accordion shape. Thus, the interconnection wire 52 can follow the stretching of the stretchable portion 20. As a result, it is possible to suppress an increase in the total length of interconnection wire 52 and a decrease in the cross-sectional area of the interconnection wire 52 caused by the stretching of the stretchable portion 20. This can suppress an increase in the resistance value of the interconnection wire 52 caused by the stretching of wiring board 10. In addition, damage of the interconnection wire 52, such as cracks, can be suppressed.

As an example, the effect of the undulating portion 57 of the interconnection wire 52 on the resistance value of the interconnection wire 52 is described below. As used herein, the term "first resistance value" refers to the resistance value of the interconnection wire 52 in a first state in which no tensile stress is applied to the stretchable portion 20 in the in-plane direction of the first surface 21 of the stretchable portion 20. In addition, the term "second resistance value" refers to the resistance value of the interconnection wire 52 in a second state in which tensile stress is applied to the stretchable portion 20 to stretch the length of the stretchable portion 20 in the in-plane direction of the first surface 21 by 30% of the length in the first state. According to the present embodiment, by forming the undulating portion 57 in the interconnection wire 52, the ratio of the absolute value of the difference between the first resistance value and the second resistance value to the first resistance value can be less than or equal to 20%, more preferably less than or equal to 10%, and even more preferably less than or equal to 5%.

Figure 37:
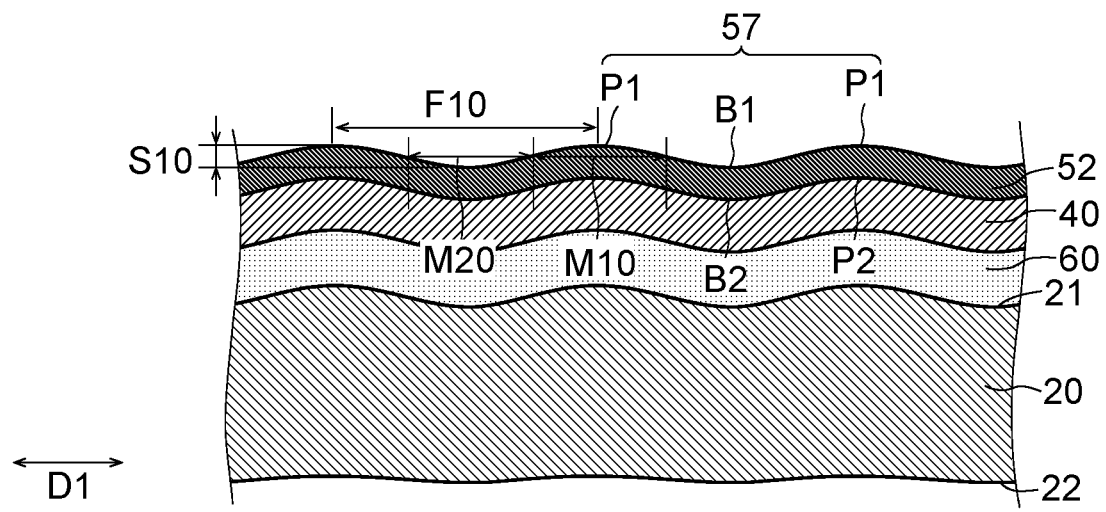
FIG. 37 is an enlarged cross-sectional view of an undulating portion of a wiring board that is stretched.

FIG. 37 is an enlarged cross-sectional view of the wiring board 10 stretched by 25% when a tensile force is applied to the wiring board 10 in the first state in an in-plane direction of the first surface 21 (e.g., the first direction D1). In FIG. 37, the reference sign S10 represents the amplitude of the undulating portion 57 when the wiring board 10 is stretched by 25%. In addition, a reference sign F10 represents the cycle of the undulating portion 57 when the length of the wiring board 10 is stretched by 25%. The amplitude S10 of the undulating portion 57 of the 25% stretched wiring board 10 is, for example, less than or equal to 0.8 times the amplitude S1 of the undulating portion 57 of the unstretched wiring board 10. The amplitude S10 may be less than or equal to 0.7 times or 0.6 times the amplitude S1. The amplitude S10 is, for example, 0.2 times or more the amplitude S1. The amplitude S10 may be 0.3 times or more, or 0.4 times or more the amplitude S1.

In FIG. 37, the reference signs M10 and M20 respectively represent the width of the crest portion P1 and the width of the valley portion B1 of the undulating portion 57 of the 25% stretched wiring board 10 in the direction in which the interconnection wire 52 is stretched. As illustrated in FIG. 37, the width M10 of the crest portion P1 and the width M20 of the valley portion B1 in the 25% stretched wiring board 10 are greater than the width M1 of the crest portion P1 and the width M2 of the valley portion B1 in the unstretched wiring board 10, respectively.

When the wiring board 10 is stretched, the widths of the crest portion P1 and the valley portion B1 in the undulating portion 57 may be increased while maintaining the ratio between the widths. The ratio for the crest portion P1 in the accordion-shape portion 57 when no tensile force is applied to the wiring board 10 is denoted by X2. The ratio X2 is calculated by X2=M10/(M10+M20). The ratio X2 is equivalent to the ratio X1 described above when no tensile force is applied to the wiring board 10 and is, for example, greater than or equal to 0.40 and less than or equal to 0.60. In addition, the absolute value of the difference between the ratio X1 and the ratio X2 is, for example, less than or equal to 0.20, and may be less than or equal to 0.15, less than or equal to 0.10, less than or equal to 0.08, less than or equal to 0.06, or less than or equal to 0.04.

Examples of the measured amplitudes of the undulating portion 57 of the wiring board 10 and the measured width change ratio of each of the crest portion P1 and the valley portion B1 before and after the tensile force is applied are described below. In each of examples 1 and 2 described below, the material of the interconnection wire 52 is copper, the thickness of the interconnection wire 52 is 1 μm, and the width of the interconnection wire 52 is 200 μm. The stretch ratio of the stretchable portion 20 during the wiring process (described below) is 1.6. In addition, the stretch ratio of the stretchable portion 20 is 1.25 when measuring the amplitude of the undulating portion 57 and the widths of the crest portion P1 and the valley portion B1 with a tensile force applied to the wiring board 10.

Example 1

In the case where no tensile force is applied to the wiring board 10
    Amplitude S1 of the undulating portion: 192 μm
    Width M1 of the crest portion P1: 254 μm
    Width M2 of the valley portion B1: 286 μm
    Ratio X1 for the crest portion: 254/(254+286)=0.47
In the case where a tensile force is applied to the wiring board 10 to stretch the wiring board 10 to 1.25 times its original length
    Amplitude S10 of the undulating portion: 108 μm
    Width M10 of the crest portion P1: 296 μm
    Width M20 of the valley portion B1: 370 μm
    Ratio X2 for the crest portion: 296/(296+370)=0.44
    S10/S1=0.56

Example 2

In the case where no tensile force is applied to the wiring board 10
    Amplitude S1 of the undulating portion: 256 μm
    Width M1 of the crest portion P1: 322 μm
    Width M2 of the valley portion B1: 318 μm
    Ratio X1 of the crest portion: 322/(322+318)=0.50
In the case where a tensile force is applied to the wiring board 10 to stretch the wiring board 10 to 1.25 times its original length
    Amplitude S10 of the undulating portion: 140 μm
    Width M10 of the crest portion P1: 386 μm Width M20 of the valley portion B1: 418 μm
Ratio X2 of the crest portion: 386/(386+418)=0.48
S10/S1=0.54

Figure 43A:
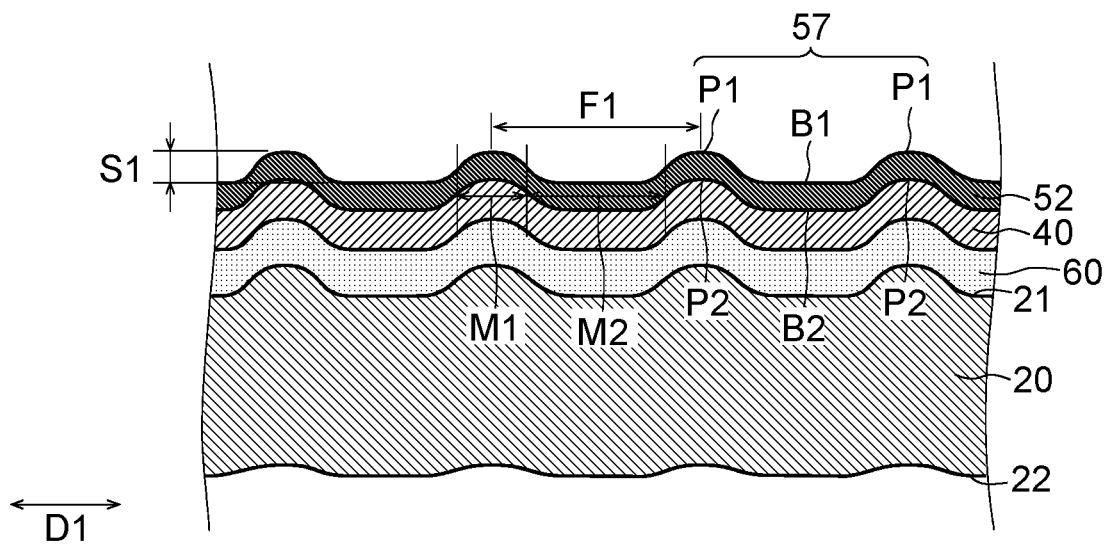
FIG. 43A is an enlarged cross-sectional view illustrating an example of an undulating portion.

FIG. 43A is an enlarged cross-sectional view of an example of the undulating portion 57. In FIG. 43A, the reference signs M1 and M2 respectively represent the width of the crest portion P1 and the width of the valley portion B1 in the direction in which the interconnection wire 52 extends, when no tensile force is applied to the wiring board 10. As illustrated in FIG. 43A, the width M1 of the crest portion P1 may be less than the width M2 of the valley portion B1. The width M1 of the crest portion P1 may be 0.3 times or more, 0.4 times or more, 0.5 times or more, or 0.6 times or more the width M2 of the valley portion B1. In addition, the width M1 of the crest portion P1 may be less than or equal to 0.9 times, less than or equal to 0.8 times, or less than or equal to 0.7 times the width M2 of the valley portion B1. The width M1 of the crest portion P1 and the width M2 of the valley portion B1 are calculated by separating the crest portion P1 from the valley portion B1 using the midpoint of the amplitude S1 of the undulating portion 57 as the boundary.

Figure 43B:
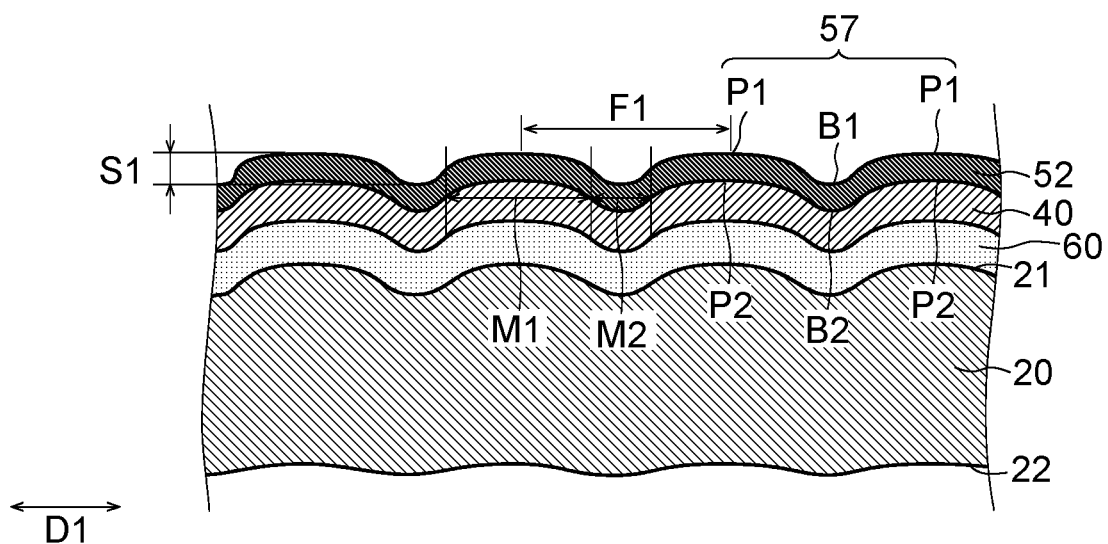
FIG. 43B is an enlarged cross-sectional view illustrating an example of an undulating portion.

In addition, as illustrated in FIG. 43B, the width M2 of the valley portion B1 in the direction in which the interconnection wire 52 extends when no tensile force is applied to the wiring board 10 may be less than the width M1 of the crest portion P1. The width M2 of the valley portion B1 may be greater than or equal to 0.05 times or more, 0.1 times or more, 0.2 times or more, or 0.3 times or more the width M1 of the crest portion P1. The width M2 of the valley portion B1 may be less than or equal to 0.9 times, less than or equal to 0.8 times, or less than or equal to 0.7 times the width M1 of the crest portion P1.

The ratio of the width M2 of the valley portion B1 to the width M1 of the crest portion P1 decreases with increasing sum of the stiffness values of the constituent elements, such as the interconnection wire 52 and the support portion 40, located adjacent to the first surface 21 of the stretchable portion 20. Thus, the undulating portion 57 tends to have the shape illustrated in FIG. 43B. In contrast, the ratio of the width M1 of the crest portion P1 to the width M2 of the valley portion B1 decreases with decreasing sum of the stiffness values of the constituent elements, such as the interconnection wire 52 and the support portion 40, located adjacent to the first surface 21 of the stretchable portion 20. Thus, the undulating portion 57 tends to have the shape illustrated in FIG. 43A.

The applications of the wiring board 10 include the healthcare field, the medical field, the nursing care field, the electronics field, the sports and fitness field, the beauty field, the mobility field, the livestock and pet field, the amusement field, the fashion and apparel field, the security field, the military field, the distribution field, the education field, the construction material/furniture/decoration field, the environmental energy field, the agricultural, the forestry or fishery field, and the robotics field. For example, a product that is to be attached to a part of the human body, such as an arm, is configured using the wiring board 10 according to the present embodiment. Since the wiring board 10 can be stretched or contracted, the wiring board 10 can be in tight contact with the part of the human body by attaching the wiring board 10 to the human body with the wiring board 10 being stretched. For this reason, comfortable wearability can be provided. In addition, a decrease in resistance value of the interconnection wire 52 can be suppressed when the wiring board 10 is stretched, excellent electrical characteristics of the wiring board 10 can be achieved. In addition, since the wiring board 10 can be stretched or contracted, the wiring board 10 can be installed or assembled not only in a living body, such as the human body, but also along a curved surface or a three-dimensional shape. Examples of such a product include a vital sensor, a mask, a hearing aid, a toothbrush, an adhesive plaster, a poultice, contact lenses, an artificial arm, an artificial leg, an artificial eye, a catheter, a gauze, a medicine pack, a bandage, a disposable bioelectrode, a diaper, rehabilitation equipment, a home appliance, a display, a signage, a personal computer, a cell phone, a mouse, a loudspeaker, sportswear, a wristband, a cloth headband, a glove, a swimwear, a jockstrap, a ball, a baseball glove, a racket, a golf club, a bat, a fishing rod, a relay baton, gymnastics equipment and its grip, physical training equipment, an inner tube, a tent, swimwear, a saddlecloth, a goal net, a goal tape, an osmotic medicinal beauty mask, an electro stimulation weight loss equipment product, a pocket body warmer, an artificial nail, a tattoo, seats of an automobile, an airplane, a railway train, a boat, a bicycle, a baby buggy, a drone, and a wheelchair, an instrument panel, a tire, an interior package, an exterior package, a saddle, a steering wheel, a road, a rail, a bridge, a tunnel, a gas or water pipe, an electric wire, a tetrapod, a rope collar, a leash, a harness, an animal tag, a bracelet, a belt, etc., a haptic device (such as a game device or a controller), a luncheon mat, a ticket, a doll, a stuffed animal, cheering goods, a hat, clothes, glasses, shoes, insoles, socks/stockings, slippers, inner wear, a muffler/scarf, earmuffs, a bag, an accessory, a ring, a watch, a tie, a personal ID recognition device, a helmet, a package, an IC tag, a plastic bottle, stationery, a book, a pen, a carpet, a sofa, bedclothes, an illumination lamp, a doorknob, an arm rail, a vase, a bed, a mattress, a cushion, a curtain, a door, a window, a ceiling, a wall, a floor, a wireless power transfer antenna, a battery, plastic greenhouses, a net, a robot hand, and a robot exterior.

A method for manufacturing the wiring board 10 is described below. Referring to FIGS. 7A to 9B, a method for manufacturing the stretchable portion 20 of the wiring board 10 is described first.

(Method for Manufacturing Stretchable Portion)

Figure 7A:
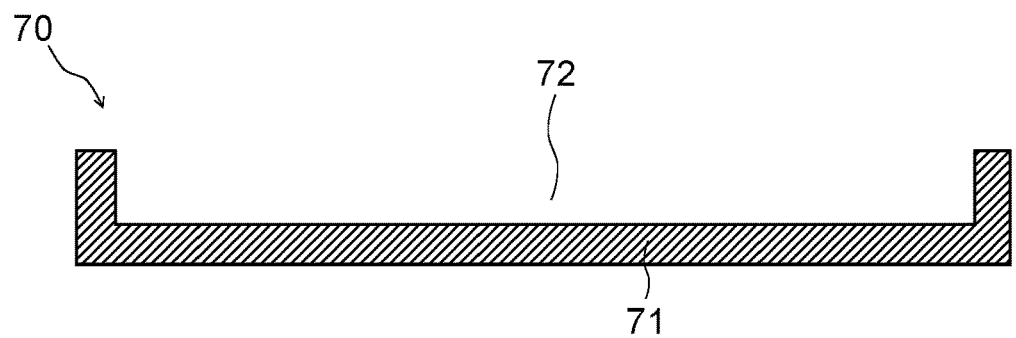
FIG. 7A is a cross-sectional view of an example of a mold for producing the stretchable portion.
Figure 7B:
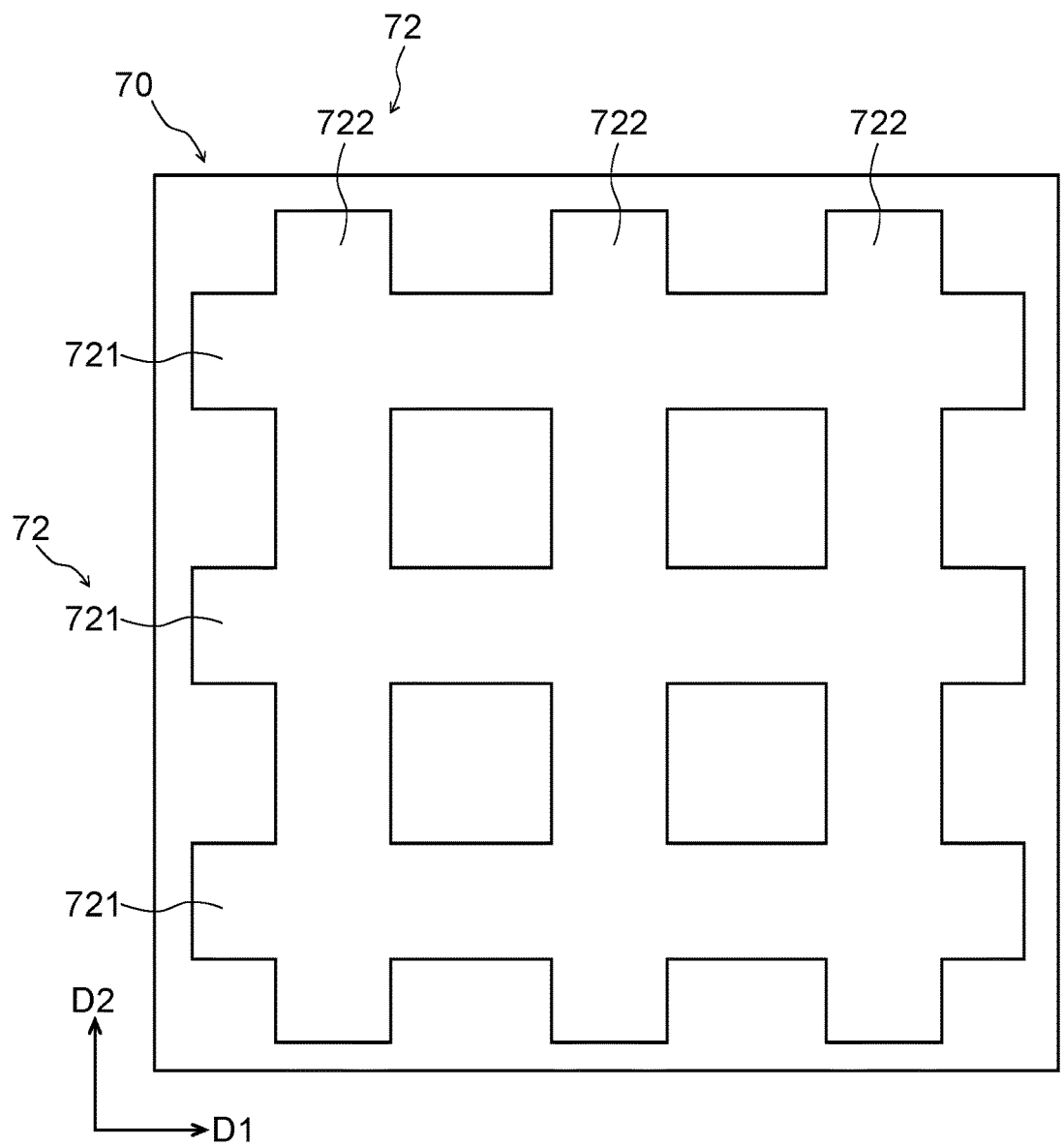
FIG. 7B is a cross-sectional view of an example of a mold for producing the stretchable portion.

A mold 70 for molding the stretchable portion 20 is prepared first. FIGS. 7A and 7B are a cross-sectional view and a plan view of the mold 70, respectively.

As illustrated in FIGS. 7A and 7B, the mold 70 has a base material 71 and a groove 72 formed in the base material 71. As illustrated in FIG. 7B, the groove 72 has first grooves 721 each extending in the first direction D1 and second grooves 722 each extending in the second direction D2. The first groove 721 and the second groove 722 intersect with each other.

Figure 8A:
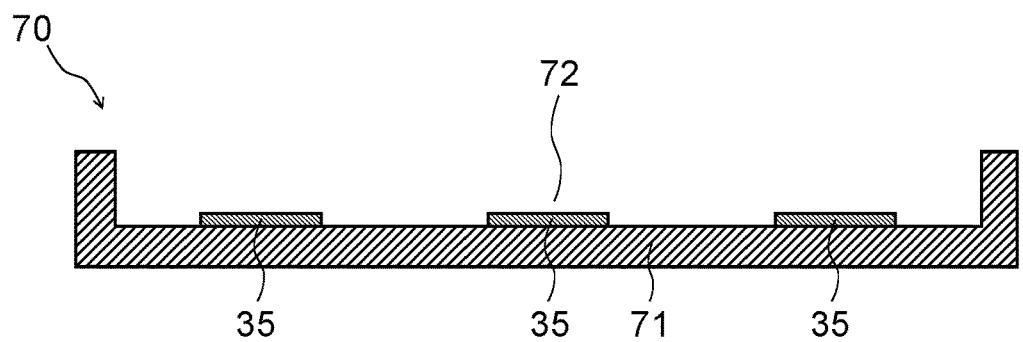
FIG. 8A is a cross-sectional view illustrating an example of a process for arranging a plurality of first members in the mold.
Figure 8B:
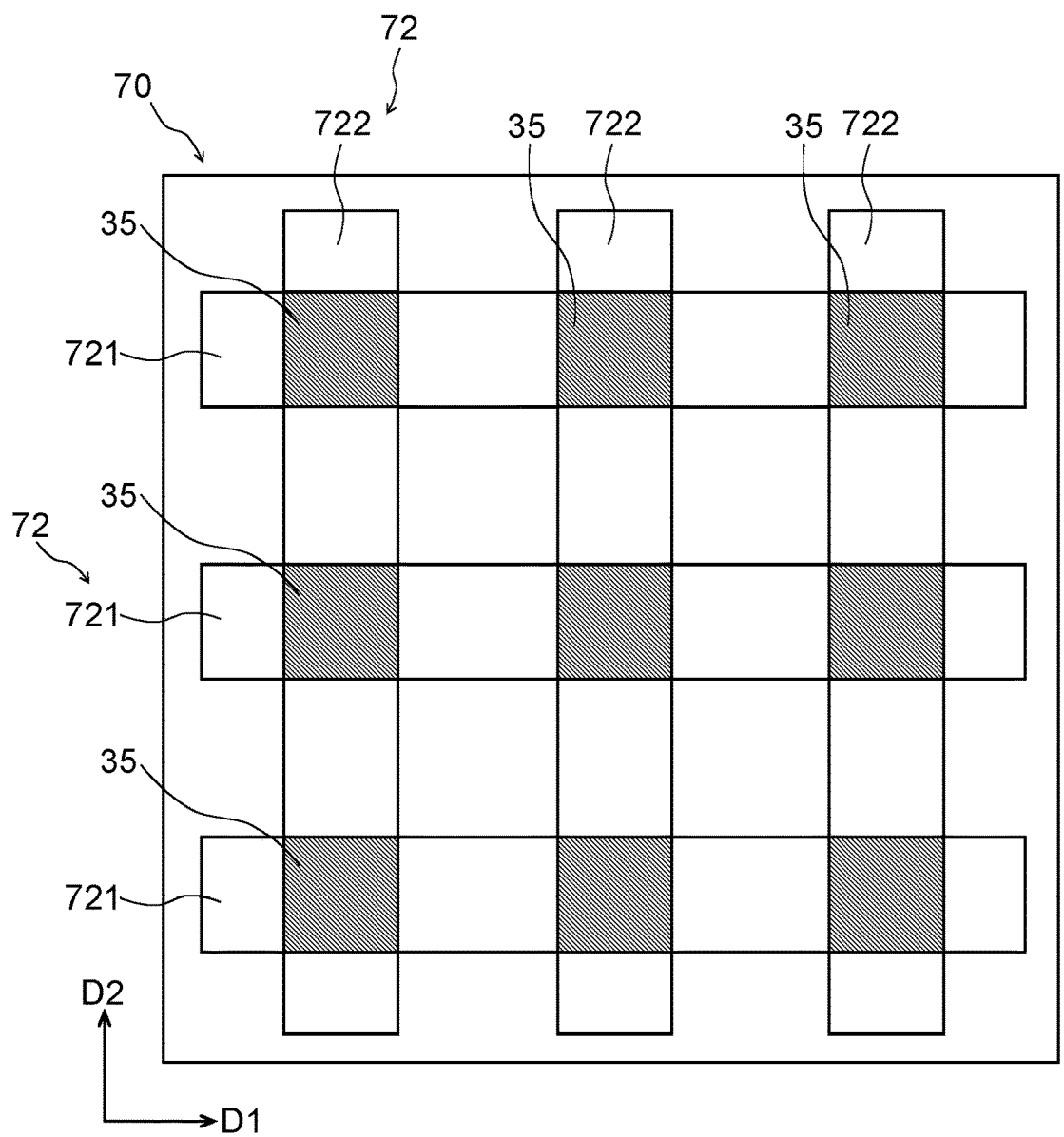
FIG. 8B is a plan view illustrating an example of a process for arranging a plurality of first members in the mold.
Figure 9A:
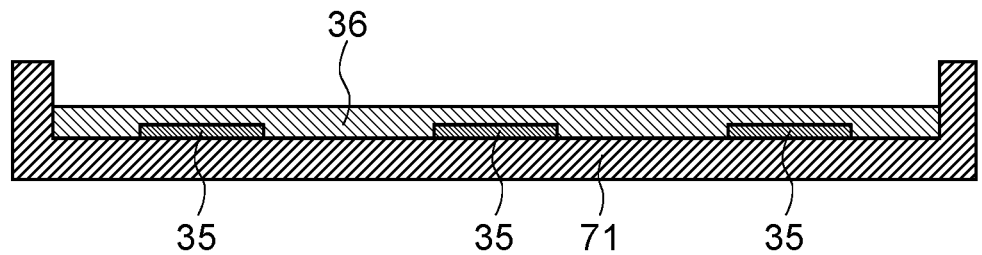
FIG. 9A is a cross-sectional view of a process for filling the mold with a second member.
Figure 9B:
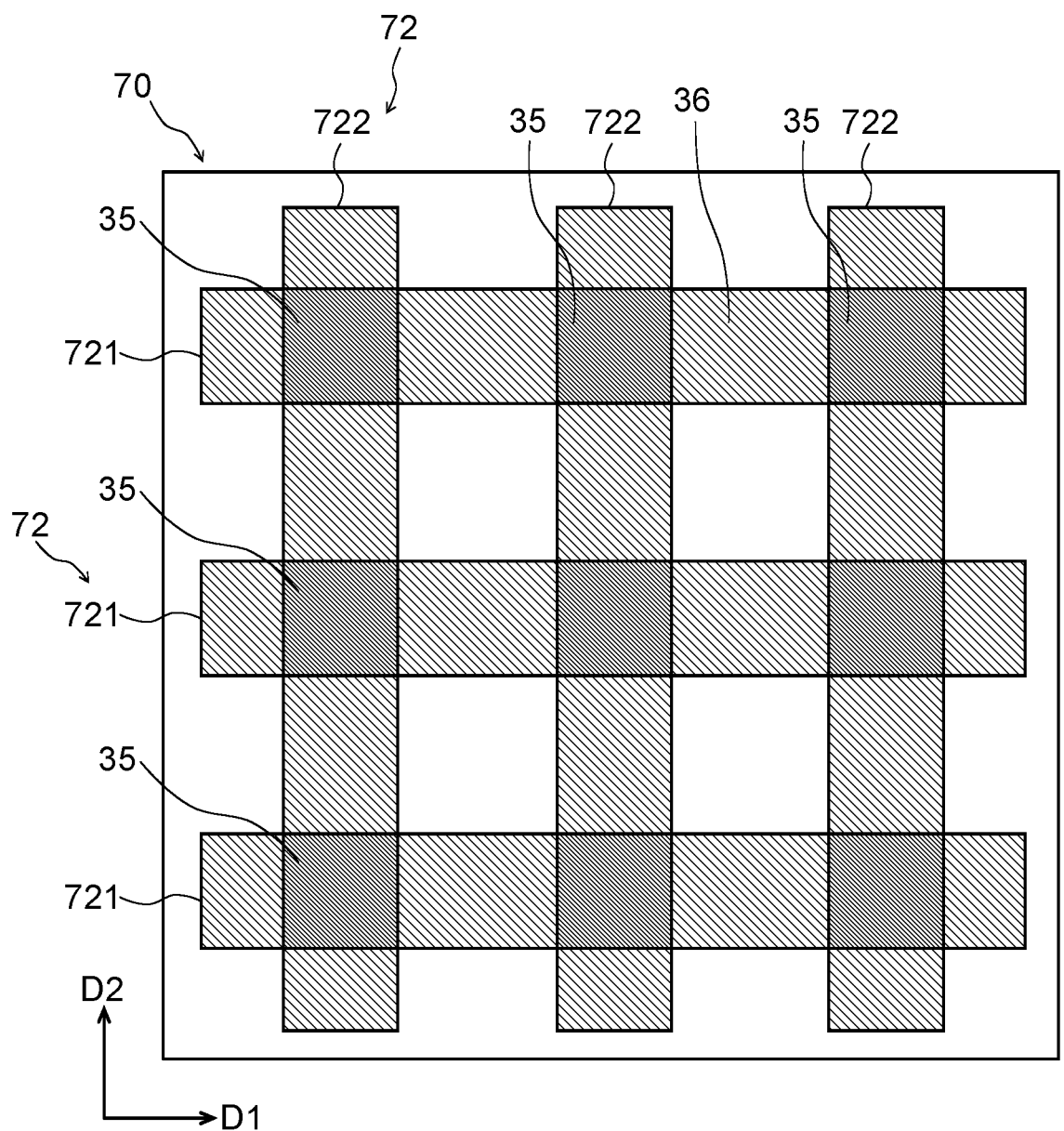
FIG. 9B is a plan view of the process for filling the mold with the second member.

Subsequently, as illustrated in FIGS. 8A and 8B, the first member 35 is disposed in the groove 72 of the mold 70 at each of the intersections of the first grooves 721 and the second grooves 722. Thereafter, as illustrated in FIGS. 9A and 9B, the grooves 72 of the mold 70 are filled with the second member 36. For example, the second member 36 dispersed in a solvent is poured into the grooves 72 of the mold 70. At this time, as illustrated in FIG. 9A, the second member 36 may be poured in the grooves 72 until the first member 35 is covered by the second member 36. Thereafter, the solvent is evaporated and, thus, the second member 36 can be set in the grooves 72. Subsequently, the first member 35 and the second member 36 are removed from the grooves 72 of the mold 70. In this manner, a stretchable portion 20 can be obtained having the first region 31 including the stacked first member 35 and second member 36, the second region 32 extending between two neighboring first regions 31 in the first direction D1 or the second direction D2, and the third region 33 including the hole 37 surrounded by the second regions 32.

(Method for Manufacturing Wiring Board)

A method for manufacturing the wiring board 10 is described below with reference to FIGS. 10(a) to 10(d).

Figure 10A:
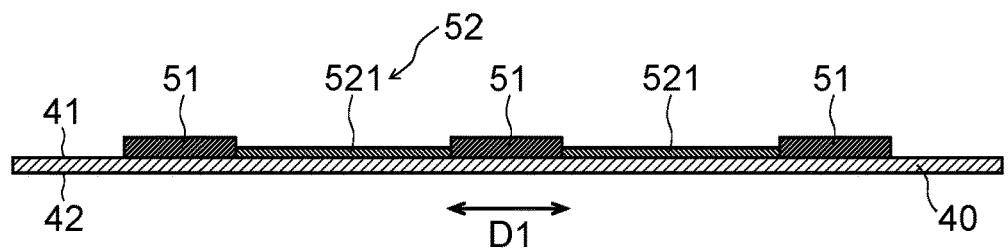
FIG. 10A is a diagram for illustrating the process for incorporating a support portion with a stretchable portion.

The support portion 40 is prepared first. Subsequently, as illustrated in FIG. 10A, the electronic components 51 and the interconnection wires 52 are disposed on the first surface 41 of the support portion 40. As a technique for disposing the interconnection wires 52, a technique of printing, on the first surface 41 of the support portion 40, a conductive paste containing the base material and conductive particles can be employed, for example.

Figure 10B:
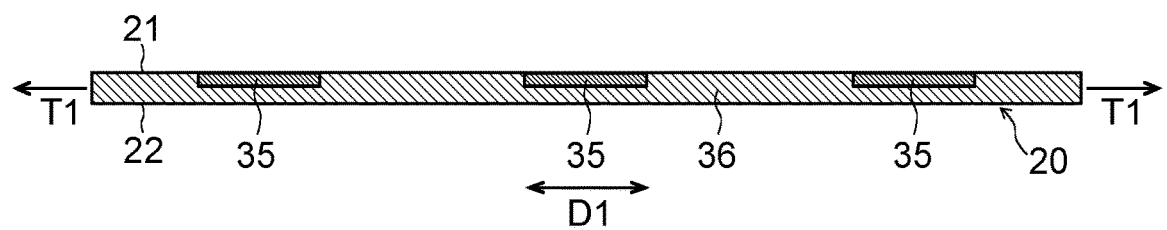
FIG. 10B is a diagram for illustrating the process for incorporating a support portion with a stretchable portion.

In addition, as illustrated in FIG. 10B, a stretching process is performed to stretch the stretchable portion 20 by applying tensile stress to the stretchable portion 20. In the stretching process, first tensile stress T1 is applied to the stretchable portion 20. In addition, although not illustrated, second tensile stress acting in a direction that differs from the direction of the first tensile stress T1 is applied to the stretchable portion 20. The first tensile stress T1 is a force exerted, for example, in the first direction D1, and the second tensile stress is a force exerted, for example, in the second direction D2.

The extension percentage of the stretchable portion 20 in the direction in which the first tensile stress T1 is applied and in the direction in which the second tensile stress is applied is, for example, greater than or equal to 10% and less than or equal to 200%. The stretching process may be carried out with the stretchable portion 20 being heated or at room temperature. When the stretchable portion 20 is heated, the temperature of the stretchable portion 20 is, for example, higher than or equal to 50° C. and lower than or equal to 100° C.

Figure 10C:
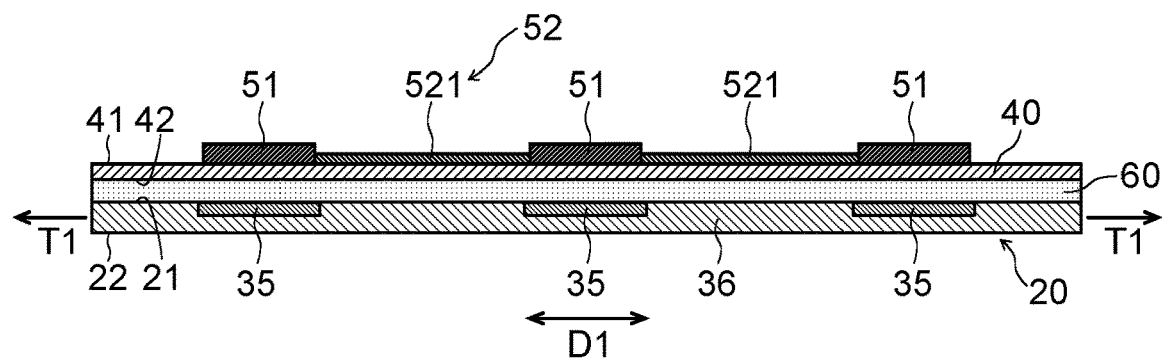
FIG. 10C is a diagram for illustrating the process for incorporating a support portion with a stretchable portion.
Figure 10D:
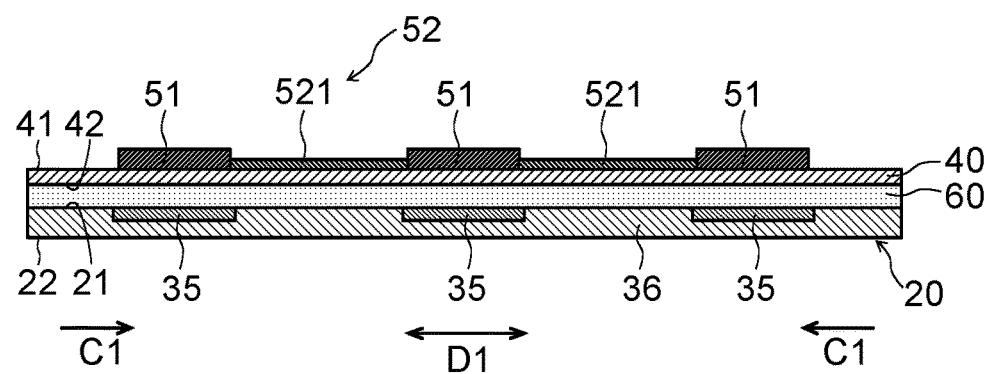
FIG. 10D is a diagram for illustrating the process for incorporating a support portion with a stretchable portion.

Subsequently, as illustrated in FIG. 10C, a wiring process is performed to dispose the interconnection wires 52 on the first surface 21 of the stretchable portion 20 that is stretched. According to the present embodiment, the wiring process includes a joining process in which the support portion 40 having the electronic components 51 and the interconnection wires 52 disposed therein is joined to the first surface 21 of the stretchable portion 20 that is stretched. The joining process is performed such that the electronic components 51 provided on the support portion 40 overlap the first region 31 of the stretchable portion 20 and, in addition, the interconnection wires 52 overlap the second region 32 of the stretchable portion 20. In the joining process, the adhesive layer 60 may be provided between the stretchable portion 20 and the support portion 40.

Thereafter, a contracting process is performed to remove the tensile stress from the stretchable portion 20. This causes the stretchable portion 20 to contract in the first direction D1, as indicated by arrow C1 in FIG. 10D. Although not illustrated, the stretchable portion 20 also contracts in the second direction D2. As a result, deformation also occurs in the support portion 40 and the interconnection wires 52 supported by the support portion 40. For example, the undulating portion 57 described above is formed in the support portion 40 and the interconnection wires 52.

When as described above, the stretchable portion 20 is stretched due to application of tensile stress to the stretchable portion 20 in the first directions D1 and second direction D2 and, thereafter, the stretchable portion 20 contracts due to removal of the tensile stress from the stretchable portion 20, the undulating portion 57 appears in each of the first direction D1 and the second direction D2. If the undulating portions 57 appear randomly in the support portion 40 and the interconnection wires 52, the undulating portion 57 that appears in the first direction D1 and the undulating portion 57 that appears in the second direction D2 may interfere with each other at some locations of the support portion 40 and the interconnection wires 52. In this case, due to the interference between the undulating portions 57, the amplitude of the undulating portions 57 may be locally increased, or the cycle of the undulating portions 57 may be locally disordered.

Note that according to the present embodiment, the second region 32 of the stretchable portion 20 that is stretched in each of the first direction D1 and the second direction D2 has the first portion 321 extending in the first direction D1 and the second portion 322 extending in the second direction D2. In this case, the stretching caused by the first tensile stress T1 acting in the first direction D1 occurs mainly in the first portion 321 of the stretchable portion 20. Accordingly, the contraction caused by the removal of the first tensile stress T1 occurs mainly in the first portion 321 of the stretchable portion 20. In addition, the stretching caused by the first tensile stress acting in the second direction D2 occurs mainly in the second portion 322 of the stretchable portion 20. Accordingly, the contraction caused by the removal of the second tensile stress occurs mainly in the second portion 322 of the stretchable portion 20.

As described above, according to the present embodiment, since contraction in the first portion 321 of the stretchable portion 20 mainly occurs in the first direction D1, the undulating portion 57 extending in the first direction D1 is likely to appear in the support portion 40 overlapping the first portion 321 and in the first interconnection wire 521. However, the undulating portion 57 extending in the second direction D2 is unlikely to appear in the support portion 40 overlapping the first portion 321 and in the first interconnection wire 521. Similarly, since the second portion 322 of the stretchable portion 20 contracts mainly in the second direction D2, the undulating portion 57 that extends in the second direction D2 is likely to appear in the support portion 40 overlapping the second portion 322 and in the second interconnection wire 522. However, the undulating portion 57 that extends in the first direction D1 is unlikely to appear in the support portion 40 overlapping the second portion 322 and in the second interconnection wire 522. As described above, according to the present embodiment, it is possible to control the direction of the undulating portion 57 that preferentially appears in each of the first interconnection wire 521 and the second interconnection wire 522. As a result, it is possible to control the occurrence of interference between the undulating portions 57 that appear in different directions. Therefore, it is possible to suppress the amplitude of the undulating portion 57 from being locally increased or the cycle of the undulating portion 57 from being locally disordered. For example, as can be seen from Examples described below, the standard deviation of the cycles of the undulating portions 57 can be controlled to a value less than ¾ of the average value of the cycles, and more preferably less than ½ of the average value. Note that according to the present embodiment, since the undulating portion 57 is generated by contraction of the stretchable portion 20, it is not easy to set the standard deviation of the cycles of the undulating portion 57 to zero. The standard deviation of the cycles of the undulating portion 57 is, for example, greater than or equal to 1/50 of the average value of the cycles, which may be greater than or equal to 1/10 or greater than or equal to ¼.

In addition, according to the present embodiment, the first region 31 having a higher modulus of elasticity than the second region 32 is located between the first portion 321 and the second portion 322 in the second region 32. As a result, when the stretchable portion 20 is stretched or when the wiring board 10 having the stretchable portion 20 and the support portion 40 therein is stretched, transfer of the stress generated in the first portion 321 to the second portion 322 can be suppressed. In addition, transfer of the stress generated in the second portion 322 to the first portion 321 can be suppressed. This can also contribute to controlling the direction of the undulating portion 57 that appears in each of the first interconnection wire 521 and the second interconnection wire 522.

It should be noted that various changes can be made to the above-described embodiment. Modifications are described below with reference to the accompanying drawings as needed. In the following description and the drawings used in the following description, parts that can be configured in the same manner as in the above-described embodiment are identified by the same reference signs as those used for the corresponding parts in the above-mentioned embodiment, and duplicated description is not provided. In addition, if it is clear that the effect obtained in the above-mentioned embodiment can also be obtained in the modification, description of the effect may not be provided herein.

(First Modification)

Figure 11:
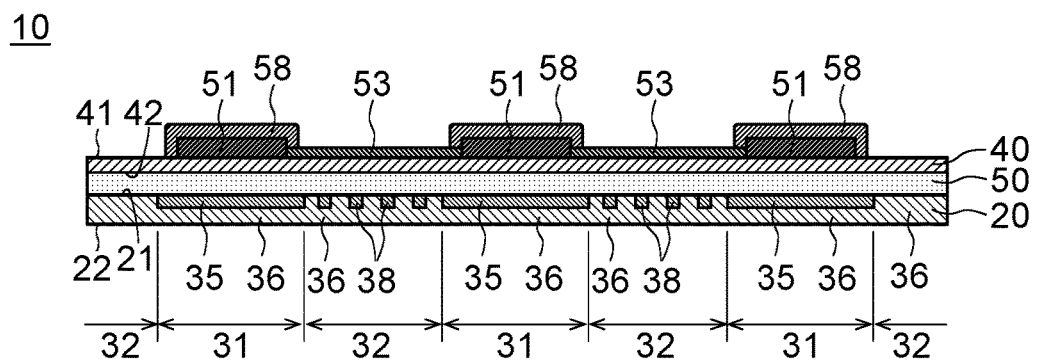
FIG. 11 is a cross-sectional view of a wiring board according to a first modification.
Figure 12:
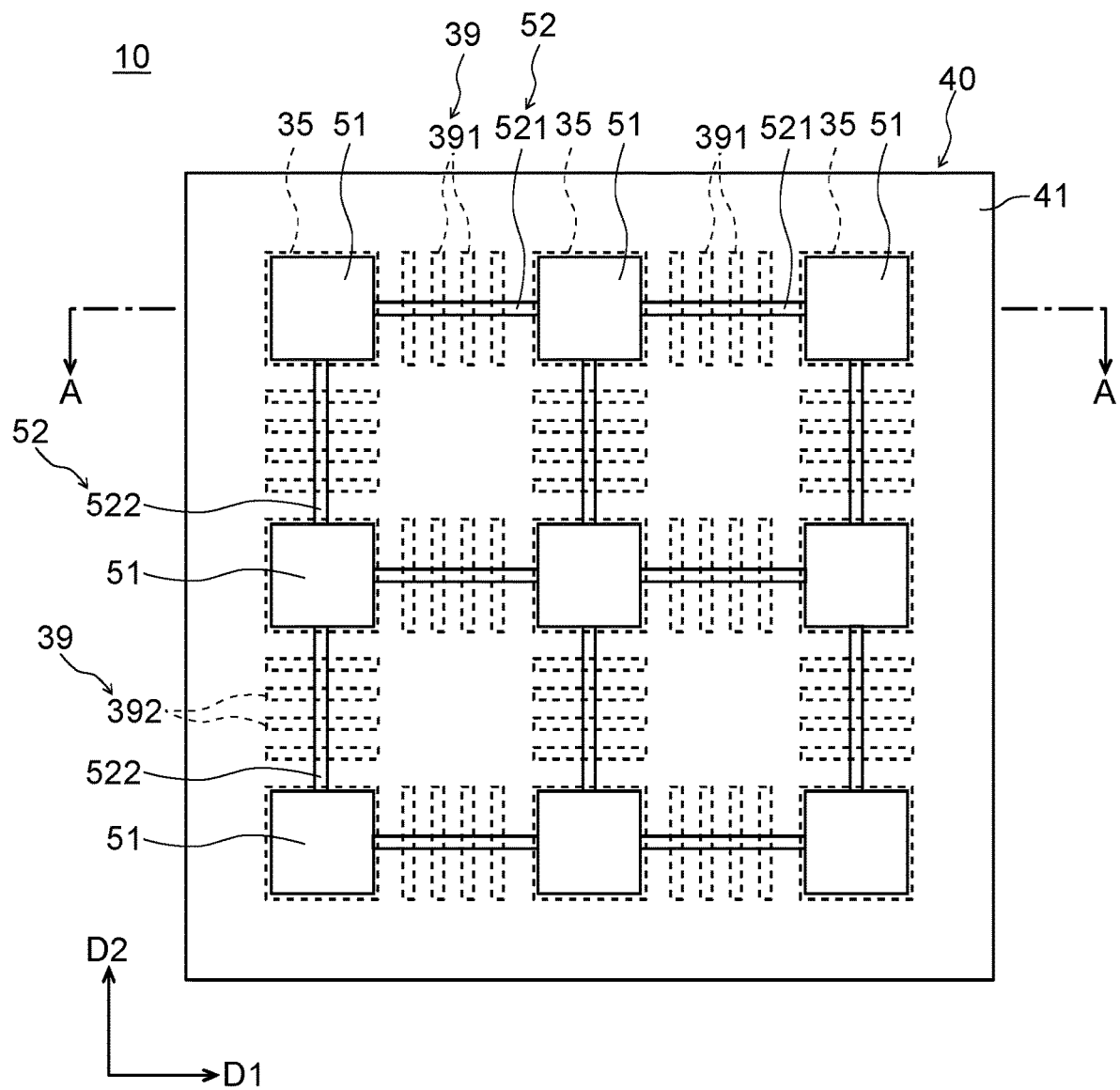
FIG. 12 is a plan view of the wiring board according to the first modification.

FIGS. 11 and 12 are a cross-sectional view and a plan view of a wiring board 10 according to the first modification, respectively. The cross-sectional view illustrated in FIG. 11 is a cutaway view of the wiring board 10 taken along line A-A of FIG. 12. The wiring board 10 may further include a plurality of stretch control portions 39 that line up along at least one of the first portion 321 and the second portion 322 in the second region 32 when viewed in the direction normal to the first surface 21 of the stretchable portion 20. In the example illustrated in FIG. 12, the stretch control portions 39 have a plurality of first control portions 391 that line up in the first direction D1 in which the first portion 321 extends and that overlap the first portion 321 and a plurality of second control portions 392 that line up in the second direction D2 in which the second portion 322 extends and that overlap the second portion 322. Each of the stretch control portions 39, such as the first control portions 391 and the second control portions 392, is a member for controlling the cycle of the undulating portion 57 that appears in the interconnection wire 52.

According to the present modification, the stretch control portion 39 is part of the stretchable portion 20. For example, like the first member 35, the stretch control portion 39 constitutes part of the first surface 21 of the stretchable portion 20.

The stretch control portion 39 may have a higher modulus of elasticity than the second region 32, such as the first portion 321 or the second portion 322. The modulus of elasticity of the stretch control portion 39 is, for example, greater than or equal to 100 MPa and less than or equal to 500 GPa, and more preferably greater than or equal to 1 GPa and less than or equal to 300 GPa. By providing such stretch control portions 39 in the wiring board 10, it is possible to suppress a portion of the wiring board 10 that overlaps the stretch control portions 39 from stretching or contracting. In this manner, the wiring board 10 can be divided into portions in which stretching and contracting are likely to occur and portions in which expansion and contraction are less likely to occur. As a result, the cycle and amplitude of the undulating portion 57 that appears on the wiring board 10 can be controlled.

If a second modulus of elasticity of the stretch control portion 39 is higher than the modulus of elasticity of the second region 32, a metallic material, for example, is usable as a material for the stretch control portion 39. Examples of the metallic material include copper, aluminum, and stainless steel. Alternatively, as the material used for the stretch control portion 39, any one of the following materials is usable: widely used thermoplastic elastomer, acrylic oligomer or polymer, urethane oligomer or polymer, epoxy oligomer or polymer, polyester oligomer or polymer, vinyl ether oligomer or polymer, polyene/thiol oligomer or polymer, and silicone oligomer or polymer. Alternatively, as the material of the stretch control portion 39, the same material as that of the first member 35 of the first region 31 is usable. The thickness of the stretch control portion 39 is, for example, greater than or equal to 1 μm and less than or equal to 100 μm.

However, the modulus of elasticity of the stretch control portion 39 may be less than or equal to the modulus of elasticity of the second region 32. For example, the modulus of elasticity of the stretch control portion 39 may be less than or equal to 10 MPa and may be less than or equal to 1 MPa. The modulus of elasticity of the stretch control portion 39 may be less than or equal to 1 times the elastic modulus of the second region 32 or may be less than or equal to 0.8 times the elastic modulus of the second region 32. In this case, as compared with the case where the second elastic modulus of the stretch control portion 39 is greater than the modulus of elasticity of the second region 32, the amplitude of the undulating portion that appears in the interconnection wire 52 overlapping the second region 32 is increased and, thus, the stretchability of the wiring board 10 is increased. Even when the modulus of elasticity of the stretch control portion 39 is less than or equal to that of the second region 32, a difference in stretchability is generated between part of the stretchable portion 20 that overlaps the stretch control portion 39 and part of the stretchable portion 20 that does not overlap the stretch control portion 39. That is, the stretchable portion 20 can be partitioned into part that is easily stretched and contracted and part that is not easily stretched and contracted. As a result, the cycle and amplitude, for example, of the undulating portion that appears in the interconnection wire 52 overlapping the stretchable portion 20 can be controlled.

If the second modulus of elasticity of the stretch control portion 39 is less than or equal to the modulus of elasticity of the second region 32, widely used thermoplastic elastomer and thermosetting elastomer are usable as the material of the stretch control portion 39. Examples of the material include styrene elastomer, acrylic elastomer, olefinic elastomer, urethane elastomer, silicone rubber, urethane rubber, fluorine-contained rubber, nitrile rubber, polybutadiene, and polychloroprene. The thickness of the stretch control portion 39 is, for example, greater than or equal to 1 μm and less than or equal to 100 μm.

Figure 13:
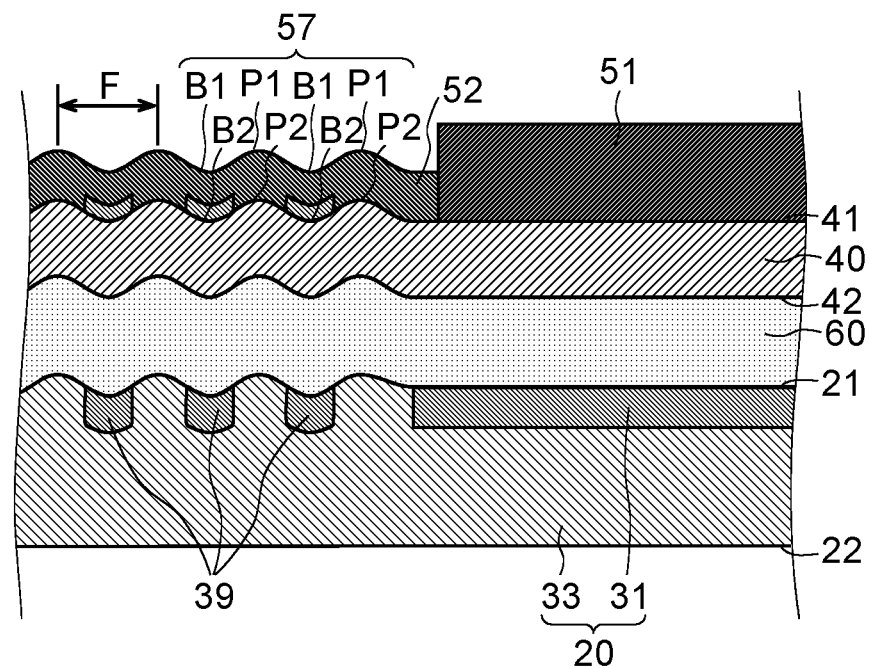
FIG. 13 is an enlarged cross-sectional view illustrating an example of an interconnection wire and its surrounding constituent elements in the wiring board according to the first modification.

FIG. 13 is an enlarged cross-sectional view illustrating an example of the interconnection wire 52, such as the first interconnection wire 521 and second interconnection wire 522, and its surrounding constituent elements. According to the present modification, the second region 32 of the stretchable portion 20 can be partitioned into a portion that is likely to stretch and contract and a portion that is less likely to stretch and contract in the direction in which the second region 32 extends. In this case, when the second region 32 is relaxed, the undulating portion 57 having a cycle F corresponding to the cycle of the stretch control portion 39 is easily generated in the interconnection wire 52, as illustrated in FIG. 13. That is, the cycle F of the undulating portion 57 can be controlled by the stretch control portion 39.

(Second Modification)

Figure 14:
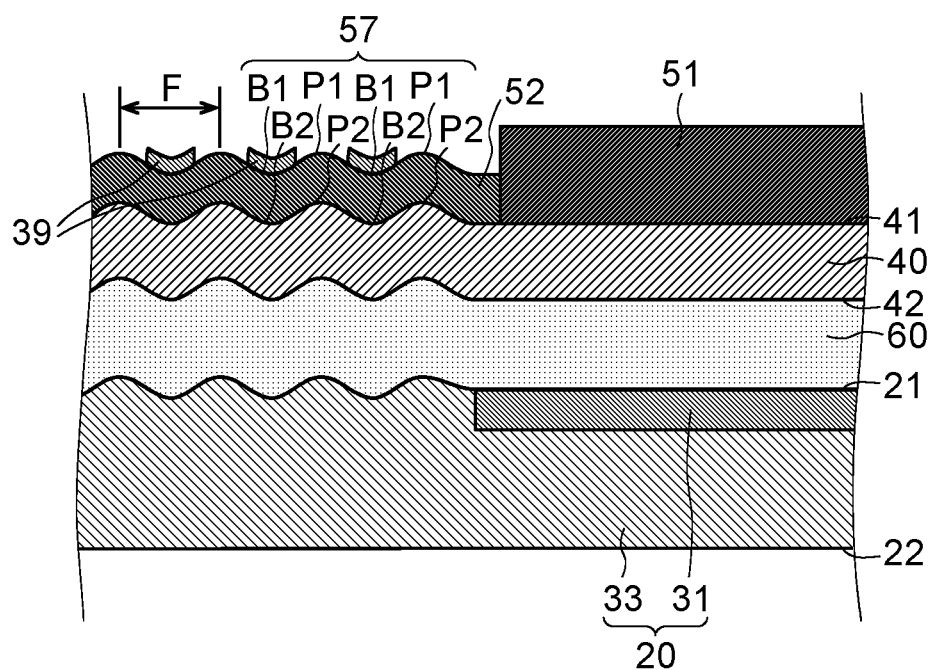
FIG. 14 is a cross-sectional view of a wiring board according to a second modification.

While the first modification has been described with reference to the example of the stretch control portion 39 being part of the stretchable portion 20, the structure and the location of the stretch control portion 39 are not limited thereto. For example, as illustrated in FIG. 14, the plurality of stretch control portions 39 may be provided on the interconnection wire 52.

(Third Modification)

Figure 15A:
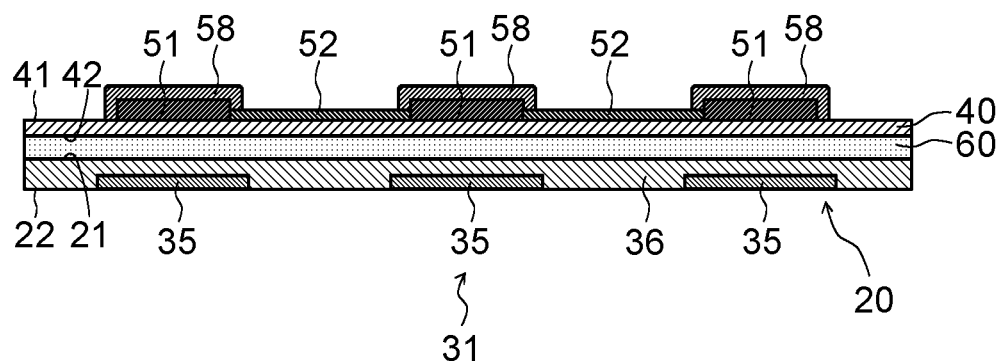
FIG. 15A is a cross-sectional view of an example of a wiring board according to a third modification.
Figure 15B:
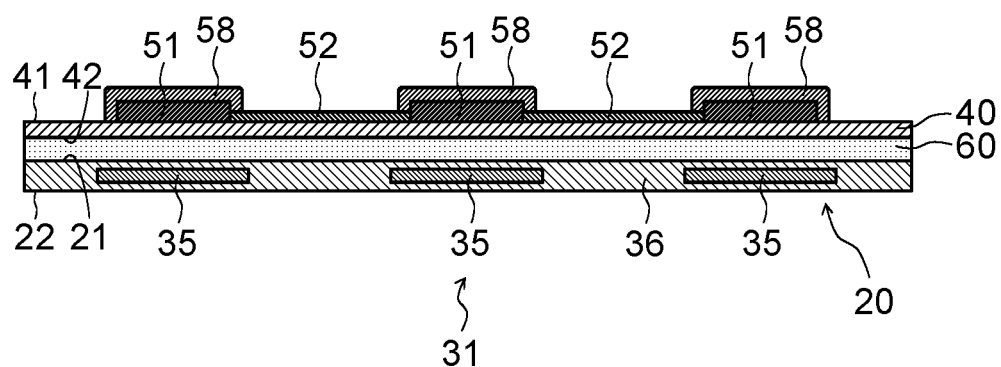
FIG. 15B is a cross-sectional view of an example of a wiring board according to the third modification.
Figure 15C:
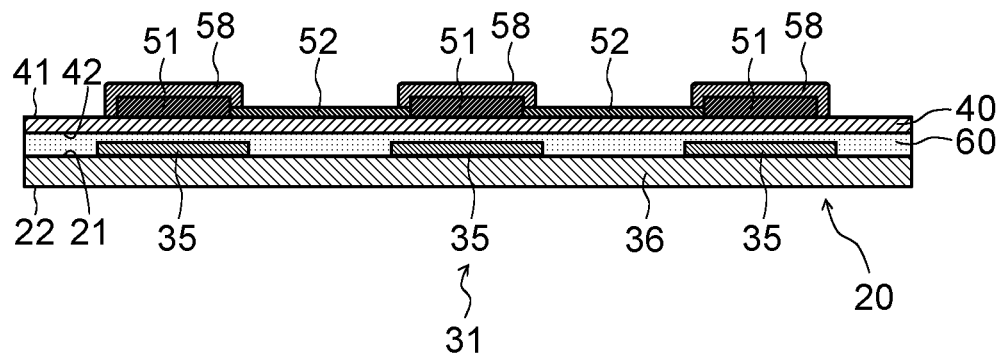
FIG. 15C is a cross-sectional view of an example of a wiring board according to the third modification.
Figure 15D:
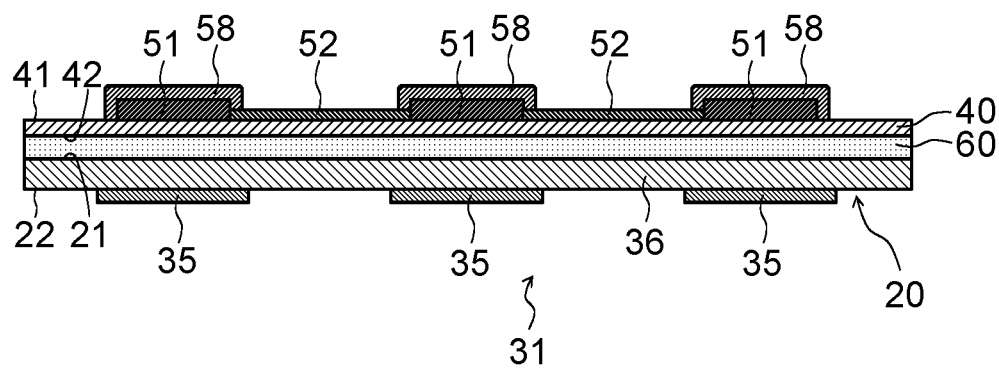
FIG. 15D is a cross-sectional view of an example of a wiring board according to the third modification.

While the embodiment and the modifications above have been described with reference to the example in which the first member 35 included in the first region 31 of the stretchable portion 20 partially constitutes the first surface 21 of the stretchable portion 20, the structure is not limited thereto. As illustrated in FIG. 15A, the first member 35 included in the first region 31 of the stretchable portion 20 may be disposed so as to partially constitute the second surface 22 of the stretchable portion 20. Alternatively, as illustrated in FIG. 15B, the first member 35 included in the first region 31 of the stretchable portion 20 may be disposed so as to appear on neither the first surface 21 nor the second surface 22 of the stretchable portion 20. In addition, although not illustrated, the first member 35 included in the first region 31 of the stretchable portion 20 may extend throughout the entire thickness of the stretchable portion 20, from the first surface 21 to the second surface 22 of the stretchable portion 20. The first member 35 included in the first region 31 of the stretchable portion 20 may be disposed on a surface of the second member 36. For example, as illustrated in FIG. 15C, the first member 35 included in the first region 31 of the stretchable portion 20 may be disposed on the surface of the second member 36 adjacent to the interconnection wire 52 and may be in contact with the adhesive layer 60 in the in-plane direction of the wiring board 10. In this case, as illustrated in FIG. 15C, the surface of the first member 35 adjacent to the interconnection wire 52 may be covered by the adhesive layer 60 or, although not illustrated, may be in contact with the second surface 42 of the support portion 40. In addition, as illustrated in FIG. 15D, the first member 35 included in the first region 31 of the stretchable portion 20 may be disposed on a surface of the second member 36 remote from the interconnection wire 52.

Figure 15E:
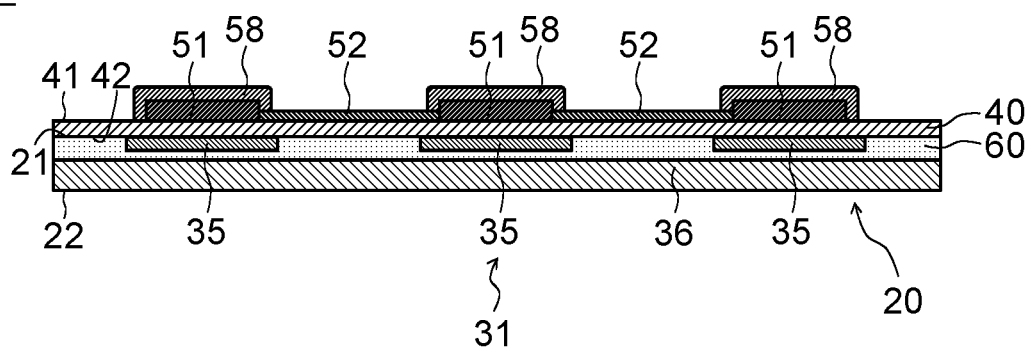
FIG. 15E is a cross-sectional view of an example of a wiring board according to the third modification.

In addition, as illustrated in FIG. 15E, the first member 35 of the first region 31 may be located closer to the interconnection wire 52 than a surface of the second members 36 adjacent to the interconnection wire 52 and may be in contact with the adhesive layer 60 in the in-plane direction of the wiring board 10. In this case, the adhesive layer 60 is thought to be a constituent element of the stretchable portion 20. In the example illustrated in FIG. 15E, the stretchable portion 20 includes the second member 36, the adhesive layer 60 located on a surface of the second member 36 adjacent to the interconnection wire 52, and the first members 35 disposed in the adhesive layer 60 at positions each corresponding to one of the first regions 31.

Figure 16:
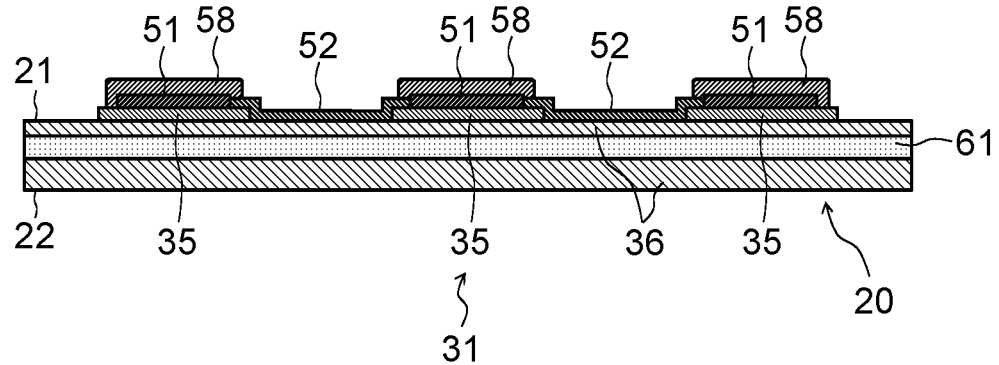
FIG. 16 is a cross-sectional view of an example of a wiring board according to the third modification.

In addition, as illustrated in FIG. 16, the stretchable portion 20 may include two stacked second members 36. In this case, of the two second members 36, the second member 36 located adjacent to the interconnection wire 52 may be provided with the first member 35 having a higher modulus of elasticity than the second member 36. As long as the two second members 36 all have a lower modulus of elasticity than the first member 35, the modulus of elasticity of the two second members 36 may be set to any value. In the example illustrated in FIG. 16, the interconnection wire 52 is provided on the second member 36 located adjacent to the interconnection wire 52. An adhesive layer 61 and the like may be interposed between the two second members 36.

(Fourth Modification)

Figure 17:
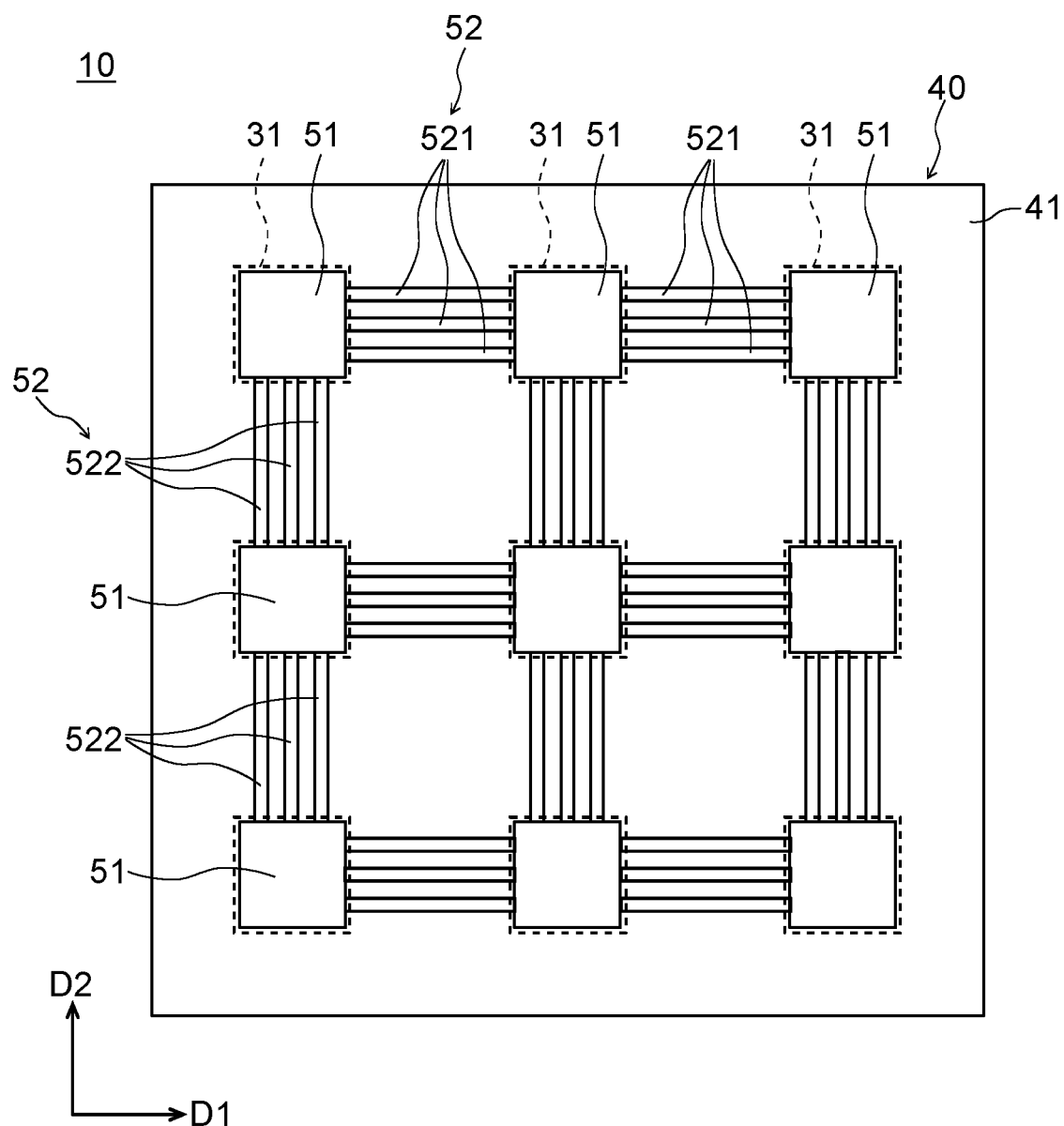
FIG. 17 is a plan view of a wiring board according to a fourth modification.

FIG. 17 is a plan view of a wiring board 10 according to the present modification. As illustrated in FIG. 17, a plurality of interconnection wires 52 may be provided between two neighboring electronic components 51 in the first direction D1 or the second direction D2 so as to extend from one of the electronic components 51 to the other. In this case, it is desirable that the plurality of the interconnection wires 52 be all disposed so as to overlap the second region 32 of the stretchable portion 20 when viewed in the direction normal to the first surface 21 of the stretchable portion 20.

(Fifth Modification)

Figure 18:
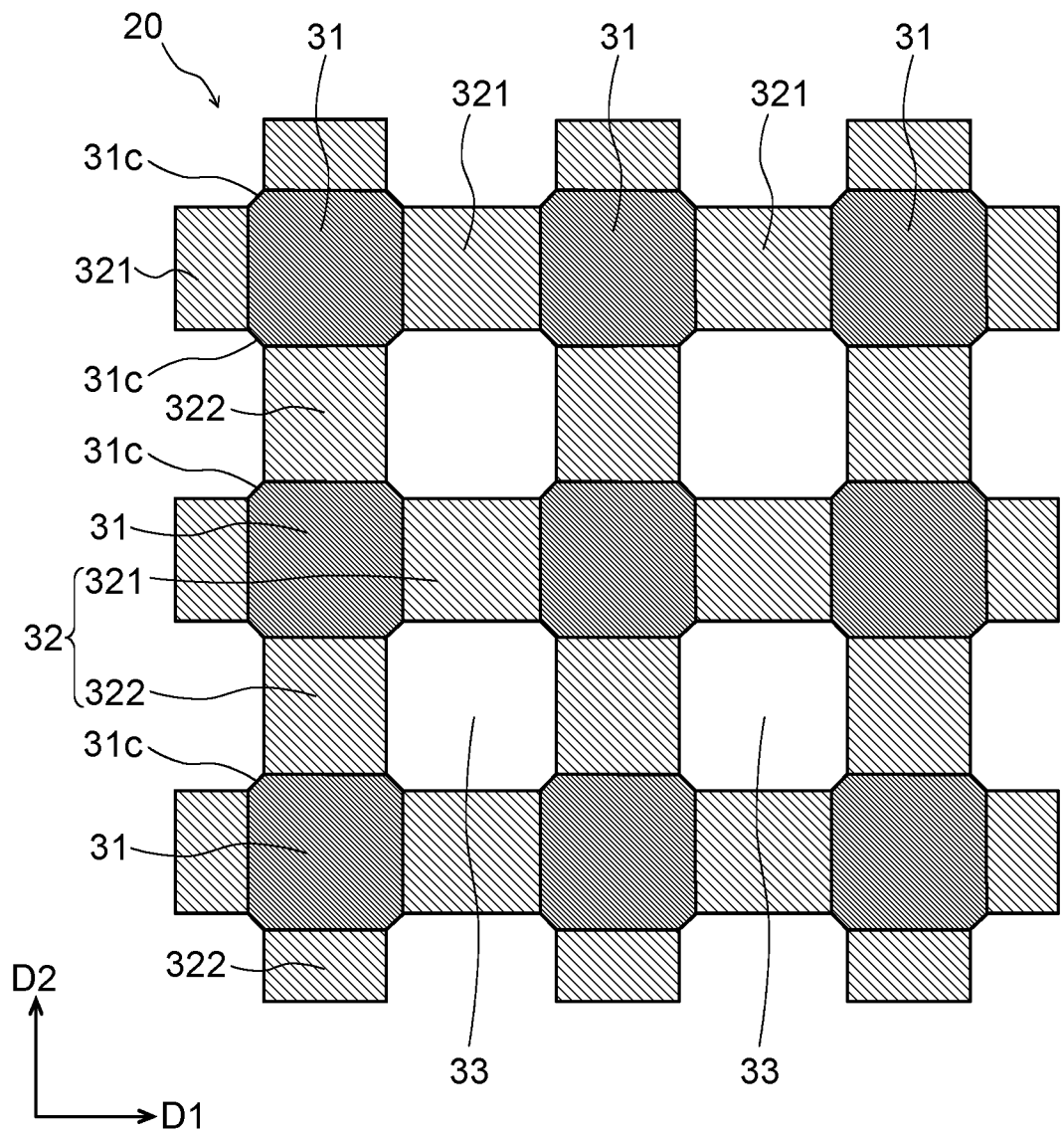
FIG. 18 is a plan view of a stretchable portion of a wiring board according to the fifth modification.

FIG. 18 is a plan view of the stretchable portion 20 of the wiring board 10 according to the present modification. As illustrated in FIG. 18, each of corners 31c of the first region 31 may include a portion that extends in a direction that is inclined to both the first direction D1 and second direction D2.

(Sixth Modification)

Figure 19:
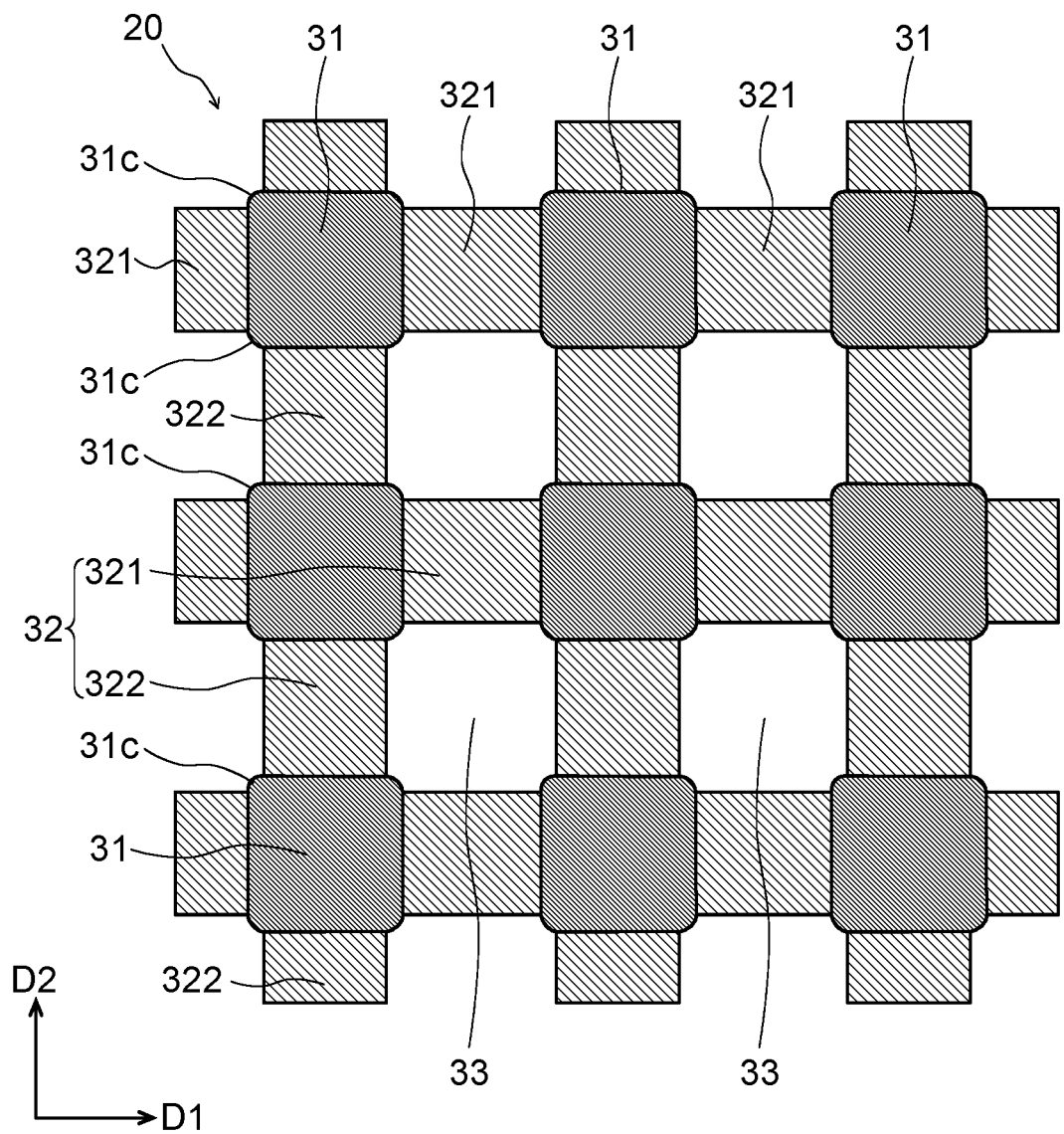
FIG. 19 is a plan view of a stretchable portion of a wiring board according to a sixth modification.

FIG. 19 is a plan view of the stretchable portion 20 of the wiring board 10 according to the present modification. As illustrated in FIG. 19, a corner 31c of the first region 31 may include a curved shape.

(Seventh Modification)

Figure 20:
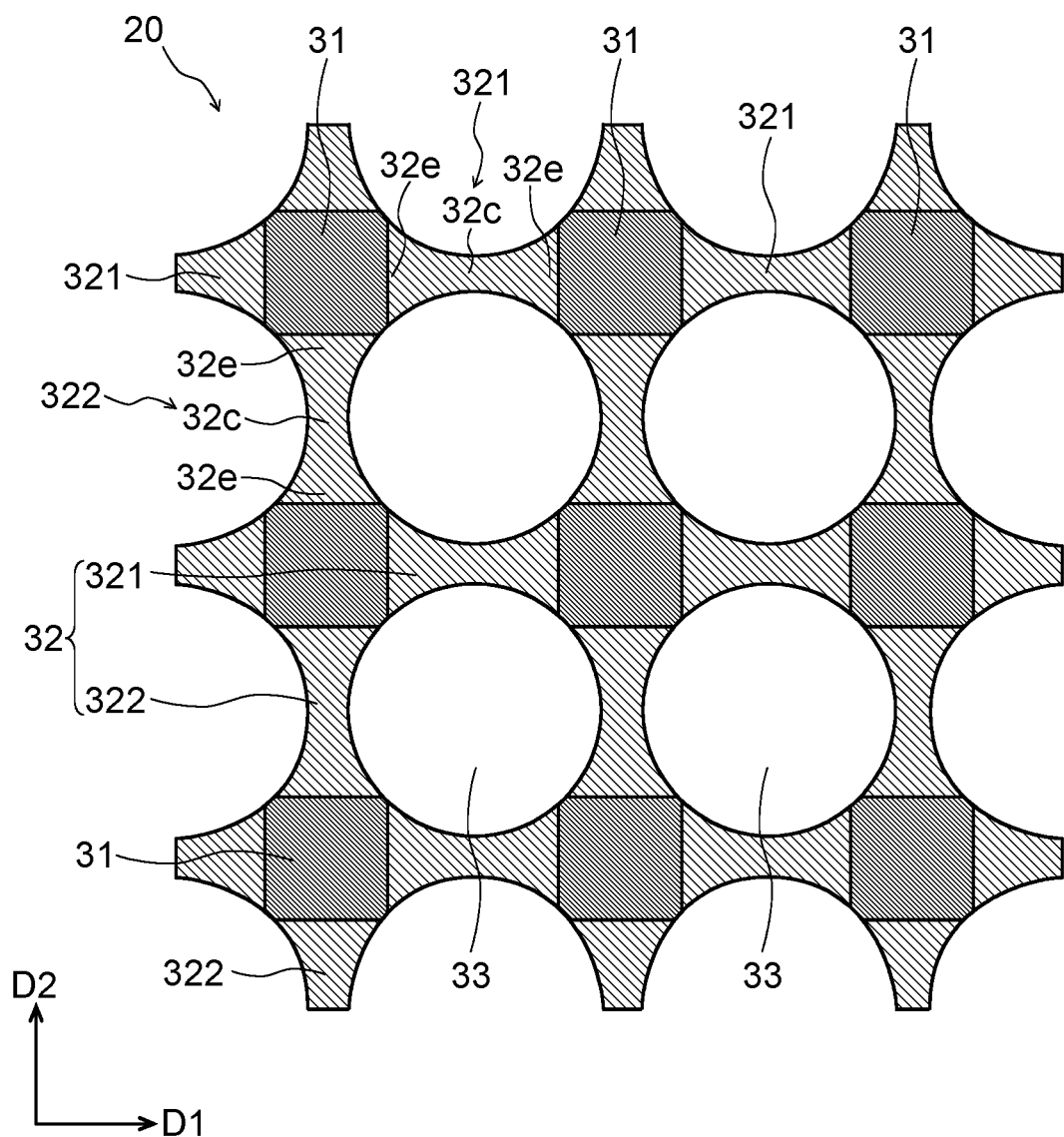
FIG. 20 is a plan view of a stretchable portion of a wiring board according to a seventh modification.

FIG. 20 is a plan view of the stretchable portion 20 of the wiring board 10 according to the present modification. As illustrated in FIG. 20, the third region 33 surrounded by the plurality of second regions 32 may have a shape that is at least partially curved. For example, the third region 33 may have a circular shape. In this case, the second region 32 may include a pair of end portions 32e each in contact with one of the first regions 31 and a central portion 32c located between the pair of end portions 32e, and the width of the central portion 32c may be less than the width of the end portion 32e. For example, the first portion 321 of the second region 32 includes a pair of end portions 32e each in contact with one of two first regions 31 lined up in the first direction D1 and a central portion 32c located between the pair of end portions 32e. In the second direction D2 orthogonal to the first direction D1, the dimension of the central portion 32c of the first portion 321 is less than the dimension of the end portion 32e of the first portion 321.

(Eighth Modification)

Figure 21:
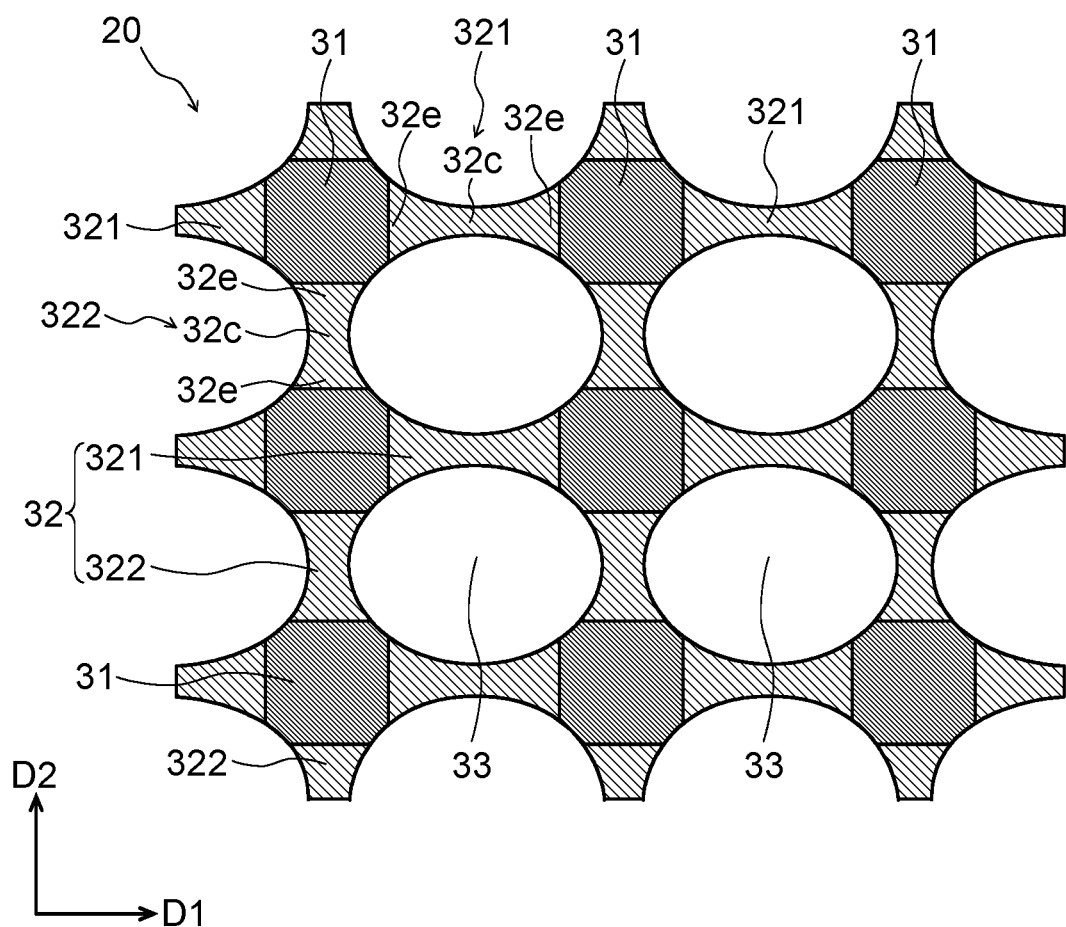
FIG. 21 is a plan view of a stretchable portion of a wiring board according to an eighth modification.

FIG. 21 is a plan view of a stretchable portion 20 of the wiring board 10 according to the present modification. As illustrated in FIG. 21, the third region 33 surrounded by the plurality of second regions 32 may have an elliptical shape. In the example illustrated in FIG. 21, the elliptical third region 33 has a major axis parallel to the first direction D1 and a minor axis parallel to the second direction D2.

Like the seventh modification, according to the present modification, the second region 32 includes a pair of end portions 32e each in contact with one of the first regions 31 and a central portion 32c located between the pair of end portions 32e, and the width of the central portion 32c may be less than the width of the end portion 32e.

(Ninth Modification)

Figure 22:
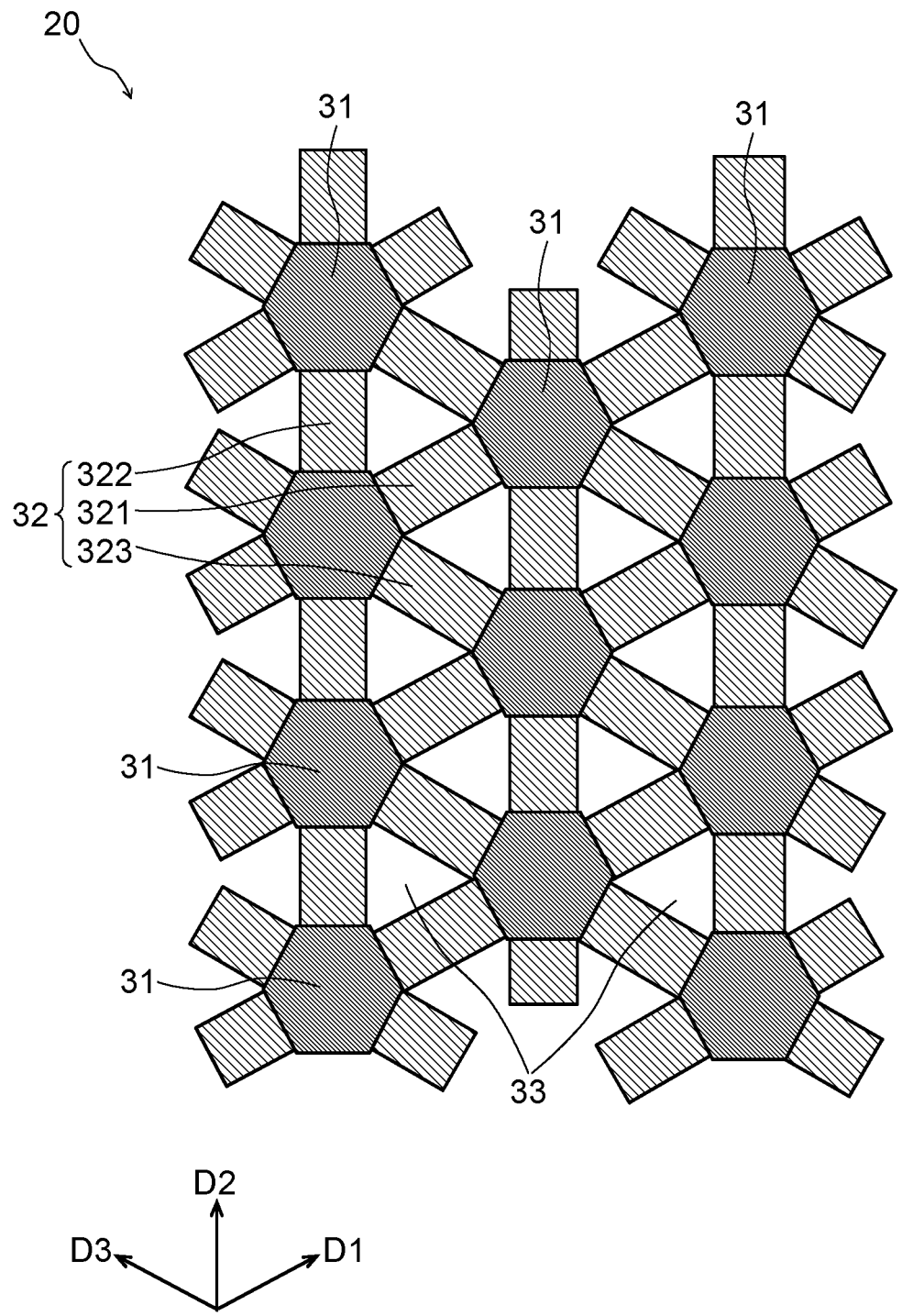
FIG. 22 is a plan view of a stretchable portion of a wiring board according to a ninth modification.

FIG. 22 is a plan view illustrating an example of a stretchable portion 20 of a wiring board 10 according to the present modification. As illustrated in FIG. 22, a plurality of first regions 31 of the stretchable portion 20 are lined up in each of a first direction D1, a second direction D2, and a third direction D3. The first direction D1, the second direction D2, and the third direction D3 are different directions from one another. In the example illustrated in FIG. 22, the angle formed by the first direction D1 and the second direction D2 and the angle formed by the second direction D2 and the third direction D3 are each 60 degrees. In the example illustrated in FIG. 22, the first region 31 has a hexagonal shape with six sides and six corners.

As illustrated in FIG. 22, the plurality of second regions 32 of the stretchable portion 20 include a first portions 321 each extending from one of two neighboring first regions 31 to the other in the first direction D1, a second portions 322 each extending from one of two neighboring first regions 31 to the other in the second direction D2, and a third portions 323 each extending from one of two neighboring first regions 31 to the other in the third direction D3. In the example illustrated in FIG. 22, one end of the second region 32 is connected to one side of a hexagonal shape of one of the two neighboring first regions 31, and the other end of the second region 32 is connected to one side of a hexagon shape of the other of the first regions 31. In the example illustrated in FIG. 22, the third region 33 surrounded by the plurality of second regions 32 has a triangular shape.

Although not illustrated, according to the present modification, the interconnection wires 52 may include a first interconnection wire extending in the first direction D1 so as to overlap the first portion 321 of the second region 32, a second interconnection wire extending in the second direction D2 so as to overlap the second portion 322 of the second region 32, and a third interconnection wire extending in the third direction D3 so as to overlap the third portion 323 of the second region 32.

(Tenth Modification)

Figure 23:
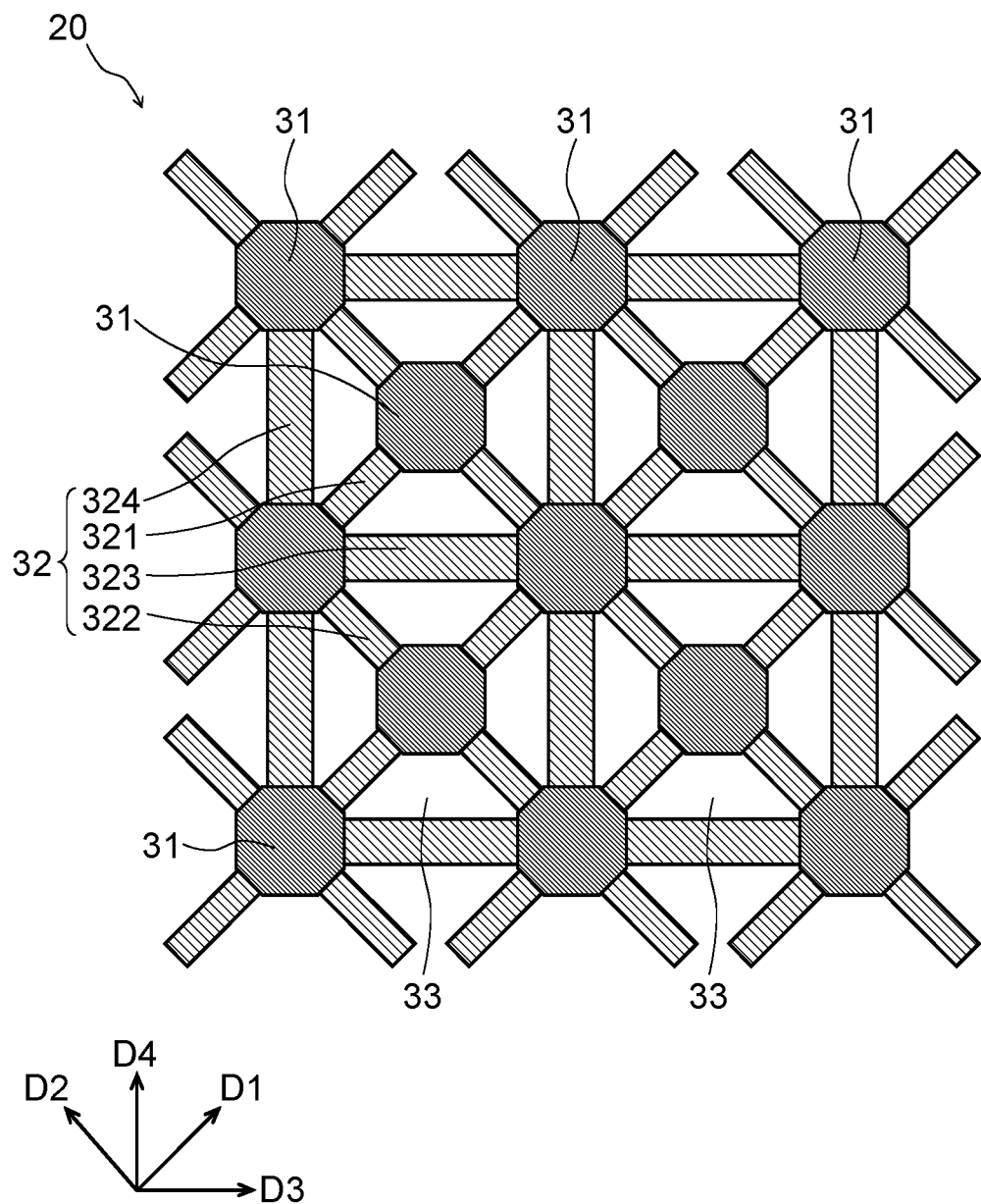
FIG. 23 is a plan view of a stretchable portion of a wiring board according to a tenth modification.

FIG. 23 is a plan view illustrating an example of a stretchable portion 20 of a wiring board 10 according to the present modification. As illustrated in FIG. 23, the plurality of first regions 31 of the stretchable portion 20 are lined up in each of a first direction D1, a second direction D2, a third direction D3, and a fourth direction D4. The first direction D1, the second direction D2, the third direction D3 and the fourth direction D4 are different directions from one another. In the example illustrated in FIG. 23, the angle formed by the first direction D1 and the second direction D2 and the angle formed by the third direction D3 and the fourth direction D4 are each 90 degrees. In addition, the angle formed by the first direction D1 and the third direction D3 and the angle formed by the second direction D2 and the fourth direction D4 are each 45 degrees. The first region 31 has an octagonal shape with eight sides and eight corners. Each of the spacing between two neighboring first regions 31 in the first direction D1 and the spacing between two neighboring first regions 31 in the second direction D2 is smaller than each of the spacing between two neighboring first regions 31 in the third direction D3 and the spacing between two neighboring first regions 31 in the fourth direction D4.

As illustrated in FIG. 23, the plurality of second regions 32 of the stretchable portion 20 include first portions 321 each extending from one of two neighboring first regions 31 to the other in the first direction D1, second portions 322 each extending from one of two neighboring first regions 31 to the other in the second direction D2, third portions 323 each extending from one of two neighboring first regions 31 to the other in the third direction D3, and fourth portions 324 each extending from one of two neighboring first regions 31 to the other in the fourth direction D4.

In the example illustrated in FIG. 23, one end of the second region 32 is connected to one side of an octagonal shape of one of two neighboring first regions 31, and the other end is connected to one side of an octagonal shape of the other first region 31. Each of the length of the first portion 321 and the length of the second portion 322 is less than each of the length of the third portion 323 and the length of the fourth portion 324. In addition, for one of two neighboring first regions 31 in each of the first and second directions D1 and D2, two first portions 321, two second portions 322, two third portions 323, and two fourth portions 324 are connected to the eight sides of the octagonal shape. For the other of the two neighboring first regions 31 in each of the first and second directions D1 and D2, two first portions 321 and two second portions 322 are connected to four of the eight sides of the octagonal shape. However, the third portion 323 and the fourth portion 324 are not connected.

Although not illustrated, according to the present modification, the interconnection wires 52 may include a first interconnection wire extending in the first direction D1 so as to overlap the first portion 321 of the second region 32, a second interconnection wire extending in the second direction D2 so as to overlap the second portion 322 of the second region 32, a third interconnection wire extending in the third direction D3 so as to overlap the third portion 323 of the second region 32, and a fourth interconnection wire extending in the fourth direction D4 so as to overlap the fourth portion 324 of the second region 32.

(Eleventh Modification)

Figure 24:
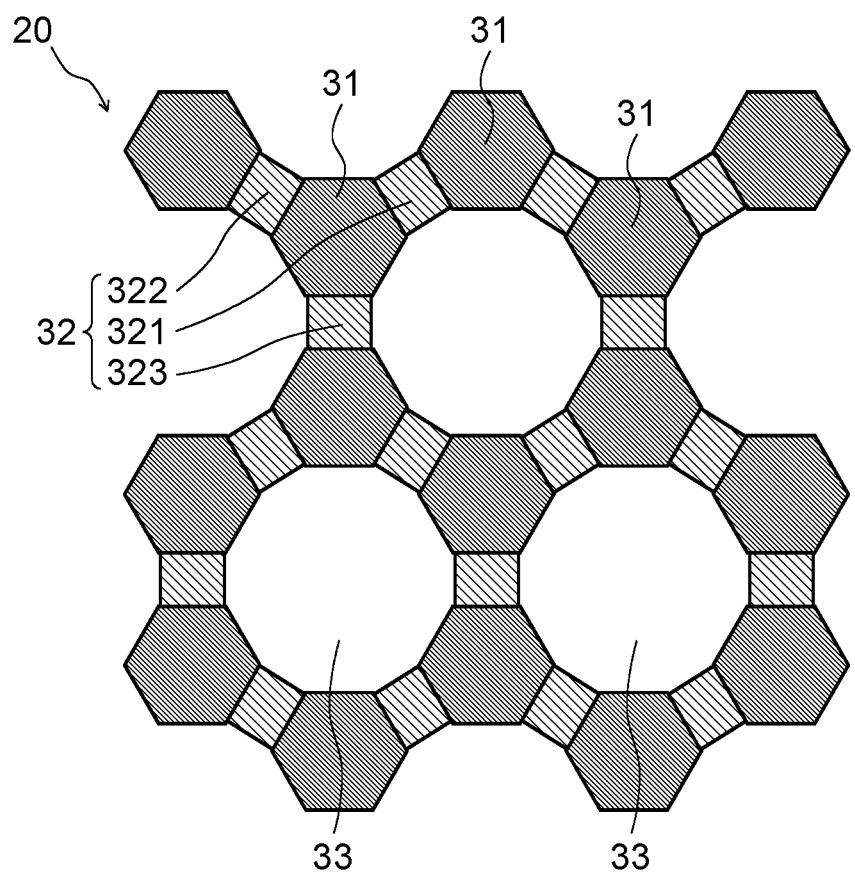
FIG. 24 is a plan view of a stretchable portion of a wiring board according to an eleventh modification.
Figure 24:
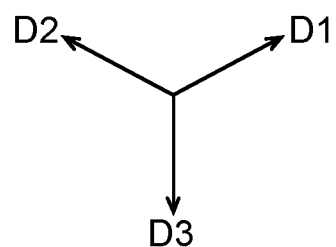

FIG. 24 is a plan view illustrating an example of a stretchable portion 20 of a wiring board 10 according to the present modification. As illustrated in FIG. 24, one first region 31 is surrounded by three other neighboring first regions 31. A first one of the three first regions 31 neighbors the first region 31 in the first direction D1, the second one neighbors the first region 31 in the second direction D2, and the third one neighbors the first region 31 in the third direction D3. In the example illustrated in FIG. 24, the angle formed by the first direction D1 and the second direction D2, the angle formed by the second direction D2 and the third direction D3, and the angle formed by the third direction D3 and the first direction D1 are each 120 degrees. The first region 31 has a hexagonal shape with six sides and six corners.

As illustrated in FIG. 24, a plurality of second regions 32 of the stretchable portion 20 include first portions 321 each extending from one of two neighboring first regions 31 to the other in the first direction D1, second portions 322 each extending from one of two neighboring first regions 31 to the other in the second direction D2, and third portions 323 each extending from one of two neighboring first regions 31 to the other in the third direction D3.

In the example illustrated in FIG. 23, one end of the second region 32 is connected to one side of a hexagon shape of one of two neighboring first regions 31, and the other end is connected to one side of a hexagon shape of the other first region 31. In the first region 31, one first portion 321, one second portion 322, and one third portion 323 are connected to three of the six sides of the hexagonal shape.

Although not illustrated, according to the present modification, the interconnection wires 52 may include a first interconnection wire extending in the first direction D1 so as to overlap the first portion 321 of the second region 32, a second interconnection wire extending in the second direction D2 so as to overlap the second portion 322 of the second region 32, and a third interconnection wire extending in the third direction D3 so as to overlap the third portion 323 of the second region 32.

(Twelfth Modification)

Figure 25:
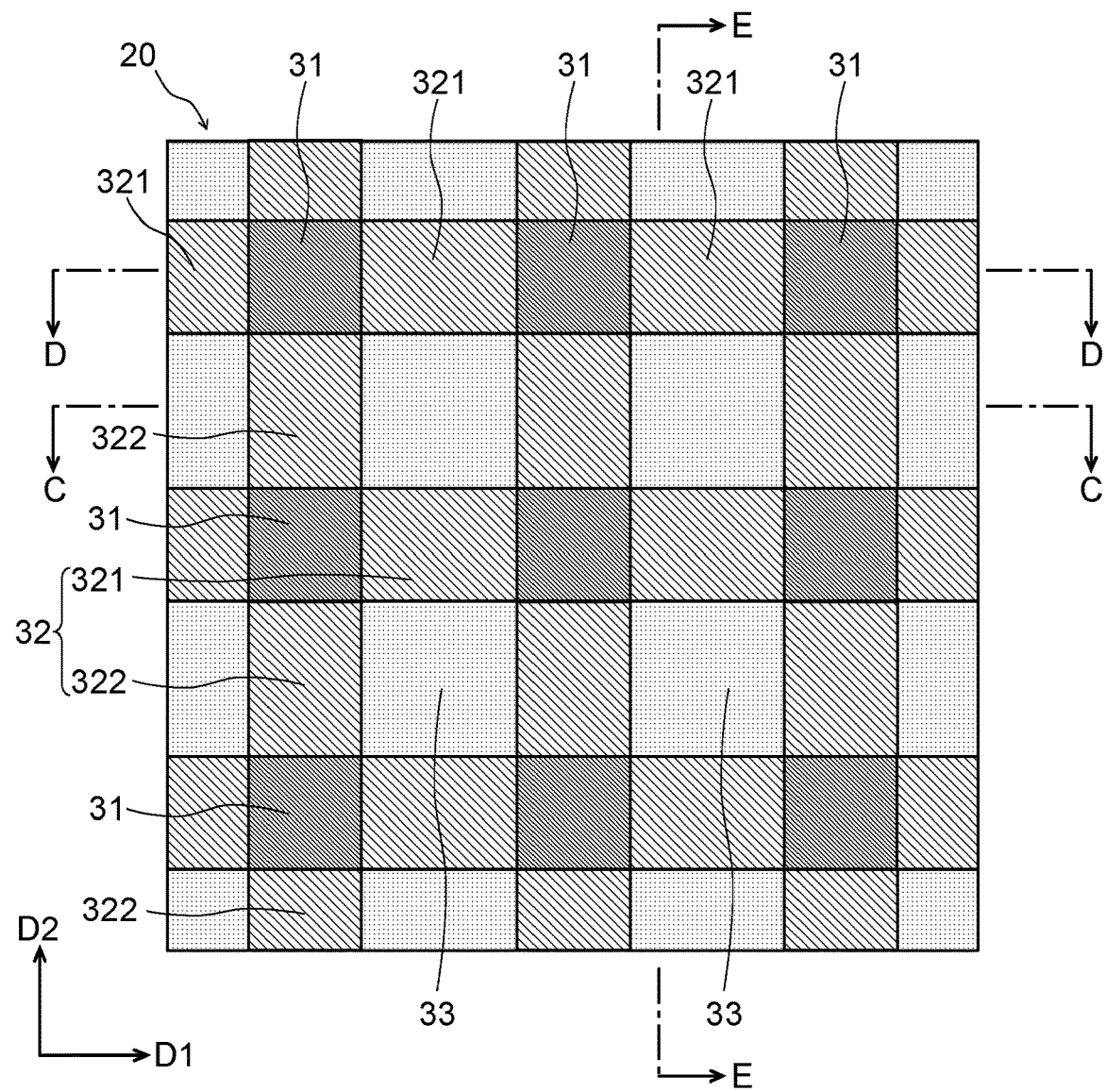
FIG. 25 is a plan view of a stretchable portion of a wiring board according to a twelfth modification.
Figure 26:
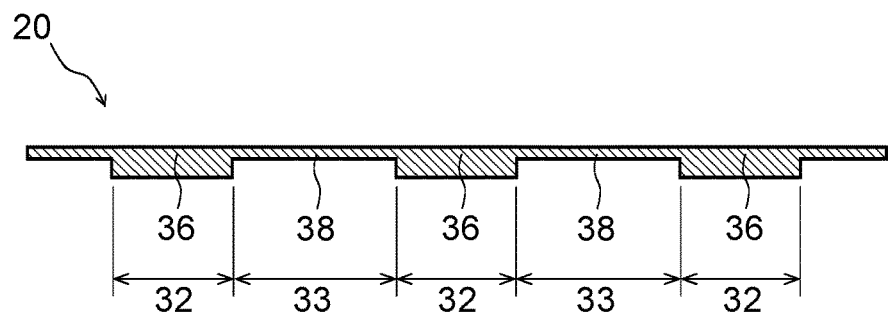
FIG. 26 is a cross-sectional view of the stretchable portion of the wiring board according to the twelfth modification.

According to the above-described embodiment and each of the modifications, an example has been described in which the third region 33 of the stretchable portion 20 includes the hole 37 that penetrates the stretchable portion 20. However, the structure of the third region 33 is not particularly limited provided that the stress generated in the first portion 321 can be suppressed from being transferred to the second portion 322 and, in addition, the stress generated in the second portion 322 can be suppressed from being transferred to the first portion 321. For example, as illustrated in FIG. 25, the third region 33 may include a third member 38. FIG. 26 is a cross-sectional view of the stretchable portion 20 taken along line C-C of FIG. 25. The third region 33 including the third member 38 has a lower bending stiffness than the second region 32. For example, the third member 38 of the third region 33 is a member that is integrated into the second member 36 by using the same material as the second member 36 and that has a smaller thickness than the second member 36.

(Thirteenth Modification)

The twelfth modification above has been described with reference to an example in which the third member 38 of the third region 33 has a smaller thickness than the second member 36 of the second region 32. However, in the wiring board 10 provided with the stretchable portion 20, the second region 32 and the third region 33 of the stretchable portion 20 may have any configuration, provided that the portion that overlaps the second region 32 has a higher bending stiffness than the portion that overlaps the third region. For example, the third member 38 of the third region 33 is a member that is integrated into the second member 36 by using the same material as the second member 36 and that has the same thickness as the second member 36.

Figure 27:
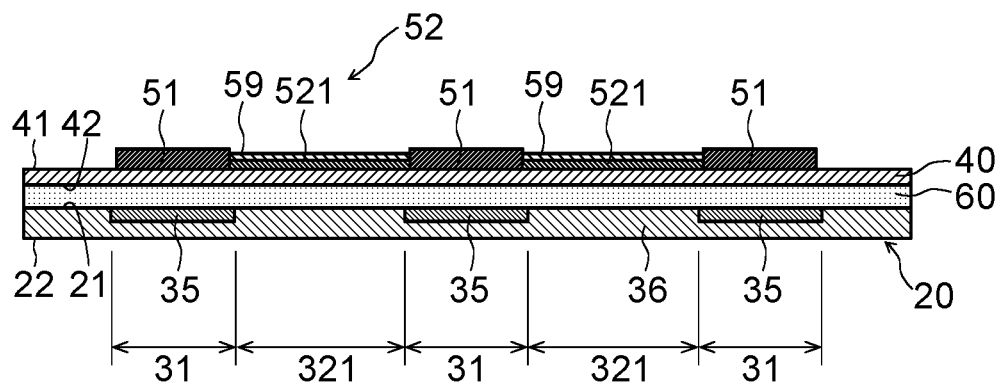
FIG. 27 is a cross-sectional view of a stretchable portion of a wiring board according to a thirteenth modification.
Figure 28:
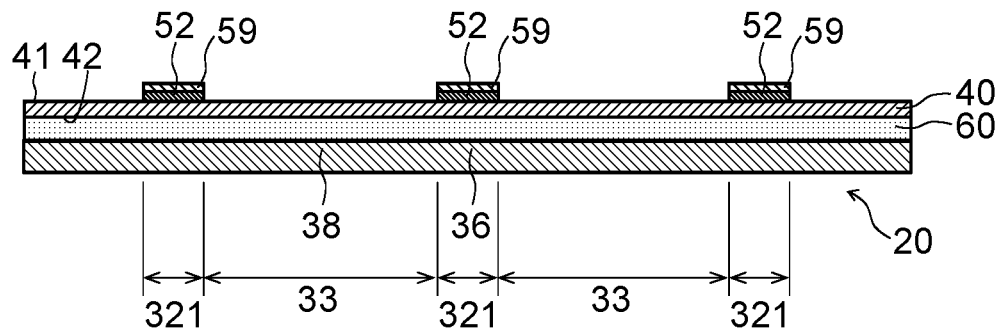
FIG. 28 is a cross-sectional view of a stretchable portion of a wiring board according to the thirteenth modification.

FIG. 27 is a cross-sectional view of the wiring board 10 including the stretchable portion 20 taken along line D-D of FIG. 25. FIG. 28 is a cross-sectional view of the wiring board 10 including the stretchable portion 20 taken along line E-E of FIG. 25. As illustrated in FIGS. 27 and 28, the third member 38 of the third region 33 is a member that is integrated into the second member 36 by using the same material as the second member 36 and that has the same thickness as the second member 36. In addition, an insulating layer 59 is provided on the interconnection wire 52 that overlaps the first portion 321 of the second region 32. This allows the bending stiffness of a portion of the wiring board 10 that overlaps the second region 32 to be higher than the bending stiffness of a portion of the wiring board 10 that overlaps the third region 33.

Examples of a material used for the insulating layer 59 include widely used thermoplastic elastomer, acrylic oligomer or polymer, urethane oligomer or polymer, epoxy oligomer or polymer, polyester oligomer or polymer, vinyl ether oligomer or polymer, polyene/thiol oligomer or polymer, and silicone oligomer or polymer. The thickness of the insulating layer 59 is, for example, greater than or equal to 1 μm and less than or equal to 100 μm.

(Fourteenth Modification)

The stretching process, in which tensile stress is applied to the stretchable portion 20 to stretch the stretchable portion 20, may be performed with the first region 31 clamped in the thickness direction of the stretchable portion 20. This facilitates stretching of the second region 32 that neighbors the first region 31 in a uniform manner in the stretching process.

(Fifteenth Modification)

Figure 29A:
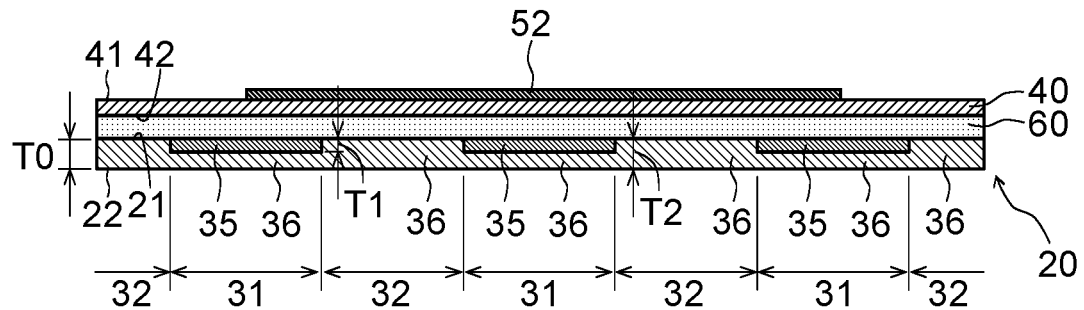
FIG. 29A is a cross-sectional view of a stretchable portion of a wiring board according to a fifteenth modification.
Figure 30:
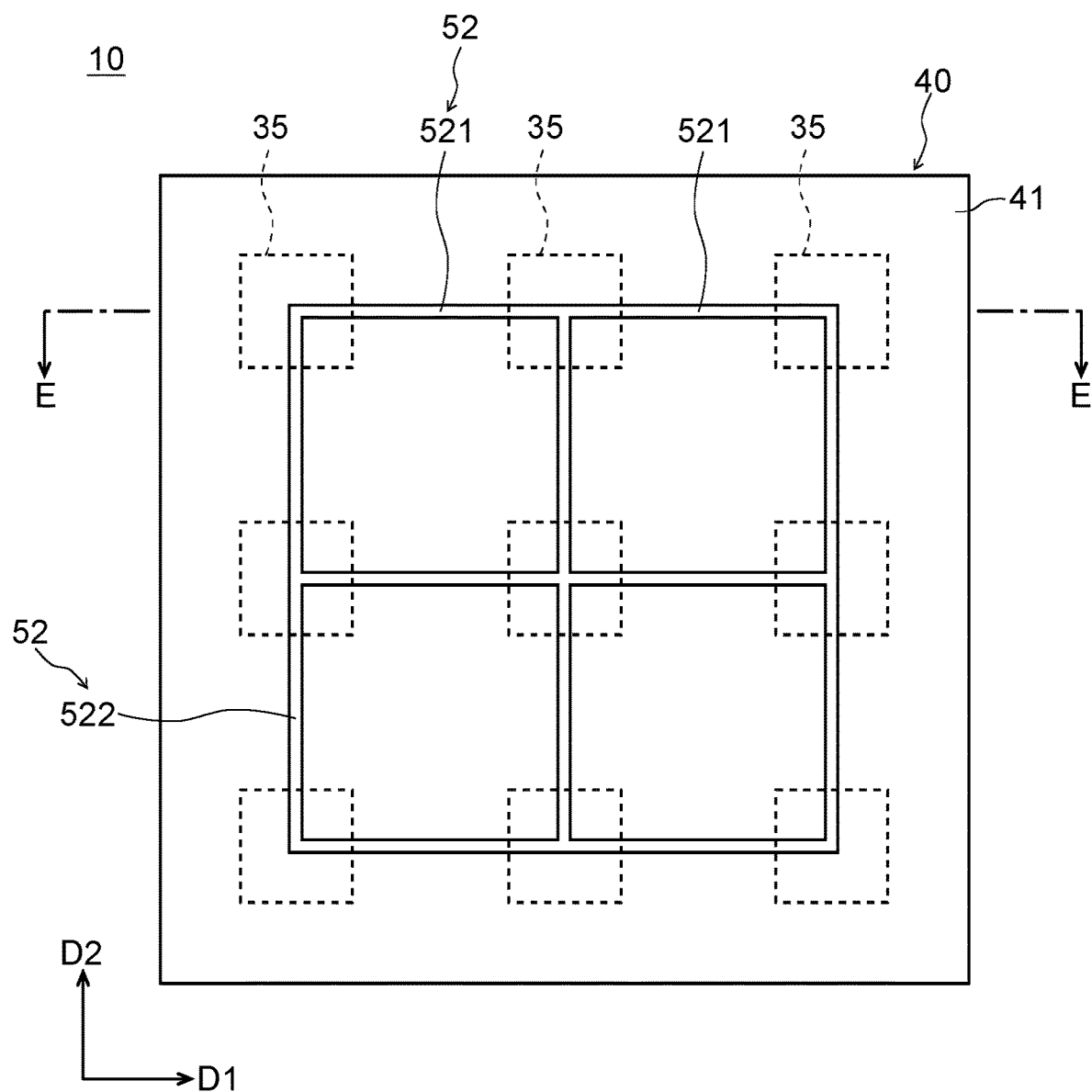
FIG. 30 is a plan view illustrating another example of the wiring board according to the fifteenth modification.

The embodiment and each of the modifications above have been described with reference to an example in which the wiring board 10 has the electronic components 51 mounted on the first surface 21 of the support portion 40. However, the configuration is not limited thereto. The wiring board 10 does not necessarily have to have the electronic components 51. For example, the support portion 40 having no electronic components 51 mounted thereon may be joined to the stretchable portion 20. In addition, the wiring board 10 may be shipped without electronic components 51 mounted therein. Furthermore, the wiring board 10 may be used without the electronic components 51 mounted therein. FIGS. 29A and 30 are a cross-sectional view and a plan view illustrating an example of a wiring board 10 without an electronic component 51 mounted therein. The cross-sectional view illustrated in FIG. 29A is a cutaway view of the wiring board 10 taken along line E-E of FIG. 30.

As illustrated in FIGS. 29A and 30, when an electronic component 51 is not mounted in the wiring board 10, a portion of the wiring board 10 that includes the first member 35 constitutes the first region 31, and a portion of the wiring board 10 that is located between two neighboring first regions 31 and that includes the second member 36 having a lower modulus of elasticity than the first member 35 and does not include the first member 35 constitutes the second region 32. In addition, a portion surrounded by the second regions 32 constitutes the third region 33. In this case, the interconnection wire 52 may be located in both the first region 31 and second region 32. The third region 33 does not have any interconnection wire 52 located therein.

Like the embodiment described above, according to the present modification, since the first portion 321 of the second region 32 of the wiring board 10 contracts mainly in the first direction D1, the undulating portion 57 extending in the first direction D1 is likely to appear in the support portion 40 overlapping the first portion 321 and in the first interconnection wire 521. However, the undulating portion 57 extending in the second direction D2 is less likely to appear in the support portion 40 overlapping the first portion 321 and in the first interconnection wire 521. Similarly, since the second portion 322 of the second region 32 of the wiring board 10 mainly contracts mainly in the second direction D2, the undulating portion 57 extending in the second direction D2 is likely to appear in the support portion 40 overlapping the second portion 322 and the second interconnection wire 522. However, the undulating portion 57 extending in the first direction D1 is less likely to appear in the support portion 40 overlapping the second portion 322 and the second interconnection wire 522. In addition, the undulating portion 57 is less likely to appear in the first region 31 of the wiring board 10. As described above, according to the present embodiment, it is possible to control the direction of the undulating portion 57 that preferentially appears in each of the first interconnection wire 521 and the second interconnection wire 522. As a result, it is possible to control the interference between the undulating portions 57 appearing in different directions. Consequently, it is possible to suppress the amplitude of the undulating portion 57 from being locally increased and suppress the cycle of the undulating portions 57 from being locally disordered.

Figure 29B:
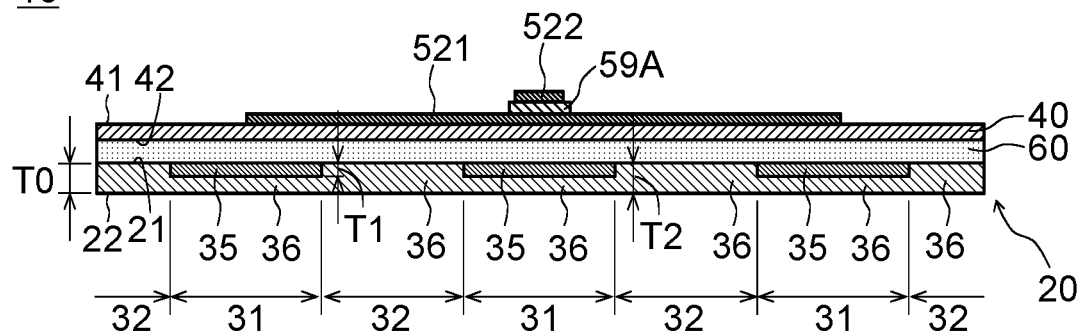
FIG. 29B is a cross-sectional view illustrating another example of the wiring board according to the fifteenth modification.

FIG. 29B is a cross-sectional view illustrating another example of the wiring board 10 according to the present modification. As illustrated in FIG. 29B, in a portion in which the first interconnection wire 521 extending in the first direction D1 and the second interconnection wire 522 extending in the second direction D2 intersect in plan view, an insulating layer 59A may be interposed between the first interconnection wire 521 and the second interconnection wire 522 in the thickness direction of the wiring board 10. This allows the first interconnection wire 521 and the second interconnection wire 522 to intersect with each other in plan view without electrical connection therebetween.

(Sixteenth Modification)

The embodiment and each of the modifications above have been described with reference to an example in which the first region 31, the second region 32, and the third region 33 of the wiring board 10 are defined on the basis of the modulus of elasticity of the electronic component 51 or the stretchable portion 20. However, the structures of the first region 31, the second region 32, and the third region 33 are not particularly limited provided that the first region 31 is more difficult to stretch and contract than the second region 32 and, in addition, the second region 32 is more difficult to stretch and contract than the third region 33. For example, as illustrated in FIGS. 31 to 33, the first region 31 need not include the first member 35.

Figure 31:
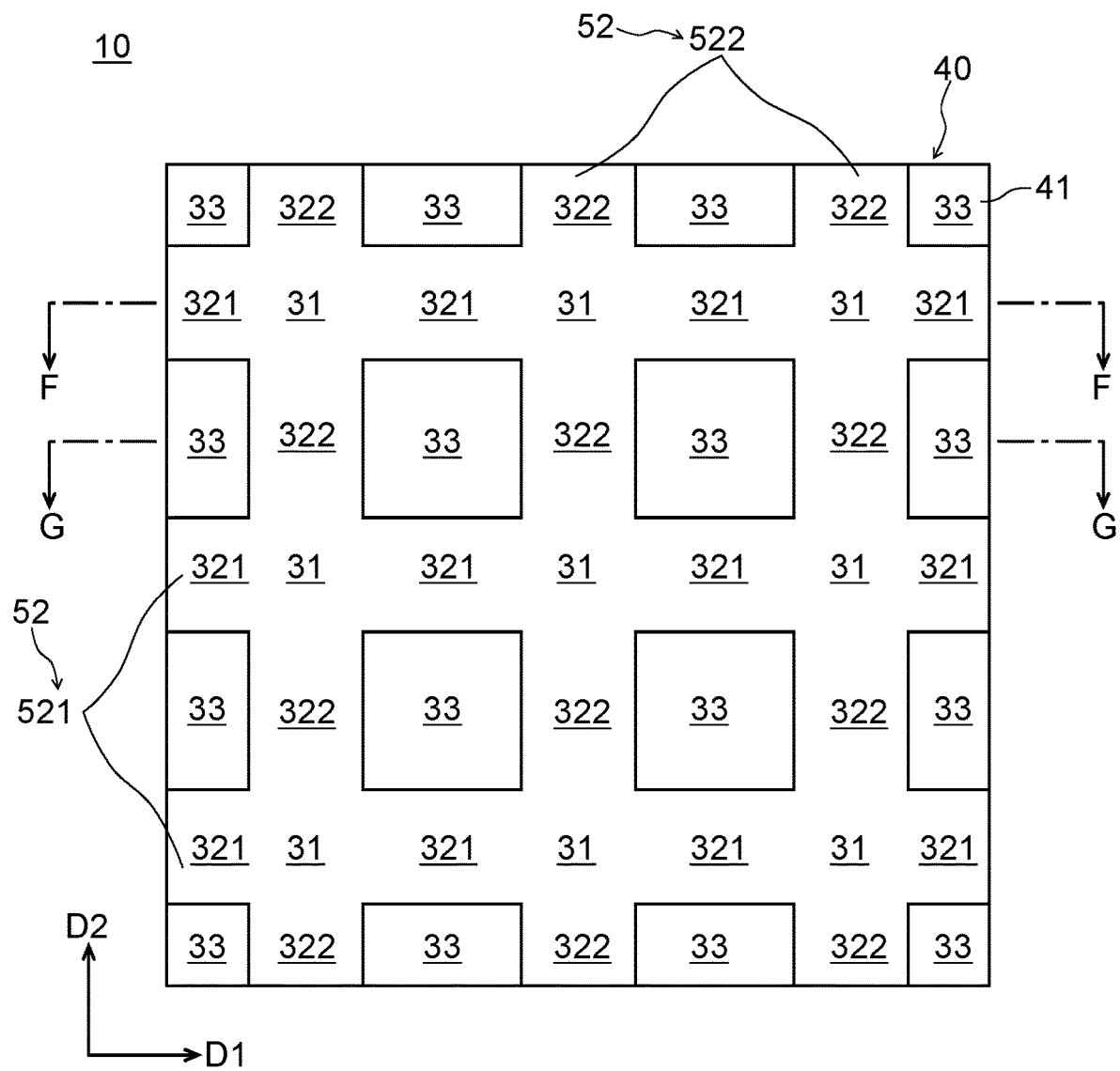
FIG. 31 is a plane section view of a stretchable portion of a wiring board according to a sixteenth modification.
Figure 32:
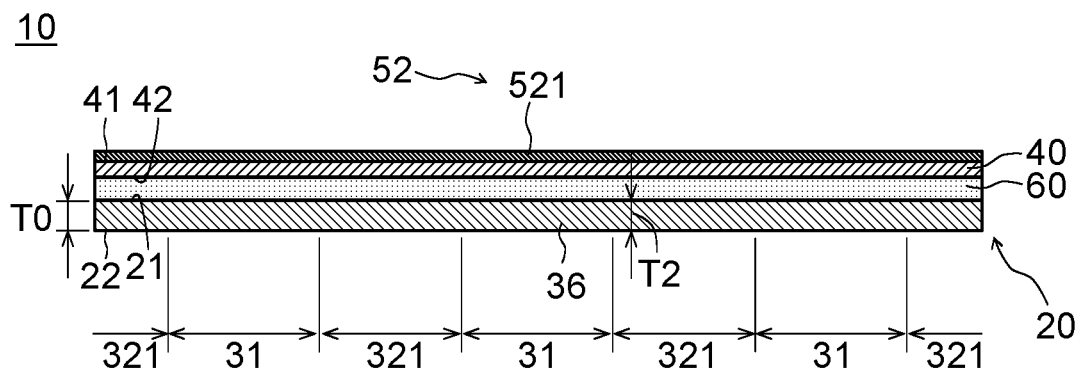
FIG. 32 is a cross-sectional view of the stretchable portion of the wiring board according to the sixteenth modification.

FIG. 31 is a plan view of a wiring board 10 according to the present modification. FIGS. 32 and 33 are cross-sectional views of the wiring board 10 taken along line F-F and line G-G of FIG. 31, respectively. According to the present modification, as illustrated in FIGS. 32 and 33, the stretchable portion 20 is configured by a member having a uniform thickness over the entire area, for example, by the second member 36 described above. The interconnection wire 52 has a plurality of first interconnection wires 521 that are located adjacent to the first surface 21 of the stretchable portion 20 and that extend in the first direction D1 and a plurality of second interconnection wires 522 that are located adjacent to the first surface 21 of the stretchable portion 20 and that extend in the second direction D2 and intersect with the first interconnection wires 521. In this case, the portions of the wiring board 10 in which the first interconnection wire 521 and the second interconnection wire 522 intersect with each other is less likely to stretch and contract than the other portions of the interconnection wire 52. In addition, a portion of the wiring board 10 in which the interconnection wire 52 is present is less likely to stretch and contract than a portion of the wiring board 10 in which the interconnection wire 52 is not present. Therefore, according to the present modification, the region that overlaps the portion of the wiring board 10 in which the first interconnection wire 521 and the second interconnection wire 522 intersect with each other defines the first region 31. In addition, a region of the wiring board 10 that overlaps the first interconnection wire 521 or the second interconnection wire 522 but that is not the intersection of the first interconnection wire 521 and the second interconnection wire 522 defines the second region 32. Furthermore, the portion of the wiring board 10 that overlaps neither the first interconnection wire 521 nor the second interconnection wire 522 defines the third region 33.

Like the above-described embodiment, according to the present modification, since the first portion 321 of the second region 32 of the wiring board 10 contracts mainly in the first direction D1, the undulating portion 57 extending in the first direction D1 is likely to appear in the support portion 40 overlapping the first portion 321 and in the first interconnection wire 521. However, the undulating portion 57 extending in the second direction D2 is less likely to appear in the support portion 40 overlapping the first portion 321 and in the first interconnection wire 521. Similarly, since the second portion 322 of the second region 32 of the wiring board 10 contracts mainly in the second direction D2, the undulating portion 57 extending in the second direction D2 is likely to appear in the support portion 40 overlapping the second portion 322 and in the second interconnection wire 522. However, the undulating portion 57 extending in the first direction D1 is less likely to appear in the support portion 40 overlapping the second portion 322 and in the second interconnection wire 522. In addition, the undulating portion 57 is less likely to appear in the first region 31 of the wiring board 10. As described above, according to the present embodiment, it is possible to control the direction of the undulating portion 57 that preferentially appears in each of the first interconnection wire 521 and the second interconnection wire 522. As a result, it is possible to control the interference between the undulating portions 57 that appear in different directions. Therefore, it is possible to suppress the amplitude of the undulating portions 57 from being locally increased and suppress the cycle of the undulating portions 57 from being locally disordered.

Figure 33:
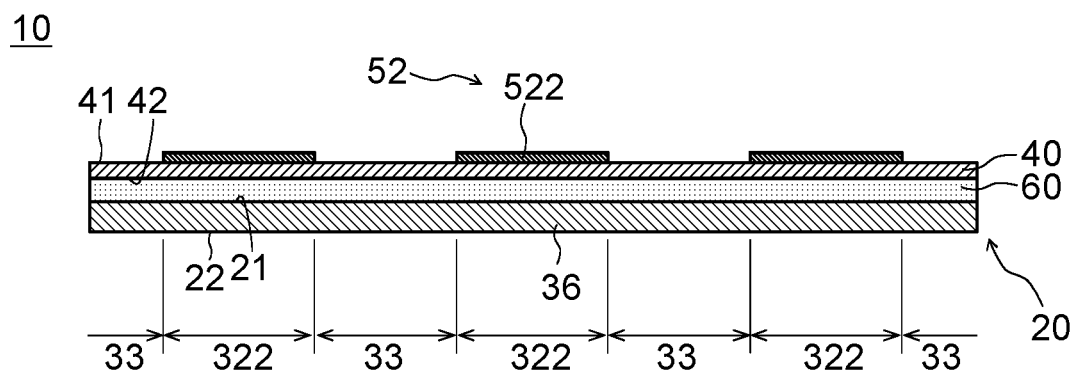
FIG. 33 is a cross-sectional view of the stretchable portion of the wiring board according to the sixteenth modification.
Figure 34:
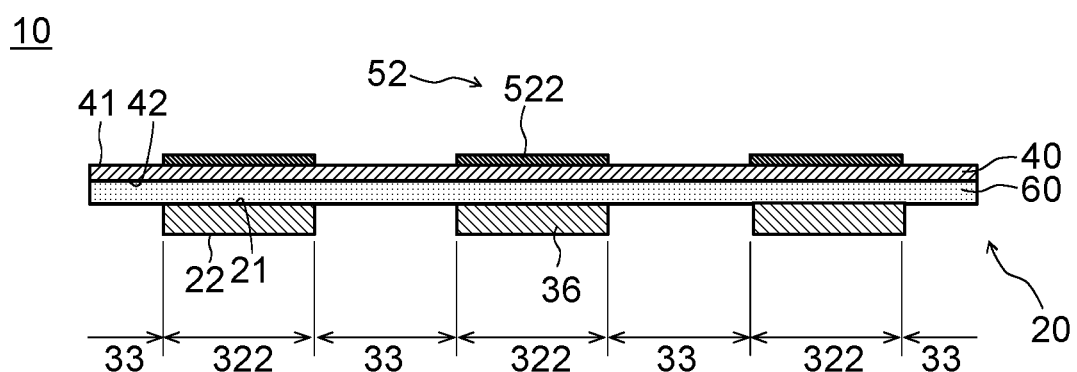
FIG. 34 is a cross-sectional view illustrating another example of the stretchable portion of the wiring board according to the sixteenth modification.

Note that FIG. 33 illustrates an example in which a member the same as the member (the second member 36) of the stretchable portion 20 located in each of the first and second regions 31 and 32 is also present in the third region 33. However, the configuration is not limited thereto. As illustrated in FIG. 34, the third region 33 may include a hole formed in the stretchable portion 20.

Figure 35:
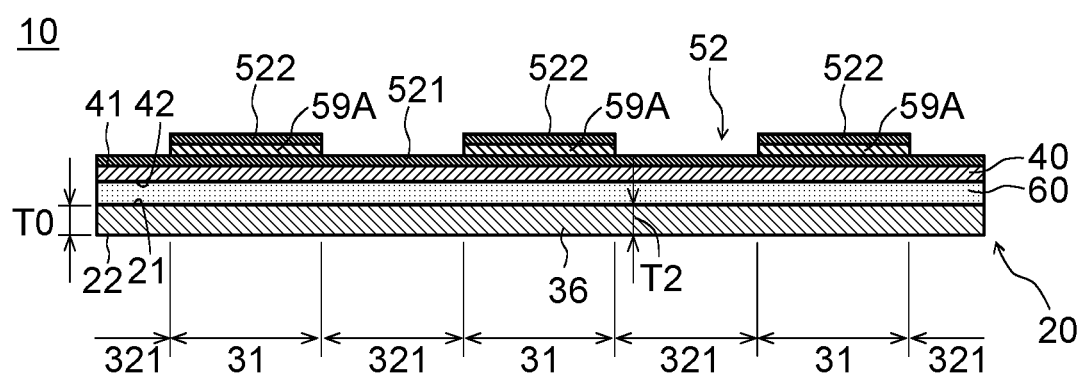
FIG. 35 is a cross-sectional view illustrating another example of the stretchable portion of the wiring board according to the sixteenth modification.

FIG. 35 is a cross-sectional view of another example of the wiring board 10 according to the present modification. Similar to FIG. 32, FIG. 35 is a cross-sectional view of the wiring board 10 taken along line F-F of FIG. 31. As illustrated in FIG. 35, in a portion in which the first interconnection wire 521 extending in the first direction D1 and the second interconnection wire 522 extending in the second direction D2 intersect with each other in plan view, an insulating layer 59A may be interposed between the first interconnection wire 521 and the second interconnection wire 522 in the thickness direction of the wiring board 10. This enables the first interconnection wire 521 and the second interconnection wire 522 to intersect with each other in plan view without electrical connection therebetween.

In addition, in the example illustrated in FIG. 35, the first region 31, which is a portion in which the first interconnection wire 521 and the second interconnection wire 522 intersect with each other in plan view, includes a conductive layer that constitutes the first interconnection wire 521, the insulating layer 59A, and a conductive layer that constitutes the second interconnection wire 522. For this reason, the first region 31 is more difficult to stretch and contract than the second region 32.

(Seventeenth Modification)

The embodiment and each of the modifications above have been described with reference to an example in which the interconnection wire 52 is supported by the support portion 40 located between the interconnection wire 52 and the stretchable portion 20. However, the configuration is not limited thereto. The wiring board 10 does not necessarily have to include the support portion 40. For example, the interconnection wire 52 and the electronic component 51 may be directly provided in the stretchable portion 20.

(Eighteenth Modification)

Figure 38:
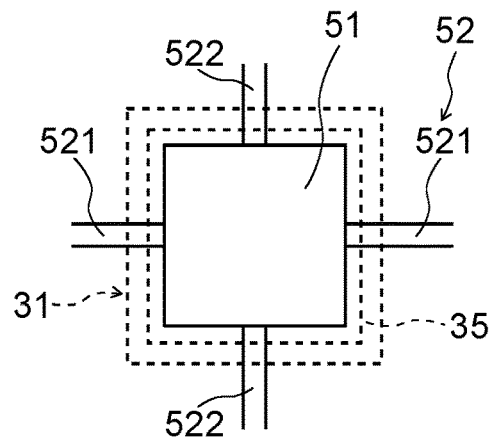
FIG. 38 is a plan view of a first region of a stretchable portion of a wiring board according to an eighteenth modification.

The embodiment above has been described with reference to an example in which the first member 35 that has a higher modulus of elasticity than the second member 36 constituting the second region 32 is disposed over the entire area of the first region 31 in plan view. However, the configuration is not limited thereto. As illustrated in FIG. 38, the first member 35 may have a shape of a picture frame. In this case, when the stretchable portion 20 is stretched, a portion of the stretchable portion 20 that is located inside the frame-shaped first member 35 is rarely subject to the tensile force and is less likely to deform. Therefore, in the example illustrated in FIG. 38, a portion of the stretchable portion 20 in which the frame-shaped first member 35 is located and the portion located inside the first member 35 can function as the first region 31 having a higher elastic modulus than the second region 32.

As illustrated in FIG. 38, the electronic component 51 may be located inside the frame-shaped first member 35 in plan view. In addition, the second member 36 may be present inside the frame-shaped first member 35 of the stretchable portion 20. Furthermore, as illustrated in FIG. 38, the frame-shaped first member 35 may extend orthogonally to the direction in which the interconnection wire 52 extends at a position at which the first members 35 overlaps the interconnection wire 52 in plan view.

(Nineteenth Modification)

While the eighteenth modification illustrated in FIG. 38 has been described with reference to an example in which the frame-shaped first member 35 is applied to a wiring board 10 including the electronic components 51, the configuration is not limited thereto. The frame-shaped first member 35 may be applied to the wiring board 10 without the electronic component 51, as in the above-described fifteenth modification illustrated in FIG. 30. In this case, as illustrated in FIGS. 39 to 42, a portion in which the interconnection wires extending in different directions intersect to form a cross-intersection or a merge intersection may be located inside the frame-shaped first member 35 in plan view.

Figure 39:
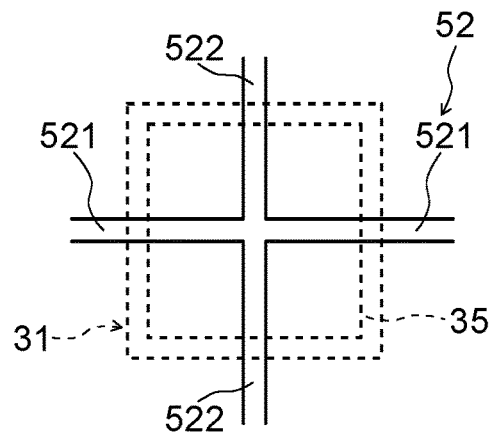
FIG. 39 is a plan view illustrating an example of a first region of a stretchable portion of a wiring board according to a nineteenth modification.
Figure 40:
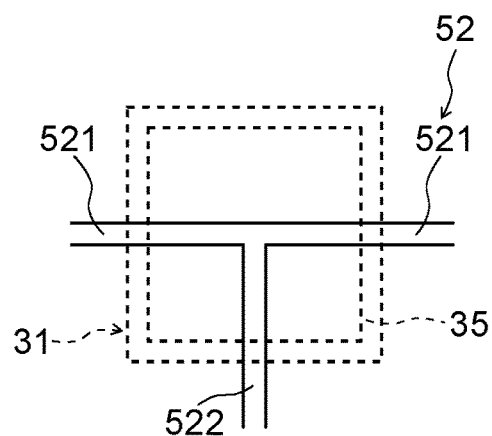
FIG. 40 is a plan view illustrating another example of the first region of the stretchable portion of the wiring board according to the nineteenth modification.
Figure 41:
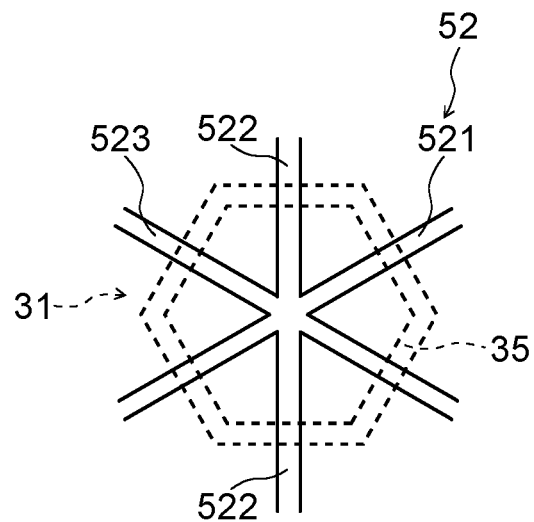
FIG. 41 is a plan view illustrating another example of the first region of the stretchable portion of the wiring board according to the nineteenth modification.
Figure 42:
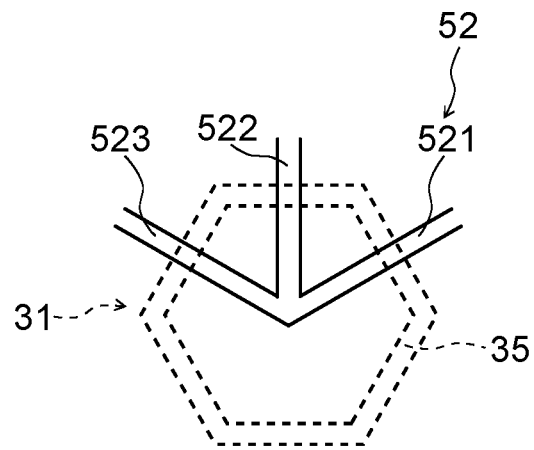
FIG. 42 is a plan view illustrating another example of the first region of the stretchable portion of the wiring board according to the nineteenth modification.

In FIGS. 39 and 40, a portion in which the interconnection wires extending in two different directions intersect to form a cross-intersection or a merge intersection is located inside the frame-shaped first member 35 in plan view. In FIGS. 41 and 42, a portion in which the interconnection wires extending in three different directions intersect to form a cross-intersection or a merge intersection is located inside the frame-shaped first member 35 in plan view. As illustrated in FIGS. 39 to 42, the frame-shaped first member 35 may extend orthogonally to the direction in which the interconnection wire 52 extends at a position at which the first member 35 overlaps the interconnection wire 52 in plan view.

While several modifications of the embodiment described above have been described, it should be appreciated that the plurality of modifications can be combined in an appropriate way and be applied.

EXAMPLES

The present invention is described in more detail below with reference to examples and comparative examples. Note that the invention should not be construed as being limited to the examples described below unless the invention departs from the scope thereof.

Example 1

<<Preparation of Stretchable Portion>>

As a mold for molding the stretchable portion 20, a mold 70 having a base material 71 and grooves 72 formed in a grid pattern on the base material 71 was prepared, as illustrated in FIGS. 7A and 7B. The width of the groove 72 was 10 mm. Each of the spacing between two neighboring second grooves 722 in the first direction D1 and the spacing between two neighboring first grooves 721 in the second direction D2 was 10 mm.

Subsequently, an adhesive sheet was placed on the bottom surfaces of the first groove 721 and the second groove 722 as the adhesive layer 60. "8146" available from 3M Company was used for the adhesive layer 60. Thereafter, the first member 35 was placed on the adhesive layer 60 at the intersection of the first groove 721 extending in the first direction D1 and the second groove 722 extending in the second direction D2. As the first member 35, a polyimide film cut into a square having a side of 10 mm was used. As the polyimide film, Upilex (available from UBE Industries, Ltd.) having a thickness of 125 µm was used. In addition, the modulus of elasticity of the polyimide film was measured by a tensile test in accordance with ASTM D882. As a result of the test, the modulus of elasticity was 7 Gpa.

Subsequently, the groove 72 of the mold 70 was filled with polydimethylsiloxane (hereinafter referred to as PDMS) of two-component addition-condensation so that the thickness of the PDMS was about 1 mm. At this time, the first member 35 lay buried in the PDMS. Thereafter, the PDMS was cured to form the second member 36. In this manner, a grid-shaped stretchable portion 20 was obtained. The stretchable portion 20 included a second member 36 that spreads in a grid shape and a first member 35 made from polyimide film buried in the PDMS at the intersection region of the grid of the second member 36. The modulus of elasticity of the PDMS was measured by a tensile test in accordance with JIS K6251. As a result of the test, the modulus of elasticity was 0.05 MPa.

<<Preparation of Support Portion>>

A polyethylene naphthalate (PEN) film having a thickness of 2.5 µm was prepared to serve as the support portion 40. Thereafter, a copper layer having a thickness of 1 µm was formed on the first surface 41 of the support portion 40 by the vapor deposition technique. Subsequently, the copper layer was processed using the photolithography and etching techniques. As a result, a plurality of the first interconnection wires 521 each extending in the first direction D1 and having a width of 200 µm were obtained. The modulus of elasticity of the support portion 40 was measured by a tensile test in accordance with ASTM D882. As a result, the modulus of elasticity of the support portion 40 was 2.2 GPa.

Subsequently, ink containing dissolved urethane resin was applied to the first interconnection wire 521 by the screen printing technique so as to cover the first interconnection wire 521. More specifically, printing was performed such that a plurality of ink layers each with a square shape having a side of 10 mm were formed at intervals in the direction in which the first interconnection wire 521 extended. Subsequently, a drying process was carried out using an oven of 120° C. for 30 minutes. In this manner, a plurality of insulating layers each having a thickness of 10 µm were formed on the first interconnection wire 521 so as to be lined up in the direction in which the first interconnection wire 521 extended. Each of the insulating layers was disposed so as to overlap one of the first regions 31 of the stretchable portion 20, which was joined to the support portion 40 in a subsequent process.

Subsequently, conductive paste containing silver particles was patterned onto the support portion 40 by screen printing. In this manner, a plurality of second interconnection wires 522 were obtained. Each of the second interconnection wire 522 extended in the second direction D1 orthogonal to the first interconnection wire 521 and had a width of 200 µm. At this time, printing was performed such that the insulating layer was positioned at an intersection of the first interconnection wire 521 and the second interconnection wire 522.

Subsequently, an LED chip was disposed in the vicinity of the location at which the first interconnection wire 521 and the second interconnection wire 522 intersected. In addition, the anode electrode of the LED chip was connected to the first interconnection wire 521, and the cathode electrode was connected to the second interconnection wire 522 by using conductive adhesive. CL-3160 available from KAKEN TECH Co., Ltd. was used as the conductive adhesive. Thereafter, a silicone potting agent was applied around the LED chip, and the silicone potting agent was cured to obtain the sealing portion 58 that covered the LED chip. TB1220G available from ThreeBond Co., Ltd. was used as the silicone potting agent.

<<Joining Process>>

Subsequently, the stretchable portion 20 was stretched to 1.5 times the original length in each of the two axes extending in the first direction D1 and the second direction D2. The stretchable portion 20 that was stretched to 1.5 times the original length was joined to the support portion 40 having the interconnection wire 52 and the LED chip mounted thereon. More specifically, the adhesive layer 60 provided on the stretchable portion 20 was bonded to the surface of the support portion 40 on which the interconnection wire 52 and LED chip were not provided. At this time, the stretchable portion 20 and the support portion 40 were aligned so that the following conditions were satisfied:

- The first region 31 including the first member 35 of the stretchable portion 20 overlaps the LED chip and the intersection of the first interconnection wire 521 and the second interconnection wire 522 on the support portion 40.
- The first interconnection wire 521 and the second interconnection wire 522 on the support 40 overlap the second region 32 located between the two neighboring first regions 31 in the first direction D1 or the second direction D2.
- The direction in which the second region 32 of the stretchable portion 20 extends is parallel to the direction in which the interconnection wire 52 on the support portion 40 extends.

Subsequently, a portion of the support 40 that was not joined to the second member 36 of the stretchable portion 20, that is, a portion that overlapped the hole 37 of the stretchable portion 20, was cut and removed. Thereafter, the tensile stress was removed from the stretchable portion 20 to contract the stretchable portion 20 and the support portion 40 joined to the stretchable portion 20. As a result, an undulating portion 57 was formed on each of the first interconnection wire 521 and the second interconnection wire 522 on the support portion 40. The undulating portion 57 included crest portions and valley portions that were orthogonal to the direction in which each of the first interconnection wire 521 and the second interconnection wire 522 extended.

Example 2

<<Preparation of Stretchable Portion>>

An adhesive sheet serving as an adhesive layer 60 was placed on a suitable support stand first. Subsequently, a plurality of first members 35 were placed on the adhesive layer 60 in each of the first direction D1 and the second direction D2. A polyimide film cut into a square shape having a side of 10 mm was used as the first member 35. As the polyimide film, Upilex (available from UBE Industries, Ltd.) having a thickness of 125 µm was used. The distance between two neighboring first members 35 in the first direction D1 or the second direction D2 was 10 mm.

Subsequently, PDMS of two-component addition-condensation was applied so as to cover the adhesive layer 60 and the first member 35. Thereafter, a mold form having a concave-convex shape was pressed against the PDMS to cure the PDMS. The mold form was selected such that a convex portion of the mold form pressed the PDMS located in the third region 33 illustrated in FIG. 25 while a concave portion of the mold form pressed the PDMS located in the first region 31 and the second region 32 illustrated in FIG. 25. As a result, the thickness of the first region 31 including the first member 35 and PDMS pressed by the concave portion of the mold form was about 1 mm, the thickness of the second region 32 containing PDMS pressed by the concave portion of the mold form was about 1 mm, and the thickness of the third region 33 containing PDMS pressed by the convex portion of the mold form was about 100 µm. In this way, as illustrated in FIG. 25, the stretchable portion 20 having the third region 33 containing PDMS, which is thinner than the first region 31 and the second region 32, was prepared.

<<Preparation of Support Portion>>

In the same way as in Example 1, the support portion 40 was prepared, the interconnection wire 52 was formed on the support portion 40, and the LED chip was disposed on the support portion 40.

<<Joining Process>>

In the same way as in Example 1, the stretchable portion 20 was stretched to 1.5 times the original length along each of the two axes extending in the first direction D1 and the second direction D2. The stretchable portion 20 that is stretched to 1.5 times the original length was joined to the support portion 40 having the interconnection wire 52 and LED chip mounted thereon. Thereafter, the tensile stress was removed from the stretchable portion 20 to contract the stretchable portion 20 and the support portion 40 joined to the stretchable portion 20. As a result, as in Example 1, an undulating portion 57 was formed on each of the first interconnection wire 521 and the second interconnection wire 522 on the support portion 40. The undulating portion 57 included crest portions and valley portions orthogonal to the direction in which each of the first interconnection wire 521 and the second interconnection wire 522 extended.

Example 3

<<Preparation of Stretchable Portion>>

An adhesive sheet was placed on a suitable support stand as an adhesive layer 60. Thereafter, a plurality of first members 35 were placed on the adhesive layer 60 so as to be aligned in the first direction D1 and the second direction D2. A polyimide film cut into a square shape having a side of 10 mm was used as the first member 35. As the polyimide film, Upilex (available from UBE Industries, Ltd.) having a thickness of 125 µm was used. The distance between two neighboring first members 35 in the first direction D1 or the second direction D2 was 10 mm.

Subsequently, PDMS of two-component addition-condensation was applied so as to cover the adhesive layer 60 and the first member 35. Thereafter, the PDMS was cured to form the second member 36. The thickness of a portion of the second member 36 that did not overlap the first member 35 was 1.5 mm. In this way, as illustrated in FIG. 4D described above, a stretchable portion 20 was prepared that includes the second member 36 located in the first region 31, the second region 32, and the third region 33 and the first member 35 located in the first region 31.

<<Preparation of Support Portion>>

In the same way as in Example 1, the support portion 40 was prepared, the interconnection wire 52 was formed on the support portion 40, and the LED chip was disposed on the support portion 40. Subsequently, the support portion 40 was cut to remove a portion of the support portion 40 that overlapped the third region 33 of the stretchable portion 20. As a result, the support portion 40 has a grid-like shape that overlaps the first regions 31 and second regions 32 of the stretchable portion 20.

<<Joining Process>>

Figure 44:
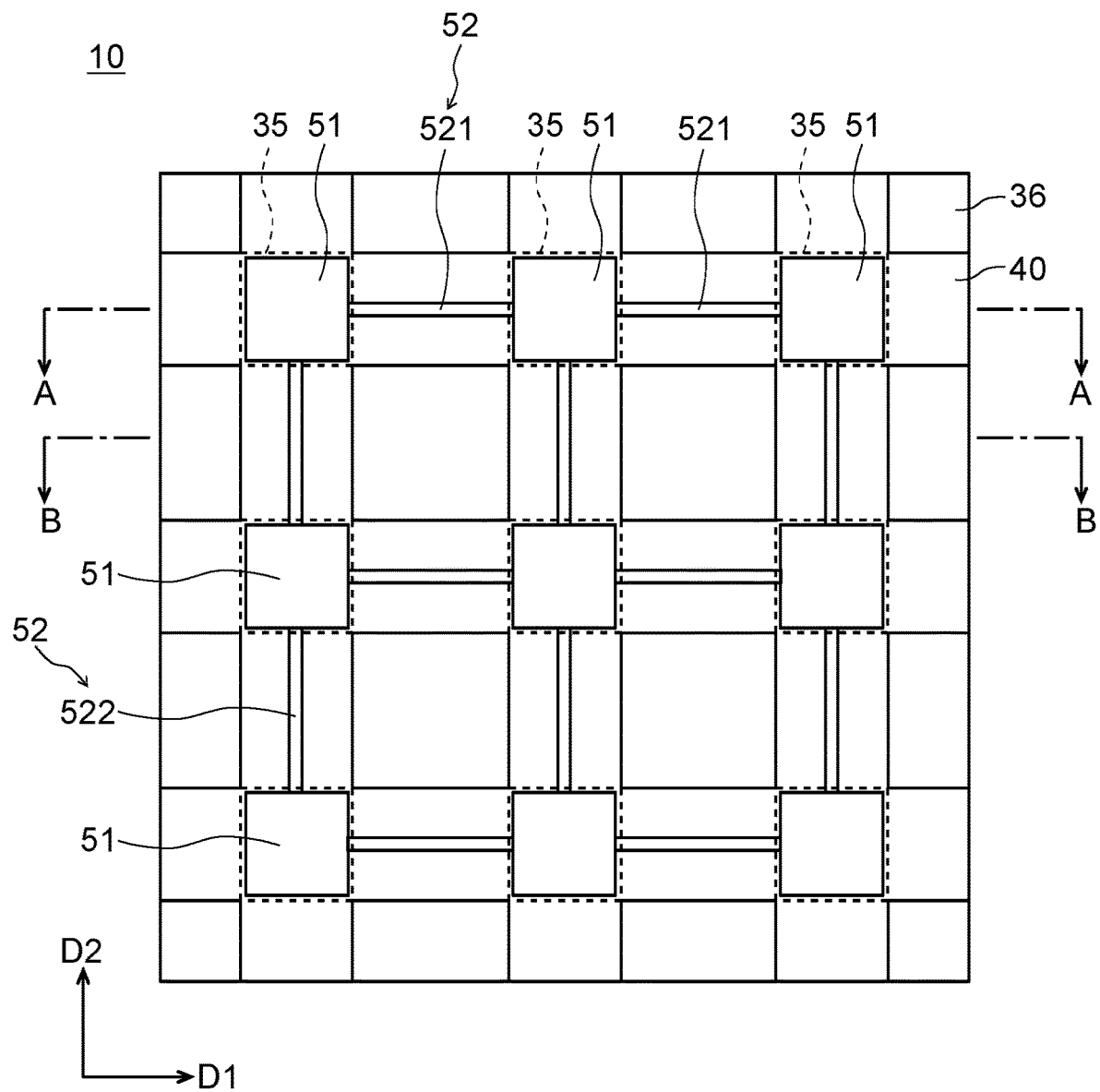
FIG. 44 is a plan view of a wiring board according to Example 3.
Figure 45:
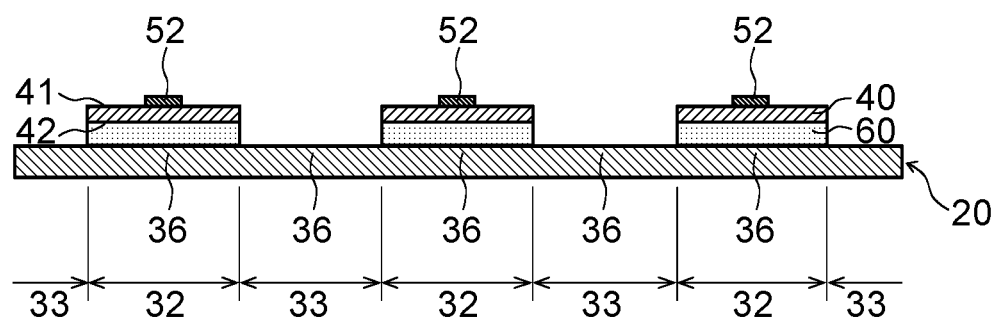
FIG. 45 is a cross-sectional view of the wiring board taken along line B-B of FIG. 44.

In the same way as in Example 1, the stretchable portion 20 was stretched to 1.5 times the original length along each of the two axes extending in the first direction D1 and the second direction D2. The stretchable portion 20 that was stretched to 1.5 times the original length was joined to the support portion 40 having the interconnection wire 52 and the LED chip mounted thereon. Thereafter, the tensile stress was removed from the stretchable portion 20 to contract the stretchable portion 20 and the support portion 40 joined to the stretchable portion 20. As a result, as in Example 1, an undulating portion 57 was formed on each of the first interconnection wire 521 and the second interconnection wire 522 on the support portion 40. The undulating portion 57 included crest portions and valley portions orthogonal to the direction in which each of the first interconnection wire 521 and the second interconnection wire 522 extended. FIG. 44 is a plan view of a wiring board 10 obtained in this manner. FIG. 45 is a cutaway view of the wiring board 10 taken along line B-B of FIG. 44. Note that the cutaway view of the wiring board 10 taken along line A-A of FIG. 44 is the same as the view illustrated in FIG. 1.

The average value and the standard deviation of the cycles of the undulating portion 57 of the first interconnection wire 521 and the second interconnection wire 522 were calculated. More specifically, at each of 20 locations of the undulating portion 57 of the first interconnection wire 521, the distance between two neighboring crest portions in the first direction D1 was measured. In addition, at each of 20 locations of the undulating portion 57 of the second interconnection wire 522, the distance between two neighboring crest portions in the second direction D2 was measured. Thereafter, the average value and the standard deviation of the distance between the crest portions at 40 locations were calculated. As a result, the average value of the distances was 660 µm, and the standard deviation was 230 µm. As a measuring instrument, CNC image measuring system NEXIV VMZ-H3030 available from Nikon Corporation is usable. The specifications of the measuring instrument are as follows:

Magnification: 81×
Field of view: 3 mm×3 mm

Comparative Example

In the same manner as in Example 2, a stretchable portion 20 was produced, except that PDMS was applied onto the adhesive layer 60 without placing the plurality of first members 35 on an adhesive sheet disposed as the adhesive layer 60. In addition, in the same manner as in Example 1, the support portion 40 was prepared, the interconnection wire 52 was formed on the support portion 40, and an LED chip was disposed on the support portion 40.

Subsequently, in the same way as in Example 1, the stretchable portion 20 was stretched to 1.5 times the original length along each of the two axes extending in the first direction D1 and second direction D2. The stretchable portion 20 that is stretched to 1.5 times the original length was joined to the support portion 40 having the interconnection wire 52 and the LED chip mounted thereon. Thereafter, the tensile stress was removed from the stretchable portion 20 to contract the stretchable portion 20 and the support portion 40 joined to the stretchable portion 20. As a result, an undulating portion 57 was formed on each of the first interconnection wire 521 and the second interconnection wire 522 on the support portion 40. The crest portion and the valley portions of the undulating portion 57 extended in random directions. That is, the direction of the undulating portion 57 was unable to be controlled.

REFERENCE SIGNS LIST 10 wiring board
20 stretchable portion
21 first surface
22 second surface
31 first region
31c corner
32 second region
321 first portion
322 second portion
323 third portion
324 fourth portion
32c central portion
32e end portion
33 third region
35 first member
36 second member
37 hole
38 third member
39 stretch control portion
391 first control portion
392 second control portion
40 support portion
41 first surface
42 second surface
51 electronic component
52 interconnection wire
521 first interconnection wire
522 second interconnection wire
P1, P2 crest portion
B1, B2 valley portion
57 undulating portion
58 sealing portion
60 adhesive layer
70 mold
71 base material
72 groove
721 first groove
722 second groove

The invention claimed is:

1. A wiring board on which electronic components are mountable, the wiring board comprising:
a stretchable portion having stretchability and having a first surface and a second surface opposite to the first surface, the stretchable portion including
a plurality of first regions lined up in each of a first direction and a second direction that intersects the first direction,
a plurality of second regions including first portions and second portions, the first portion extending from one of two first regions neighboring each other in the first direction to the other of the two first regions among the plurality of first regions, the second portion extending from one of two first regions neighboring each other in the second direction to the other of the two first regions among the plurality of first regions, and a third region surrounded by the second regions, the first regions overlapping the electronic components mounted on the wiring board when viewed in a direction normal to the first surface of the stretchable portion, the second regions having a lower modulus of elasticity than the first region;

an interconnection wire located adjacent to the first surface of the stretchable portion, the interconnection wire being electrically connected to the electronic components mounted on the wiring board, the interconnection wire overlapping the second region when viewed in the direction normal to the first surface of the stretchable portion;

a support portion located between the interconnection wire and the first surface of the stretchable portion, wherein the support portion has a crest portion and a valley portion respectively corresponding to a crest portion and a valley portion of an undulating portion of the interconnection wire, and the support portion supports the interconnection wire; and an adhesive layer that joins the stretchable portion to the support portion.

2. The wiring board according to claim 1, wherein the stretchable portion includes a first member located in the first region and a second member that overlaps the first member in the first region and extends over the first regions and the second regions, and wherein the second member has a lower modulus of elasticity than the first member.

3. The wiring board according to claim 2, wherein the first member of the stretchable portion is located adjacent to the first surface of the stretchable portion.

4. The wiring board according to claim 3, wherein the first member of the stretchable portion is in contact with the adhesive layer in an in-plane direction of the wiring board.

5. The wiring board according to claim 2, wherein the first member of the stretchable portion is disposed so as to appear on neither the first surface nor the second surface of the stretchable portion.

6. The wiring board according to claim 2, wherein the first member of the stretchable portion is located adjacent to the second surface of the stretchable portion.

7. The wiring board according to claim 6, wherein the first member of the stretchable portion is disposed on a surface of the second member.

8. The wiring board according to claim 2, wherein the second member of the stretchable portion contains thermoplastic elastomer, silicone rubber, urethane gel, or silicone gel.

9. The wiring board according to claim 2, wherein the first member of the stretchable portion contains polyimide, polyethylene naphthalate, polycarbonate, acrylic resin, or polyethylene terephthalate.

10. The wiring board according to claim 1, further comprising:

a plurality of stretch control portions lined up along at least one of the first portion and the second portion of the second region when viewed in the direction normal to the first surface of the stretchable portion, wherein the stretch control portions have a higher modulus of elasticity than the second region.

11. The wiring board according to claim 1, wherein the third region of the stretchable portion has a hole that penetrates the stretchable portion.

12. The wiring board according to claim 1, further comprising:

an insulating layer that overlaps the second region when viewed in the direction normal to the first surface of the stretchable portion, wherein the insulating layer is located on the interconnection wire.

13. The wiring board according to claim 1, wherein the interconnection wire includes an undulating portion in which a crest portion and a valley portion in a direction normal to the first surface of the stretchable portion repeatedly appear in an in-plane direction of the first surface of the stretchable portion.

14. The wiring board according to claim 13, wherein the undulating portion of the interconnection wire has an amplitude greater than or equal to 1 μm.

15. The wiring board according to claim 13, further comprising:

a support portion located between the interconnection wire and the first surface of the stretchable portion, wherein the support portion has a crest portion and a valley portion respectively corresponding to the crest portion and the valley portion of the undulating portion of the interconnection wire, and the support portion supports the interconnection wire.

16. The wiring board according to claim 15, wherein the support portion has a thickness of less than or equal to 10 μm.

17. The wiring board according to claim 15, wherein the stretchable portion has a thickness greater than a thickness of the support portion.

18. The wiring board according to claim 1, further comprising:

an electronic component electrically connected to the interconnection wire.

19. A wiring board comprising:

a stretchable portion having stretchability and having a first surface and a second surface opposite to the first surface, the stretchable portion including a plurality of first regions lined up in each of a first direction and a second direction that intersects the first direction and each including a first member, a plurality of second regions including first portions and second portions and including a second member having a lower modulus of elasticity than the first member, the first portion extending from one of two first regions neighboring each other in the first direction to the other of the two first regions among the plurality of first regions, the second portion extending from one of two first regions neighboring each other in the second direction to the other of the two first regions among the plurality of first regions, and a third region surrounded by the second regions;

an interconnection wire located adjacent to the first surface of the stretchable portion, the interconnection wire overlapping at least the second region when viewed in a direction normal to the first surface of the stretchable portion;

a support portion located between the interconnection wire and the first surface of the stretchable portion, wherein the support portion has a crest portion and a valley portion respectively corresponding to a crest portion and a valley portion of an undulating portion of the interconnection wire, and the support portion supports the interconnection wire; and an adhesive layer that joins the stretchable portion to the support portion.

20. A wiring board on which electronic components are mountable, the wiring board comprising:

a stretchable portion having stretchability and having a first surface and a second surface opposite to the first surface, the stretchable portion including a plurality of first regions lined up in each of a first direction and a second direction that intersects the first direction, a plurality of second regions including first portions and second portions, the first portion extending from one of two first regions neighboring each other in the first direction to the other of the two first regions among the plurality of first regions, the second portion extending from one of two first regions neighboring each other in the second direction to the other of the two first regions among the plurality of first regions, and a third region surrounded by the second regions, the first regions overlapping the electronic components mounted on the wiring board when viewed in a direction normal to the first surface of the stretchable portion, the second regions having a lower modulus of elasticity than the first region; and an interconnection wire located adjacent to the first surface of the stretchable portion, the interconnection wire being electrically connected to the electronic components mounted on the wiring board, the interconnection wire overlapping the second region when viewed in the direction normal to the first surface of the stretchable portion, wherein the stretchable portion includes a first member located in the first region and a second member that overlaps the first member in the first region and extends over the first regions and the second regions, the second member has a lower modulus of elasticity than the first member, the stretchable portion further includes an adhesive layer located between the interconnection wire and the second member, and the first member of the stretchable portion is located closer to the interconnection wire than a surface of the second member adjacent to the interconnection wire and is in contact with the adhesive layer in an in-plane direction of the wiring board.

21. The wiring board according to claim 20, further comprising:

a support portion located between the interconnection wire and the adhesive layer, wherein the support portion has a crest portion and a valley portion respectively corresponding to a crest portion and a valley portion of an undulating portion of the interconnection wire, and the support portion supports the interconnection wire, and wherein the first member of the stretchable portion is in contact with the support portion.

22. A method for manufacturing a wiring board on which electronic components are mountable, the method comprising:

a step of preparing a stretchable portion having stretchability and having a first surface and a second surface opposite to the first surface, the stretchable portion including a plurality of first regions lined up in each of a first direction and a second direction that intersects the first direction, a plurality of second regions including first portions and second portions, and a third region surrounded by the second region, the first regions overlapping the electronic components mounted on the wiring board when viewed in a direction normal to the first surface of the stretchable portion, the second region having a lower modulus of elasticity than the first region, the first portion extending from one of two first regions neighboring each other in the first direction to the other of the two first regions among the plurality of first regions, the second portion extending from one of two first regions neighboring each other in the second direction to the other of the two first regions among the plurality of first regions;

a stretch step of stretching the stretchable portion by applying tensile stress to the stretchable portion in at least two of in-plane directions of the first surface of the stretchable portion;

a wiring step of disposing, on the first surface of the stretchable portion that is stretched, an interconnection wire to be electrically connected to the electronic components mounted on the wiring board such that the interconnection wire overlaps the second region when viewed in the direction normal to the first surface of the stretchable portion, wherein the wiring step includes joining a support portion, on which the interconnection wire is disposed, to the first surface of the stretchable portion that is stretched; and a contraction step of removing the tensile stress from the stretchable portion.

* * * * *